(12) United States Patent
Aoki et al.

(10) Patent No.: US 12,126,140 B2
(45) Date of Patent: Oct. 22, 2024

(54) LIGHT-EMITTING ELEMENT

(71) Applicant: HAMAMATSU PHOTONICS K.K., Hamamatsu (JP)

(72) Inventors: Yuta Aoki, Nara (JP); Kazuyoshi Hirose, Hamamatsu (JP); Satoru Okawara, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 840 days.

(21) Appl. No.: 15/734,325

(22) PCT Filed: Jun. 5, 2019

(86) PCT No.: PCT/JP2019/022363
§ 371 (c)(1),
(2) Date: Dec. 2, 2020

(87) PCT Pub. No.: WO2019/235535
PCT Pub. Date: Dec. 12, 2019

(65) Prior Publication Data
US 2021/0226420 A1    Jul. 22, 2021

(30) Foreign Application Priority Data
Jun. 8, 2018 (JP) .................................. 2018-110112

(51) Int. Cl.
*H01S 5/32* (2006.01)
*H01S 5/11* (2021.01)
(Continued)

(52) U.S. Cl.
CPC .............. *H01S 5/3213* (2013.01); *H01S 5/11* (2021.01); *H01S 5/18305* (2013.01); *H01S 5/185* (2021.01); *H01S 5/34333* (2013.01)

(58) Field of Classification Search
CPC ... H01S 5/11; H01S 5/18; H01S 5/187; H01S 5/183; H01S 5/18397; H01S 5/18302;
(Continued)

(56) References Cited

U.S. PATENT DOCUMENTS 5,561,683 A   10/1996   Kwon
5,583,351 A   12/1996   Brown et al.
(Continued)

FOREIGN PATENT DOCUMENTS

CN   1908764 A    2/2007
CN   101040409 A  9/2007
(Continued)

OTHER PUBLICATIONS

J. F. Muth, J. D. Brown, M. A. L. Johnson, Zhonghai Yu, R. M. Kolbas, J. W. Cook & J. F. Schetzina ,Absorption Coefficient and Refractive Index of GaN, AlN and AlGaN Alloys, MRS Internet Journal of Nitride Semiconductor Research vol. 4, pp. 502-507 (1999) (Year: 1999).*

(Continued)

*Primary Examiner* — Joshua King
(74) *Attorney, Agent, or Firm* — Faegre Drinker Biddle & Reath LLP

(57) ABSTRACT

The present embodiment relates to a surface emitting type light-emitting element mainly including a nitride semiconductor and a layer for forming a resonance mode. The light-emitting element increases the optical confinement coefficient of a layer forming a resonance mode, includes an active layer, a phase modulation layer, and one or more high refractive index layers, and further includes, first and second cladding layers sandwiching the active layer, the phase modulation layer, and the high refractive index layer. The phase modulation layer includes a base layer and modified refractive index regions. The gravity centers of the modified
(Continued)

refractive index regions are arranged on a straight line passing through each lattice point of a virtual square lattice and tilted with respect to the square lattice. The distance between the gravity center of each modified refractive index region and the lattice point is individually set according to the optical image.

6 Claims, 39 Drawing Sheets

(51) Int. Cl.
  *H01S 5/183*  (2006.01)
  *H01S 5/185*  (2021.01)
  *H01S 5/343*  (2006.01)

(58) Field of Classification Search
  CPC ............ H01S 5/18305; H01S 5/18386; H01S 5/18388; H01S 5/18391; H01S 5/18394
  See application file for complete search history.

(56) References Cited

U.S. PATENT DOCUMENTS

| | | |
|---|---|---|
| 6,005,262 A | 12/1999 | Cunningham et al. |
| 6,810,056 B1 | 10/2004 | Lipson et al. |
| 6,826,223 B1 | 11/2004 | Meyer et al. |
| 8,300,672 B2 * | 10/2012 | Noda ........................ H01S 5/11 372/102 |
| 9,531,160 B2 | 12/2016 | Noda et al. |
| 9,991,669 B2 * | 6/2018 | Hirose ..................... H01S 5/185 |
| 10,734,786 B2 | 8/2020 | Hirose et al. |
| 11,031,747 B2 | 6/2021 | Kurosaka et al. |
| 11,031,751 B2 | 6/2021 | Kurosaka et al. |
| 11,309,687 B2 * | 4/2022 | Hirose ..................... H01S 5/11 |
| 2003/0010763 A1 | 1/2003 | Fukuchi et al. |
| 2003/0235229 A1 | 12/2003 | Deng et al. |
| 2004/0247009 A1 | 12/2004 | Noda et al. |
| 2004/0252741 A1 | 12/2004 | Meyer et al. |
| 2007/0008998 A1 | 1/2007 | Ohta et al. |
| 2007/0019099 A1 | 1/2007 | Lieberman et al. |
| 2007/0030873 A1 | 2/2007 | Deng |
| 2007/0075318 A1 | 4/2007 | Noda et al. |
| 2007/0177647 A1 | 8/2007 | Noda et al. |
| 2008/0175286 A1 | 7/2008 | Kamijima |
| 2008/0240179 A1 * | 10/2008 | Otsuka .................... H01S 5/185 372/26 |
| 2008/0259981 A1 | 10/2008 | Wang et al. |
| 2009/0010298 A1 | 1/2009 | Kiyota |
| 2009/0074024 A1 | 3/2009 | Noda et al. |
| 2009/0135869 A1 | 5/2009 | Noda et al. |
| 2009/0175304 A1 | 7/2009 | Noda et al. |
| 2009/0225804 A1 * | 9/2009 | Sasahata ................ B82Y 20/00 372/45.01 |
| 2009/0232179 A1 | 9/2009 | Ikuta |
| 2009/0289266 A1 | 11/2009 | Lee et al. |
| 2010/0220763 A1 | 9/2010 | Ikuta |
| 2011/0188526 A1 | 8/2011 | Noda et al. |
| 2012/0002692 A1 | 1/2012 | Noda et al. |
| 2012/0050694 A1 | 3/2012 | Huang et al. |
| 2013/0039375 A1 | 2/2013 | Noda et al. |
| 2013/0121358 A1 | 5/2013 | Hirose et al. |
| 2013/0163626 A1 | 6/2013 | Seurin et al. |
| 2013/0243026 A1 * | 9/2013 | Noda .................... H01S 5/1234 372/50.12 |
| 2013/0343415 A1 * | 12/2013 | Hori ........................ H01S 5/185 372/38.05 |
| 2014/0211822 A1 | 7/2014 | Fattal et al. |
| 2014/0299742 A1 | 10/2014 | Fujii |
| 2014/0348195 A1 | 11/2014 | Sakaguchi et al. |
| 2014/0355635 A1 * | 12/2014 | Iwahashi .................. H01S 5/11 372/45.01 |
| 2015/0185523 A1 | 7/2015 | Matsumoto et al. |
| 2016/0020580 A1 * | 1/2016 | Takiguchi ............... H01S 5/187 372/44.011 |
| 2016/0020581 A1 | 1/2016 | Hirose et al. |
| 2016/0036201 A1 | 2/2016 | Takigchi et al. |
| 2016/0072258 A1 | 3/2016 | Seurin et al. |
| 2016/0075258 A1 | 3/2016 | Kim |
| 2016/0248224 A1 * | 8/2016 | Noda ....................... H01S 5/185 |
| 2016/0257036 A1 | 9/2016 | Fang et al. |
| 2016/0261093 A1 * | 9/2016 | Noda ..................... H01S 3/0085 |
| 2016/0327906 A1 | 11/2016 | Futterer |
| 2016/0380405 A1 | 12/2016 | Takiguchi et al. |
| 2018/0006426 A1 | 1/2018 | Takiguchi et al. |
| 2018/0109075 A1 * | 4/2018 | Kurosaka ................. H01S 5/42 |
| 2019/0165546 A1 | 5/2019 | Hogg et al. |
| 2019/0181613 A1 | 6/2019 | Kurosaka et al. |
| 2019/0288483 A1 | 9/2019 | Sugiyama et al. |
| 2019/0312410 A1 | 10/2019 | Sugiyama et al. |
| 2020/0373739 A1 | 11/2020 | Hirose et al. |
| 2021/0249841 A1 | 8/2021 | Aoki et al. |

FOREIGN PATENT DOCUMENTS

| | | |
|---|---|---|
| CN | 101258652 | 9/2008 |
| CN | 101685941 A | 3/2010 |
| CN | 102447028 A | 5/2012 |
| CN | 102638003 A | 8/2012 |
| CN | 103038959 A | 4/2013 |
| CN | 103988379 A | 8/2014 |
| CN | 104471465 A | 3/2015 |
| CN | 104852278 A | 8/2015 |
| CN | 105191029 A | 12/2015 |
| CN | 105960744 A | 9/2016 |
| JP | S49-024190 A | 3/1974 |
| JP | S59-177282 A | 10/1984 |
| JP | H7-297110 A | 11/1995 |
| JP | H9-139540 A | 5/1997 |
| JP | H9-282437 A | 10/1997 |
| JP | H9-311614 A | 12/1997 |
| JP | 2006-026726 A | 2/2006 |
| JP | 2007-019277 A | 1/2007 |
| JP | 2008-256823 A | 10/2008 |
| JP | 2009-111360 A | 5/2009 |
| JP | 2009-212359 A | 9/2009 |
| JP | 2009-540593 A | 11/2009 |
| JP | 2010-283335 A | 12/2010 |
| JP | 2012-195341 A | 10/2012 |
| JP | 2013-161965 A | 8/2013 |
| JP | 2014-026083 A | 2/2014 |
| JP | 2014-027264 A | 2/2014 |
| JP | 2014-197665 A | 10/2014 |
| JP | 2014-202867 A | 10/2014 |
| JP | 2014-236127 A | 12/2014 |
| JP | 2016-122711 A | 7/2016 |
| JP | 2016-129208 A | 7/2016 |
| JP | 2016-167639 A | 9/2016 |
| JP | 2018-026463 A | 2/2018 |
| WO | WO-01/053876 A1 | 7/2001 |
| WO | WO-2008/041138 A2 | 4/2008 |
| WO | WO-2012/035620 A1 | 3/2012 |
| WO | WO 2012/036300 A1 | 3/2012 |
| WO | WO-2014/017289 A1 | 1/2014 |
| WO | WO-2014/136955 A1 | 9/2014 |
| WO | WO-2014/136962 A1 | 9/2014 |
| WO | WO-2014136607 A1 * | 9/2014 | ........... H01S 3/0085 |
| WO | WO-2014/175447 A1 | 10/2014 |
| WO | WO-2015/008627 A1 | 1/2015 |
| WO | WO 2015/118741 A1 | 8/2015 |
| WO | WO 2016/031965 A1 | 3/2016 |
| WO | WO-2016/111332 A1 | 7/2016 |
| WO | WO-2016148075 A1 * | 9/2016 | ......... H01S 5/04256 |
| WO | WO-2017/191320 A1 | 11/2017 |
| WO | WO-2018159606 A1 * | 9/2018 | ........... H01S 5/0267 |

OTHER PUBLICATIONS

Kurosaka, Yoshitaka et al., "Effects of non-lasing band in two-dimensional photonic-crystal lasers clarified using omnidirectional band structure," Opt. Express, 20, 2012, p. 21773-p. 21783.
Kurosaka, Yoshitaka et al., "Phase-modulating lasers toward on-chip integration," Scientific Reports, Jul. 26, 2016, vol. 6, p. 30138.

(56) References Cited

OTHER PUBLICATIONS

Lee, Wai Hon "Sampled Fourier Transform Hologram Generated by Computer," Applied Optics, Mar. 1970, vol. 9, No. 3, p. 639-p. 644.
Peng, Chao et al., "Coupled-wave analysis for photonic-crystal surface- emitting lasers on air holes with arbitrary sidewalls," Optics Express, vol. 19, No. 24, 2011, p. 24672-p. 24686.
Sakai, Kyosuke et al., "Coupled-Wave Theory for Square-Lattice Photonic Crystal Lasers With TE Polarization," IEEE: Journal of Quantum Electronics, vol. 46, No. 5, 2010, p. 788-p. 795.
International Preliminary Report on Patentability mailed Feb. 21, 2019 for PCT/JP2017/029152.
International Preliminary Report on Patentability mailed Mar. 21, 2019 for PCT/JP2017/031466.
International Preliminary Report on Patentability mailed Oct. 10, 2019 for PCT/JP2018/012188.
International Preliminary Report on Patentability mailed Oct. 10, 2019 for PCT/JP2018/012191.
International Preliminary Report on Patentability mailed Dec. 26, 2019 for PCT/JP2018/022609.
International Preliminary Report on Patentability mailed Jun. 18, 2020 for PCT/JP2018/043843.
International Preliminary Report on Patentability mailed Dec. 17, 2020 for PCT/JP2019/022363.
JP Office Action dated Mar. 23, 2021 from counterpart Japanese patent application No. 2017-117736 (with attached English-language translation).
JP Office Action dated Aug. 17, 2021 from counterpart Japanese patent application No. P2019-509823 (with attached English-language translation).

\* cited by examiner

| A2 | A1 |
|---|---|
| A3 | A4 |

ORIGINAL IMAGE (b)

| A4 | A3 |
|---|---|
| A2 ROTATION | A1 ROTATION |
| A1 | A2 |
| A3 ROTATION | A4 ROTATION |

RESULTING BEAM PATTERN

Fig.10
(a)
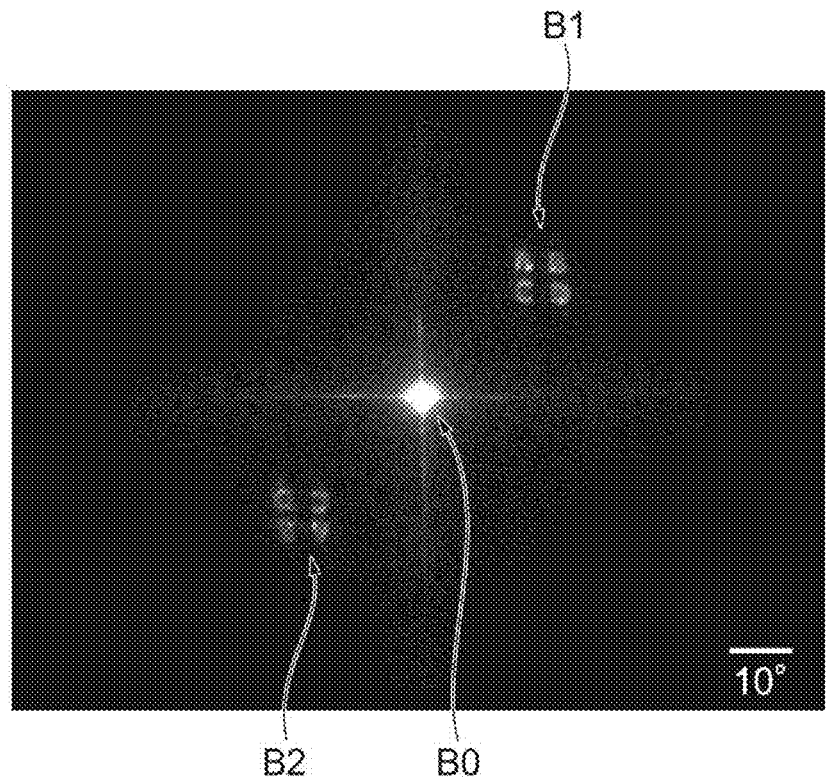
(b)
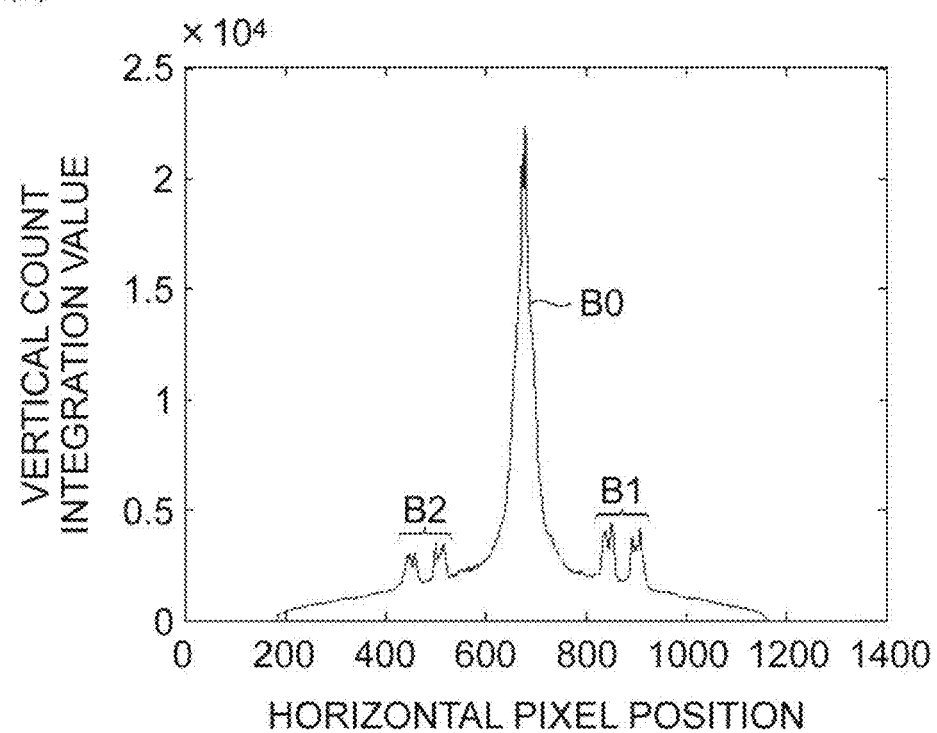

*Fig.11*
(a)
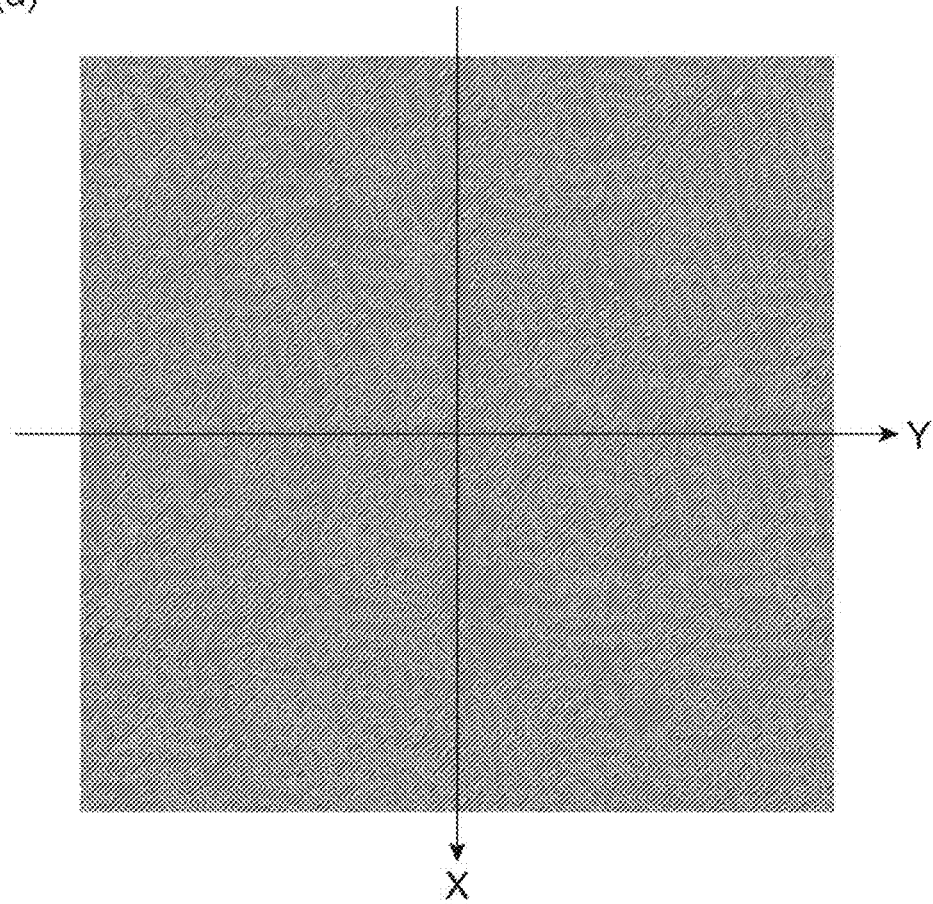
(b)
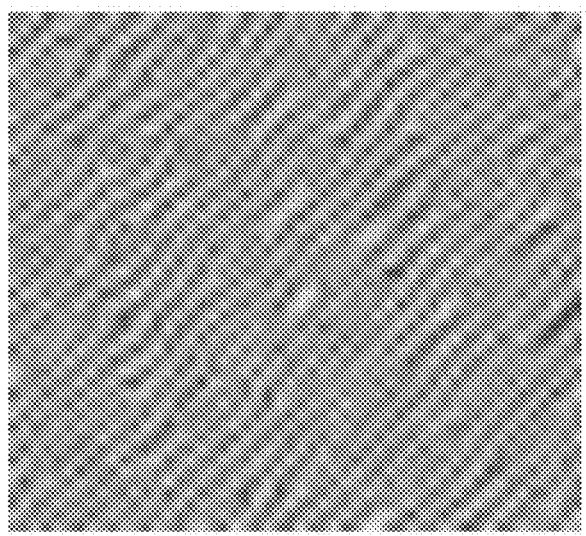

*Fig.13*
(a)
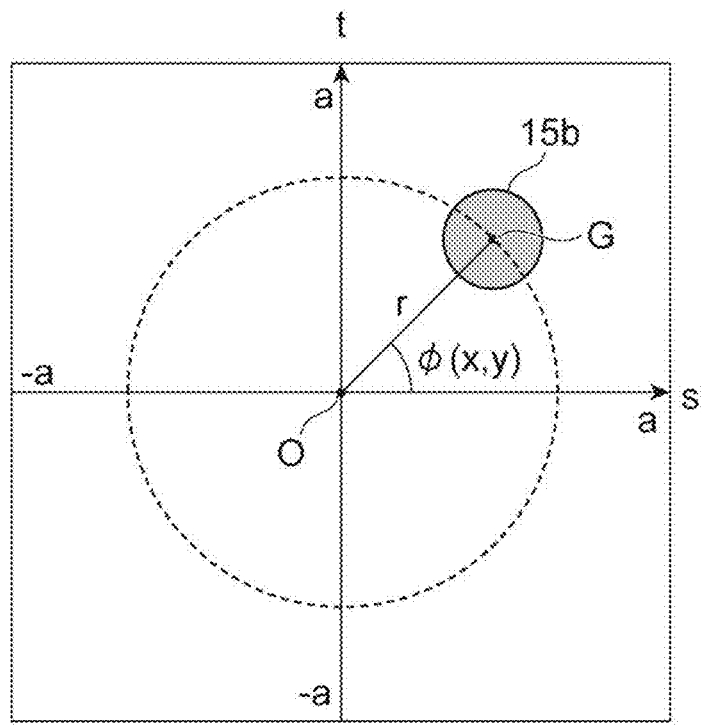
(b)
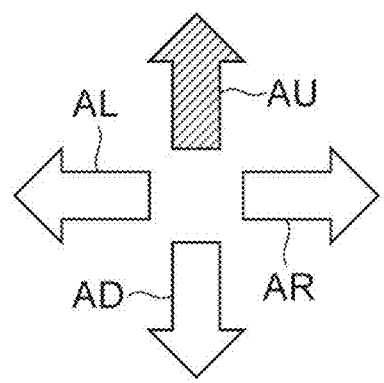

*Fig.14*
(a)
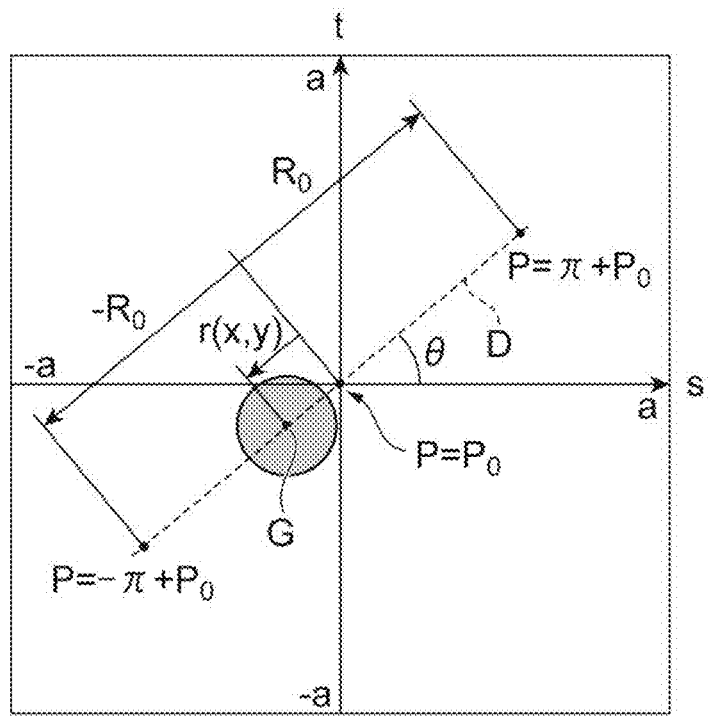
(b)
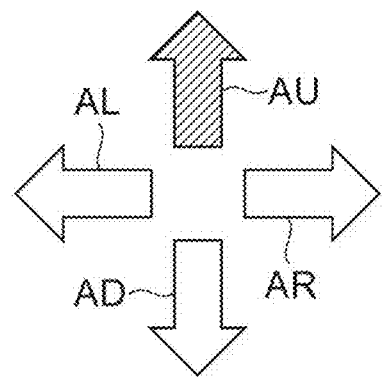

Fig.28

| LAYER NUMBER | CONDUCTIVITY TYPE | LAYER STRUCTURE | FILM THICKNESS (nm) | REFRACTIVE INDEX | Γ (%) |
|---|---|---|---|---|---|
| 1 | p | GaN CONTACT LAYER | 100 | 2.5549 | 0.1 |
| 2 | p | AlGaN CLADDING LAYER (Al COMPOSITION 6%) | 500 | 2.5289 | 15.9 |
| 3 | p | AlGaN CARRIER BARRIER LAYER (Al COMPOSITION 18%) | 20 | 2.4808 | 2.5 |
| 4 | u / p | GaN GUIDE LAYER | 60 | 2.5549 | 10.0 |
| 5 | u / n | InGaN BARRIER LAYER (In COMPOSITION 1%) | 10 | 2.5704 | 2.0 |
| 6 | u / n | InGaN QUANTUM WELL LAYER (In COMPOSITION 10%) | 3 | 2.7724 | 0.8 |
| 7 | u / n | InGaN BARRIER LAYER (In COMPOSITION 1%) | 10 | 2.5704 | 2.1 |
| 8 | u / n | InGaN QUANTUM WELL LAYER (In COMPOSITION 10%) | 3 | 2.7724 | 0.4 |
| 9 | u / n | InGaN BARRIER LAYER (In COMPOSITION 1%) | 10 | 2.5704 | 2.1 |
| 10 | u / n | InGaN QUANTUM WELL LAYER (In COMPOSITION 10%) | 3 | 2.7724 | 0.8 |
| 11 | u / n | InGaN BARRIER LAYER (In COMPOSITION 1%) | 10 | 2.5704 | 2.1 |
| 12 | u / n | AlGaN CARRIER BARRIER LAYER (Al COMPOSITION 18%) | 10 | 2.4808 | 2.0 |
| 13 | u / n | InGaN HIGH REFRACTIVE INDEX LAYER (In COMPOSITION 5%) | 20 | 2.6660 | 3.7 |
| 14 | u / n | GaN GUIDE LAYER | 20 | 2.5549 | 3.1 |
| 15 | u / n | PHASE MODULATION LAYER (GaN/HOLE. HOLE FF = 15%) | 70 | 2.3871 | 8.6 |
| 16 | u / n | GaN GUIDE LAYER | 20 | 2.5549 | 3.2 |
| 17 | u / n | InGaN HIGH REFRACTIVE INDEX LAYER (In COMPOSITION 6%) | 40 | 2.6660 | 7.8 |
| 18 | n | GaN LAYER GUIDE LAYER | 50 | 2.5549 | 8.8 |
| 19 | n | AlGaN CLADDING LAYER (Al COMPOSITION 6%) | 1200 | 2.5289 | 23.8 |
|  | n | GaN LAYER SUBSTRATE | — | — | — |

Fig.30

| LAYER NUMBER | CONDUCTIVITY TYPE | LAYER STRUCTURE | FILM THICKNESS (nm) | REFRACTIVE INDEX | Γ(%) |
|---|---|---|---|---|---|
| 1 | p | GaN CONTACT LAYER | 100 | 2.5549 | 0.1 |
| 2 | p | AlGaN CLADDING LAYER (Al COMPOSITION 6%) | 500 | 2.5289 | 16.1 |
| 3 | p | AlGaN CARRIER BARRIER LAYER (Al COMPOSITION 18%) | 20 | 2.4808 | 2.6 |
| 4 | u/p | GaN GUIDE LAYER | 60 | 2.5549 | 10.8 |
| 5 | u/n | InGaN BARRIER LAYER (In COMPOSITION 1%) | 10 | 2.5704 | 2.2 |
| 6 | u/n | InGaN QUANTUM WELL LAYER (In COMPOSITION 10%) | 3 | 2.7724 | 0.9 |
| 7 | u/n | InGaN BARRIER LAYER (In COMPOSITION 1%) | 10 | 2.5704 | 2.3 |
| 8 | u/n | InGaN QUANTUM WELL LAYER (In COMPOSITION 10%) | 3 | 2.7724 | 0.5 |
| 9 | u/n | InGaN BARRIER LAYER (In COMPOSITION 1%) | 10 | 2.5704 | 2.4 |
| 10 | u/n | InGaN QUANTUM WELL LAYER (In COMPOSITION 10%) | 3 | 2.7724 | 0.9 |
| 11 | u/n | InGaN BARRIER LAYER (In COMPOSITION 1%) | 10 | 2.5704 | 2.3 |
| 12 | u/n | InGaN HIGH REFRACTIVE INDEX LAYER (In COMPOSITION 6%) | 20 | 2.6660 | 4.3 |
| 13 | u/n | GaN GUIDE LAYER | 20 | 2.5549 | 3.5 |
| 14 | u/n | PHASE MODULATION LAYER (GaN/HOLE, HOLE FF = 15%) | 70 | 2.3871 | 9.3 |
| 15 | u/n | GaN GUIDE LAYER | 20 | 2.5549 | 3.3 |
| 16 | u/n | InGaN HIGH REFRACTIVE INDEX LAYER (In COMPOSITION 6%) | 40 | 2.6660 | 7.9 |
| 17 | n | GaN LAYER GUIDE LAYER | 50 | 2.5549 | 8.7 |
| 18 | n | AlGaN CLADDING LAYER (Al COMPOSITION 6%) | 1200 | 2.5289 | 21.9 |
|  | n | GaN LAYER SUBSTRATE | — | — | — |

Fig.32

| LAYER NUMBER | CONDUCTIVITY TYPE | LAYER STRUCTURE | FILM THICKNESS (nm) | REFRACTIVE INDEX | Γ(%) |
|---|---|---|---|---|---|
| 1 | p | GaN CONTACT LAYER | 100 | 2.5549 | 0.1 |
| 2 | p | AlGaN CLADDING LAYER (Al COMPOSITION 6%) | 500 | 2.5289 | 14.4 |
| 3 | p | AlGaN CARRIER BARRIER LAYER (Al COMPOSITION 18%) | 20 | 2.4808 | 2.4 |
| 4 | u/p | GaN GUIDE LAYER | 60 | 2.5549 | 9.9 |
| 5 | u/n | InGaN BARRIER LAYER (In COMPOSITION 1%) | 10 | 2.5704 | 2.0 |
| 6 | u/n | InGaN QUANTUM WELL LAYER (In COMPOSITION 10%) | 3 | 2.7724 | 0.8 |
| 7 | u/n | InGaN BARRIER LAYER (In COMPOSITION 1%) | 10 | 2.5704 | 2.2 |
| 8 | u/n | InGaN QUANTUM WELL LAYER (In COMPOSITION 10%) | 3 | 2.7724 | 0.4 |
| 9 | u/n | InGaN BARRIER LAYER (In COMPOSITION 1%) | 10 | 2.5704 | 2.2 |
| 10 | u/n | InGaN QUANTUM WELL LAYER (In COMPOSITION 10%) | 3 | 2.7724 | 0.9 |
| 11 | u/n | InGaN BARRIER LAYER (In COMPOSITION 1%) | 10 | 2.5704 | 2.1 |
| 12 | u/n | AlGaN CARRIER BARRIER LAYER (Al COMPOSITION 18%) | 10 | 2.4808 | 2.1 |
| 13 | u/n | InGaN HIGH REFRACTIVE INDEX LAYER (In COMPOSITION 5%) | 20 | 2.6660 | 3.9 |
| 14 | u/n | GaN GUIDE LAYER | 20 | 2.5549 | 3.4 |
| 15 | u/n | PHASE MODULATION LAYER (GaN/HOLE. HOLE FF = 12%) | 80 | 2.4216 | 10.7 |
| 16 | u/n | GaN GUIDE LAYER | 20 | 2.5549 | 3.4 |
| 17 | u/n | InGaN HIGH REFRACTIVE INDEX LAYER (In COMPOSITION 6%) | 40 | 2.6660 | 8.2 |
| 18 | n | GaN LAYER GUIDE LAYER | 50 | 2.5549 | 9.0 |
| 19 | n | AlGaN CLADDING LAYER (Al COMPOSITION 6%) | 1200 | 2.5289 | 22.0 |
|  | n | GaN LAYER SUBSTRATE | — | — | — |

Fig.34

| LAYER NUMBER | CONDUCTIVITY TYPE | LAYER STRUCTURE | FILM THICKNESS (nm) | REFRACTIVE INDEX | Γ(%) |
|---|---|---|---|---|---|
| 1 | p | GaN CONTACT LAYER | 100 | 2.5549 | 0.1 |
| 2 | p | AlGaN CLADDING LAYER (Al COMPOSITION 6%) | 500 | 2.5289 | 17.2 |
| 3 | p | AlGaN CARRIER BARRIER LAYER (Al COMPOSITION 18%) | 10 | 2.4808 | 1.3 |
| 4 | u/p | GaN GUIDE LAYER | 60 | 2.5549 | 9.7 |
| 5 | u/n | InGaN BARRIER LAYER (In COMPOSITION 1%) | 10 | 2.5704 | 1.9 |
| 6 | u/n | InGaN QUANTUM WELL LAYER (In COMPOSITION 10%) | 3 | 2.7150 | 0.8 |
| 7 | u/n | InGaN BARRIER LAYER (In COMPOSITION 1%) | 10 | 2.5704 | 2.0 |
| 8 | u/n | InGaN QUANTUM WELL LAYER (In COMPOSITION 10%) | 3 | 2.7150 | 0.4 |
| 9 | u/n | InGaN BARRIER LAYER (In COMPOSITION 1%) | 10 | 2.5704 | 2.0 |
| 10 | u/n | AlGaN CARRIER BARRIER LAYER (Al COMPOSITION 18%) | 10 | 2.4808 | 2.0 |
| 11 | u/n | InGaN HIGH REFRACTIVE INDEX LAYER (In COMPOSITION 6%) | 30 | 2.6660 | 5.7 |
| 12 | u/n | GaN GUIDE LAYER | 20 | 2.5549 | 3.1 |
| 13 | u/n | PHASE MODULATION LAYER (GaN/HOLE, HOLE FF = 15%) | 70 | 2.3871 | 8.4 |
| 14 | u/n | GaN GUIDE LAYER | 20 | 2.5549 | 3.0 |
| 15 | u/n | InGaN HIGH REFRACTIVE INDEX LAYER (In COMPOSITION 6%) | 30 | 2.6660 | 5.5 |
| 16 | u/n | AlGaN CARRIER BARRIER LAYER (Al COMPOSITION 18%) | 10 | 2.4808 | 1.9 |
| 17 | u/n | InGaN BARRIER LAYER (In COMPOSITION 1%) | 10 | 2.5704 | 1.9 |
| 18 | u/n | InGaN QUANTUM WELL LAYER (In COMPOSITION 10%) | 3 | 2.7150 | 0.8 |
| 19 | u/n | InGaN BARRIER LAYER (In COMPOSITION 1%) | 10 | 2.5704 | 1.9 |
| 20 | u/n | InGaN QUANTUM WELL LAYER (In COMPOSITION 10%) | 3 | 2.7150 | 0.4 |
| 21 | u/n | InGaN BARRIER LAYER (In COMPOSITION 1%) | 10 | 2.5704 | 1.8 |
| 22 | u/n | GaN LAYER GUIDE LAYER | 50 | 2.5549 | 7.8 |
| 23 | n | AlGaN CARRIER BARRIER LAYER (Al COMPOSITION 18%) | 10 | 2.4808 | 1.3 |
| 24 | n | AlGaN CLADDING LAYER (Al COMPOSITION 6%) | 1200 | 2.5289 | 19.2 |
|  | n | GaN LAYER SUBSTRATE | — | — | — |

Fig.36

| LAYER NUMBER | CONDUCTIVITY TYPE | LAYER STRUCTURE | FILM THICKNESS (nm) | REFRACTIVE INDEX | Γ(%) |
|---|---|---|---|---|---|
| 1 | p | GaN CONTACT LAYER | 100 | 2.5549 | 0.1 |
| 2 | p | AlGaN CLADDING LAYER (Al COMPOSITION 6%) | 500 | 2.5289 | 16.3 |
| 3 | p | AlGaN CARRIER BARRIER LAYER (Al COMPOSITION 18%) | 10 | 2.4808 | 1.3 |
| 4 | u/p | GaN GUIDE LAYER | 60 | 2.5549 | 10.4 |
| 5 | u/n | InGaN BARRIER LAYER (In COMPOSITION 1%) | 10 | 2.5704 | 2.1 |
| 6 | u/n | InGaN QUANTUM WELL LAYER (In COMPOSITION 10%) | 3 | 2.7150 | 0.9 |
| 7 | u/n | InGaN BARRIER LAYER (In COMPOSITION 1%) | 10 | 2.5704 | 2.2 |
| 8 | u/n | InGaN QUANTUM WELL LAYER (In COMPOSITION 10%) | 3 | 2.7150 | 0.4 |
| 9 | u/n | InGaN BARRIER LAYER (In COMPOSITION 1%) | 10 | 2.5704 | 2.3 |
| 10 | u/n | InGaN HIGH REFRACTIVE INDEX LAYER (In COMPOSITION 6%) | 30 | 2.6660 | 6.5 |
| 11 | u/n | GaN GUIDE LAYER | 20 | 2.5549 | 3.5 |
| 12 | u/n | PHASE MODULATION LAYER (GaN/HOLE, HOLE FF = 15%) | 70 | 2.3871 | 9.4 |
| 13 | u/n | GaN GUIDE LAYER | 20 | 2.5549 | 3.4 |
| 14 | u/n | InGaN HIGH REFRACTIVE INDEX LAYER (In COMPOSITION 6%) | 30 | 2.6660 | 6.2 |
| 15 | u/n | InGaN BARRIER LAYER (In COMPOSITION 1%) | 10 | 2.5704 | 2.2 |
| 16 | u/n | InGaN QUANTUM WELL LAYER (In COMPOSITION 10%) | 3 | 2.7150 | 0.9 |
| 17 | u/n | InGaN BARRIER LAYER (In COMPOSITION 1%) | 10 | 2.5704 | 2.1 |
| 18 | u/n | InGaN QUANTUM WELL LAYER (In COMPOSITION 10%) | 3 | 2.7150 | 0.4 |
| 19 | u/n | InGaN BARRIER LAYER (In COMPOSITION 1%) | 10 | 2.5704 | 2.0 |
| 20 | u/n | GaN LAYER GUIDE LAYER | 50 | 2.5549 | 8.4 |
| 21 | n | AlGaN CARRIER BARRIER LAYER (Al COMPOSITION 18%) | 10 | 2.4808 | 1.3 |
| 22 | n | AlGaN CLADDING LAYER (Al COMPOSITION 6%) | 1200 | 2.5289 | 17.8 |
|  | n | GaN LAYER SUBSTRATE | — | — | — |

Fig.38

| LAYER NUMBER | CONDUCTIVITY TYPE | LAYER STRUCTURE | FILM THICKNESS (nm) | REFRACTIVE INDEX | Γ(%) |
|---|---|---|---|---|---|
| 1 | p | GaN CONTACT LAYER | 100 | 2.4776 | 0.2 |
| 2 | p | AlGaN CLADDING LAYER (Al COMPOSITION 6%) | 500 | 2.4612 | 24.5 |
| 3 | p | AlGaN CARRIER BARRIER LAYER (Al COMPOSITION 18%) | 20 | 2.4296 | 3.0 |
| 4 | u/p | GaN GUIDE LAYER | 60 | 2.4776 | 11.1 |
| 5 | u/n | InGaN BARRIER LAYER (In COMPOSITION 1%) | 10 | 2.4872 | 2.1 |
| 6 | u/n | InGaN QUANTUM WELL LAYER (In COMPOSITION 18%) | 5 | 2.7588 | 1.3 |
| 7 | u/n | InGaN BARRIER LAYER (In COMPOSITION 1%) | 10 | 2.4872 | 2.2 |
| 8 | u/n | InGaN QUANTUM WELL LAYER (In COMPOSITION 18%) | 5 | 2.7588 | 0.9 |
| 9 | u/n | InGaN BARRIER LAYER (In COMPOSITION 1%) | 10 | 2.4872 | 2.2 |
| 10 | u/n | InGaN QUANTUM WELL LAYER (In COMPOSITION 18%) | 5 | 2.7588 | 1.3 |
| 11 | u/n | InGaN BARRIER LAYER (In COMPOSITION 1%) | 10 | 2.4872 | 2.0 |
| 12 | u/n | AlGaN CARRIER BARRIER LAYER (Al COMPOSITION 18%) | 10 | 2.4296 | 1.9 |
| 13 | u/n | InGaN HIGH REFRACTIVE INDEX LAYER (In COMPOSITION 5%) | 20 | 2.5432 | 3.3 |
| 14 | u/n | GaN GUIDE LAYER | 20 | 2.4776 | 2.7 |
| 15 | u/n | PHASE MODULATION LAYER (GaN/HOLE. HOLE FF = 15%) | 70 | 2.3168 | 6.6 |
| 16 | u/n | GaN GUIDE LAYER | 20 | 2.4776 | 1.9 |
| 17 | u/n | InGaN HIGH REFRACTIVE INDEX LAYER (In COMPOSITION 6%) | 40 | 2.5432 | 4.2 |
| 18 | n | GaN GUIDE LAYER | 100 | 2.4776 | 9.6 |
| 19 | n | AlGaN CLADDING LAYER (Al COMPOSITION 6%) | 1200 | 2.4612 | 19.1 |
|  | n | GaN LAYER SUBSTRATE | – | – | – |

LIGHT-EMITTING ELEMENT

TECHNICAL FIELD

The present invention relates to a light-emitting element.

BACKGROUND ART

Patent Document 1 describes a technology related to a semiconductor light-emitting element. The semiconductor light-emitting element includes an active layer, a pair of cladding layers sandwiching the active layer, and a phase modulation layer optically coupled to the active layer. The phase modulation layer includes a base layer and a plurality of modified refractive index regions different in refractive index from the base layer. When an XYZ orthogonal coordinate system with the thickness direction of the phase modulation layer as a Z-axis direction is set, and a virtual square lattice with a lattice spacing a is set on an installation surface parallel to an X-Y plane, each modified refractive index region is arranged such that its center of gravity has a rotation angle according to an optical image around a lattice point in the virtual square lattice.

CITATION LIST

Patent Literature

Patent Document 1: International Publication No. 2016/148075

Non Patent Literature

Non-Patent Document 1: Y. Kurosaka et al., "Effects of non-lasing band in two-dimensional photonic-crystal lasers clarified using omnidirectional band structure," Opt. Express 20, 21773-21783 (2012)

Non-Patent Document 2: K. Sakai et al., "Coupled-Wave Theory for Square-Lattice Photonic Crystal Lasers With TE Polarization," IEEE J.Q.E. 46, 788-795 (2010)

Non-Patent Document 3: C. Peng, et al., "Coupled-wave analysis for photonic-crystal surface-emitting lasers on air holes with arbitrary sidewalls," Optics Express Vol. 19, No. 24, pp. 24672-24686 (2011)

SUMMARY OF INVENTION

Technical Problem

The inventors have found the following problems as a result of examining the above-described conventional technology. That is, a light-emitting element that outputs any optical image by controlling a phase spectrum and an intensity spectrum of light emitted from a plurality of two-dimensionally arrayed light-emitting points has been studied. One structure of such a light-emitting element is a structure including a phase modulation layer provided on a substrate. The phase modulation layer has a base layer and a plurality of modified refractive index regions having a refractive index different from that of the base layer, and when a virtual square lattice is set in a plane perpendicular to the thickness direction of the phase modulation layer, the barycentric position of each modified refractive index region is displaced from the lattice point position of the virtual square lattice according to the optical image. Such a light-emitting element is called static-integrable phase modulating (S-iPM) laser and outputs an optical image of any shape in a direction tilted with respect to a direction perpendicular to the main surface of the substrate.

Conventionally, as the semiconductor light-emitting element described in Patent Document 1, such a light-emitting element has been known in which the center of gravity of each modified refractive index region is arranged away from the corresponding lattice point of the virtual square lattice and has a rotation angle according to the optical image around each lattice point. However, if it is possible to realize a new light-emitting element in which the positional relationship between the center of gravity of each modified refractive index region and each lattice point is different from that of the conventional light-emitting element, the range of design of the phase modulation layer is widened, which is extremely useful.

The present invention has been made to solve the above problems, and an object of the present invention is to provide a light-emitting element in which the positional relationship between the center of gravity of each modified refractive index region and each lattice point is different from the conventional one.

Solution to Problem

The light-emitting element according to the present embodiment is a light-emitting element configured to output light that forms an optical image along a normal direction of a main surface of a substrate, a tilt direction intersecting with the normal direction, or both the normal direction and the tilt direction, and in order to solve the above-mentioned problem, the light-emitting element at least includes a substrate, a first cladding layer, an active layer, a second cladding layer, a phase modulation layer, and a high refractive index layer. The first cladding layer is provided on the main surface of the substrate. The active layer is provided on the first cladding layer. The second cladding layer is provided on the active layer. The phase modulation layer is provided between the first cladding layer and the active layer or between the active layer and the second cladding layer. The phase modulation layer includes a base layer and a plurality of modified refractive index regions having a refractive index different from that of the base layer. The high refractive index layer is provided between the first cladding layer and the second cladding layer. The high refractive index layer has a refractive index higher than that of any of the first cladding layer, the second cladding layer, and the phase modulation layer. The high refractive index layer is provided in at least one of a space where the phase modulation layer is sandwiched between the high refractive index layer and the active layer, and a space where the high refractive index layer is sandwiched between the active layer and the phase modulation layer. Each of the first cladding layer, the active layer, the second cladding layer, the phase modulation layer, and the high refractive index layer mainly contains a nitride semiconductor.

In particular, when a virtual square lattice is set on a design surface of the phase modulation layer, the centers of gravity of the plurality of modified refractive index regions are arranged on a straight line passing through a lattice point of the virtual square lattice and tilted with respect to the square lattice. The distance between the center of gravity of each modified refractive index region and the corresponding lattice point is individually set according to the optical image. More specifically, on a design surface of the phase modulation layer orthogonal to the normal direction, each of the plurality of modified refractive index regions is arranged so as to correspond one-to-one to any lattice point of the virtual square lattice. In addition, in a plurality of effective lattice points where a plurality of modified refractive index regions are associated, among lattice points constituting a virtual square lattice, a line segment connecting any specific lattice point and the center of gravity of a specific modified refractive index region associated with the specific lattice point is parallel to each line segment connecting a plurality of peripheral lattice points adjacent to the specific lattice point at the shortest distance and the centers of gravity of a plurality of peripheral modified refractive index regions associated respectively with the plurality of peripheral lattice points.

Advantageous Effects of Invention

According to the present embodiment, it is possible to provide a light-emitting element in which the positional relationship between the center of gravity of each modified refractive index region and each lattice point is different from the conventional one.

BRIEF DESCRIPTION OF DRAWINGS

FIGS. 9A and 9B are diagrams for explaining points to be noted when obtaining a phase angle distribution from a Fourier transform result of an optical image and determining an arrangement of the modified refractive index region.

FIG. 10A shows an example of a beam pattern (optical image) outputted from the semiconductor light-emitting element, and FIG. 10B shows a graph showing a light intensity distribution in a cross section including an axis intersecting with a light-emitting surface of the semiconductor light-emitting element and perpendicular to the light-emitting surface.

FIG. 11A is a diagram showing a phase distribution corresponding to the beam pattern shown in FIG. 10A, and FIG. 11B is a partially enlarged view of FIG. 11A.

FIG. 13A is a diagram showing a conventional method of rotating the modified refractive index region around a lattice point, and FIG. 13B is a diagram showing traveling waves AU, AD, AR, and AL.

FIG. 14A is a diagram showing a method in which a modified refractive index region moves on an axis passing through a lattice point and tilted with respect to a square lattice, and FIG. 14B is a diagram showing the traveling waves AU, AD, AR, and AL.

FIG. 28 is a table showing a layer structure of the semiconductor light-emitting element according to a specific example.

FIG. 30 is a table showing a layer structure of the semiconductor light-emitting element according to a specific example.

FIG. 32 is a table showing a layer structure of the semiconductor light-emitting element according to a specific example.

FIG. 34 is a table showing a layer structure of the semiconductor light-emitting element according to a specific example.

FIG. 36 is a table showing a layer structure of the semiconductor light-emitting element according to a specific example.

FIG. 38 is a table showing a layer structure of the semiconductor light-emitting element according to a specific example.

DESCRIPTION OF EMBODIMENTS

Figure 1:
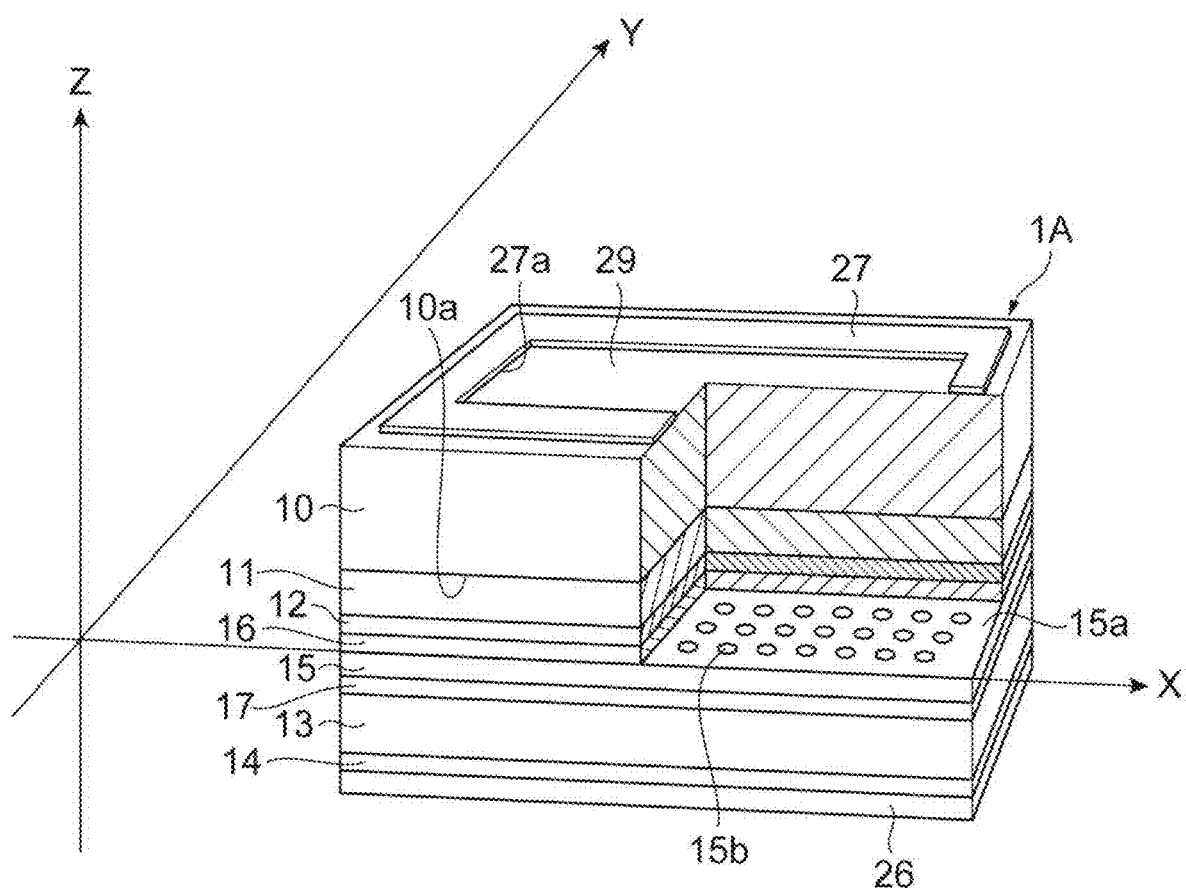
FIG. 1 is a perspective view showing a configuration of a semiconductor light-emitting element as a light-emitting element according to an embodiment of the present invention.

Description of Embodiments of Invention of this Application

First, contents of the embodiments of the invention of this application will be individually listed and described.

(1) The light-emitting element according to the present embodiment is a light-emitting element configured to output light that forms an optical image along a normal direction of the main surface of the substrate, a tilt direction intersecting with the normal direction, or both the normal direction and the tilt direction, and as one aspect thereof, the light-emitting element includes at least a substrate, a first cladding layer, an active layer, a second cladding layer, a phase modulation layer, and a high refractive index layer. The first cladding layer is provided on the main surface of the substrate. The active layer is provided on the first cladding layer. The second cladding layer is provided on the active layer. The phase modulation layer is provided between the first cladding layer and the active layer or between the active layer and the second cladding layer. The phase modulation layer includes a base layer and a plurality of modified refractive index regions having a refractive index different from that of the base layer. The high refractive index layer is provided between the first cladding layer and the second cladding layer. The high refractive index layer has a refractive index higher than that of any of the first cladding layer, the second cladding layer, and the phase modulation layer. The high refractive index layer is provided in at least one of a space where the phase modulation layer is sandwiched between the high refractive index layer and the active layer, and a space where the high refractive index layer is sandwiched between the active layer and the phase modulation layer. Each of the first cladding layer, the active layer, the second cladding layer, the phase modulation layer, and the high refractive index layer mainly contains a nitride semiconductor.

In particular, when a virtual square lattice is set on a design surface of the phase modulation layer, the centers of gravity of the plurality of modified refractive index regions are arranged on a straight line passing through a lattice point of the virtual square lattice and tilted with respect to the square lattice. The distance between the center of gravity of each modified refractive index region and the corresponding lattice point is individually set according to the optical image. More specifically, on a design surface of the phase modulation layer orthogonal to the normal direction, each of the plurality of modified refractive index regions is arranged so as to correspond one-to-one to any lattice point of the virtual square lattice. In addition, in a plurality of effective lattice points where a plurality of modified refractive index regions are associated, among lattice points constituting a virtual square lattice, a line segment connecting any specific lattice point and the center of gravity of a specific modified refractive index region associated with the specific lattice point is parallel to each line segment connecting a plurality of peripheral lattice points adjacent to the specific lattice point at the shortest distance and the centers of gravity of a plurality of peripheral modified refractive index regions associated respectively with the plurality of peripheral lattice points.

In the light-emitting element of this aspect, the center of gravity of each modified refractive index region is arranged on a straight line passing through a lattice point of the virtual square lattice and tilted with respect to the square lattice. Then, the distance between the center of gravity of each modified refractive index region and the corresponding lattice point is individually set according to the optical image. According to such a structure, similarly to the conventional structure in which the center of gravity of each modified refractive index region has a rotation angle corresponding to the optical image around each lattice point, it is possible to output light that forms an optical image of any shape in a tilt direction intersecting with the normal direction of the main surface of the substrate. That is, it is possible to provide a light-emitting element in which the positional relationship between the center of gravity of each modified refractive index region and each lattice point is different from the conventional one.

In order to minimize the threshold current as much as possible, it is desirable to increase the optical confinement coefficient in the phase modulation layer. In the case of a light-emitting element in an infrared region (0.9 to 1.1 µm) mainly containing a GaAs-based semiconductor, for example, the optical confinement coefficient of the phase modulation layer is 20% or more, and a relatively good threshold current value is obtained. However, in the case of a light-emitting element in the ultraviolet region to the blue region mainly containing a nitride semiconductor such as GaN, if the layer structure is the same as that of a light-emitting element mainly containing a GaAs-based semiconductor, the optical confinement coefficient of the layer forming a resonant mode remains about 2 to 3% due to the characteristics of the material. Therefore, the threshold current value becomes extremely large, and it may be difficult to obtain a practical light-emitting element capable of continuously oscillating. The resonance mode may become unstable at such a low optical confinement coefficient. For such a problem, the light-emitting element of the present aspect further includes a high refractive index layer having a refractive index higher than that of the first cladding layer, the second cladding layer, and the phase modulation layer. The high refractive index layer is provided in the vicinity of the phase modulation layer, i.e., between the first cladding layer and the second cladding layer, in at least one of a space where the phase modulation layer is sandwiched between the high refractive index layer and the active layer, and a space where the high refractive index layer is sandwiched between the active layer and the phase modulation layer. Since the high refractive index layer has an optical confinement coefficient larger than the surrounding layers have, the optical confinement coefficient of the phase modulation layer located in the vicinity of the high refractive index layer also becomes large under the influence thereof. Therefore, according to the light-emitting element of the present aspect, the optical confinement coefficient of the phase modulation layer can be increased.

(2) As one aspect of the present embodiment, the first cladding layer, the second cladding layer, and the base layer are preferably a GaN layer or an AlGaN layer. As one aspect of the present embodiment, the high refractive index layer may be a nitride semiconductor layer containing In. In this case, a high refractive index layer having a refractive index higher than that of the first cladding layer, the second cladding layer, and the phase modulation layer can be preferably realized. As one aspect of the present embodiment, the high refractive index layer may further contain Al. The larger the Al composition becomes, the lower the refractive index of the high refractive index layer becomes, but the band gap becomes wider and the light transmittivity can be enhanced. By including the Al composition, change of the lattice constant from the GaN base layer due to the inclusion of the In composition is relaxed, and distortion of the output beam can be suppressed.

(3) As one aspect of the present embodiment, the tilt angle of the straight line D with respect to the square lattice may be constant. That is, in a plurality of effective lattice points where a plurality of modified refractive index regions are associated, among lattice points constituting a virtual square lattice, a line segment connecting any specific lattice point and the center of gravity of a specific modified refractive index region associated with the specific lattice point may be parallel to each line segment connecting the remaining effective lattice point excluding the specific lattice point and the remaining modified refractive index region associated individually with the remaining effective lattice point. This makes it possible to easily design the arrangement of the center of gravity of the modified refractive index region.

(4) As one aspect of the present embodiment, the tilt angle θ may be an angle excluding 0°, 90°, 180°, and 270°. It is to be noted that the tilt angle is defined by an angle formed by a reference line segment and a line segment connecting a specific lattice point and the center of gravity of a specific modified refractive index region associated with the specific lattice point. The reference line segment is defined by a line segment connecting between a specific lattice point and an adjacent lattice point adjacent to the specific lattice point at the shortest distance. Furthermore, as one aspect of the present embodiment, the tilt angle may be 45°, 135°, 225°, or 315°. Thus, four fundamental waves traveling along the square lattice (when the X-axis and the Y-axis along the square lattice are set, light traveling in an X-axis positive direction, light traveling in an X-axis negative direction, light traveling in a Y-axis positive direction, and light traveling in a Y-axis negative direction) can equally contribute to the optical image. It is to be noted that when the tilt angle is 0°, 90°, 180°, or 270°, the straight line corresponds to the X-axis or Y-axis of the square lattice, but at this time, when the tilt angle is, for example, 0° or 180° and the straight line is along the X-axis, two traveling waves, of the four fundamental waves, facing each other in the Y-axis direction do not undergo phase modulation, and hence do not contribute to signal light. When the tilt angle is 90° or 270° and the straight line is along the Y-axis, the two traveling waves facing each other in the X-axis direction do not contribute to the signal light. Therefore, when the tilt angle is 0°, 90°, 180°, or 270°, it is impossible to obtain the signal light with high efficiency.

(5) As one aspect of the present embodiment, in the phase modulation layer, a plurality of modified refractive index regions are arranged at predetermined positions in the base layer according to an arrangement pattern for forming an optical image. In a situation where in the XYZ orthogonal coordinate system defined by the Z-axis coincident with the normal direction of the main surface and the X-Y plane coincident with one surface of the phase modulation layer including the plurality of modified refractive index regions and including the X-axis and the Y-axis orthogonal to each other, a virtual square lattice composed of M1 (integer of 1 or more)×N1 (integer of 1 or more) unit constituent regions R each having a square shape is set on the X-Y plane, the arrangement pattern is defined so that in a unit constituent region R (x, y) on the X-Y plane specified by a coordinate component x (integer of 1 or more and M1 or less) in the X-axis direction and a coordinate component y (integer of 1 or more and N1 or less) in the Y-axis direction, the center of gravity G of the modified refractive index region located in the unit constituent region R (x, y) is away by a predetermined distance from a lattice point O (x, y) serving as the center of the unit constituent region R (x, y) and the vector from the lattice point O (x, y) to the center of gravity G is oriented in a specific direction. It is to be noted that the phase modulation layer is configured so that, in a situation where the unit constituent region R (x, y) is defined by an s-axis and a t-axis that are parallel to the X-axis and the Y-axis, respectively, and orthogonal to each other at the lattice point O (x, y), the center of gravity G of a corresponding modified refractive index region is located on a straight line that passes through the lattice point O (x, y) and is tilted from the s-axis, and the corresponding modified refractive index region where a line segment length r (x, y) from the lattice point O (x, y) to a center of gravity G of the corresponding modified refractive index region satisfies a relationship, $$r(x,y)=C\times(P(x,y)-P_0)$$

C: Proportional constant
$P_0$: Any constant
is arranged in the unit constituent region R (x, y).

Thus, each aspect listed in this [Description of Embodiments of Invention of This Application] column is applicable to each of all remaining aspects or to all combinations of these remaining aspects.

Details of Embodiments of Invention of this Application

Hereinafter, a specific structure of the light-emitting element according to the present embodiment will be described in detail with reference to the accompanying drawings. It is to be noted that the present invention is not limited to these examples, but is shown by the claims, and is intended to include all variations within the meaning and scope equivalent of the claims. In addition, in the description of the drawings, identical elements are given identical reference numerals and redundant description is omitted.

FIG. 1 is a perspective view showing the configuration of a semiconductor light-emitting element 1A as a light-emitting element according to an embodiment of the present invention. It is to be noted that an XYZ orthogonal coordinate system in which an axis passing through the center of the semiconductor light-emitting element 1A and extending in the thickness direction of the semiconductor light-emitting element 1A is the Z-axis is defined. The semiconductor light-emitting element 1A is S-iPM laser that forms a standing wave along a predetermined direction on the X-Y plane and outputs a phase-controlled plane wave in the Z-axis direction, and as will be described later, outputs a two-dimensional optical image of any shape including a direction perpendicular to a main surface 10a of a semiconductor substrate 10 (i.e., the Z-axis direction), a direction tilted with respect to this, or the both.

Figure 2:
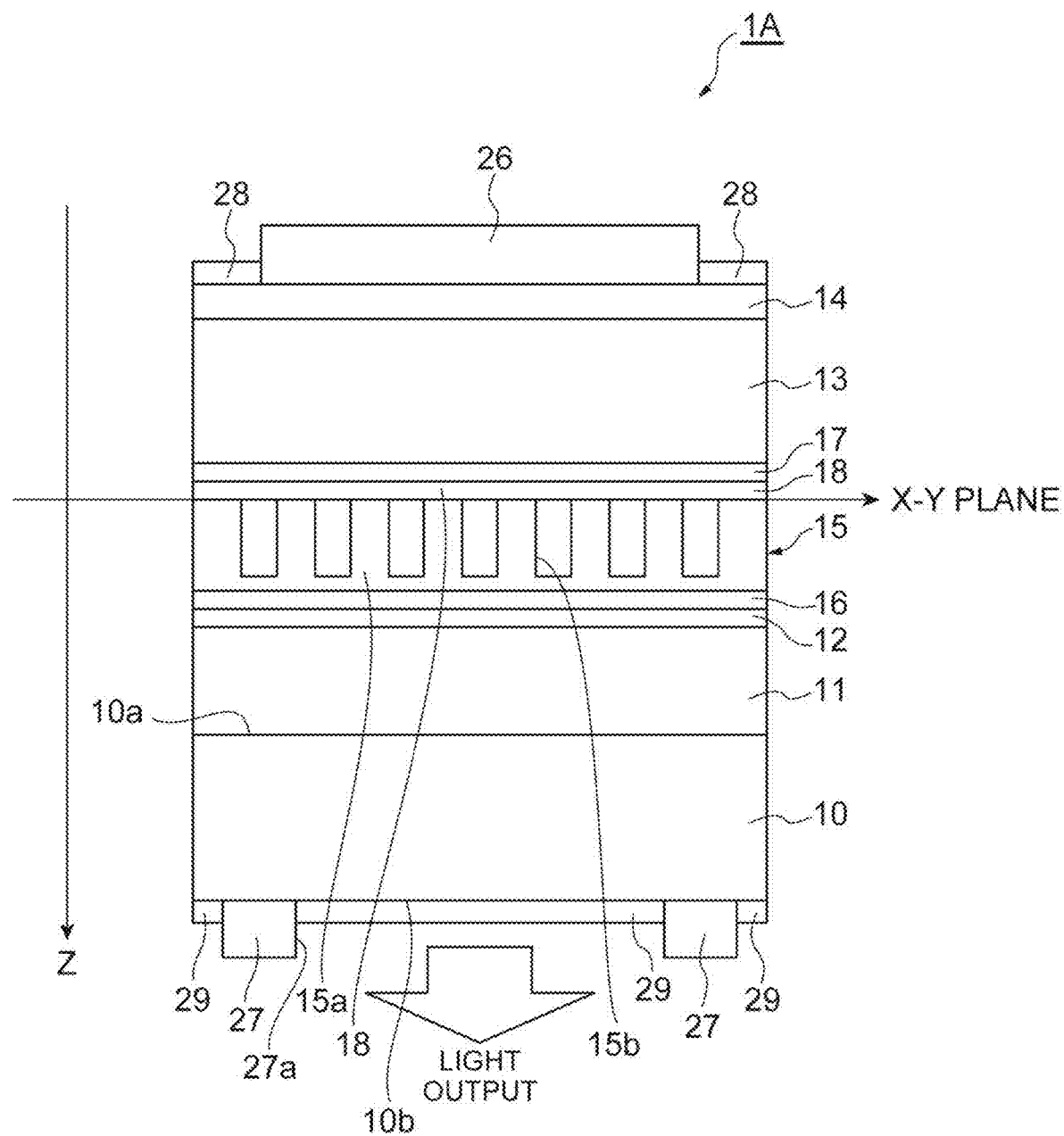
FIG. 2 is a cross-sectional view showing a laminated structure of the semiconductor light-emitting element.

FIG. 2 is a cross-sectional view showing a laminated structure of the semiconductor light-emitting element 1A. FIG. 2 is a sectional view showing a laminated structure of the semiconductor light-emitting element 1A. As shown in FIGS. 1 and 2, the semiconductor light-emitting element 1A includes the semiconductor substrate 10, a cladding layer 11 (first cladding layer) provided on the main surface 10a of the semiconductor substrate 10, an active layer 12 provided on the cladding layer 11, a cladding layer 13 (second cladding layer) provided on the active layer 12, and a contact layer 14 provided on the cladding layer 13. Furthermore, the semiconductor light-emitting element 1A includes a phase modulation layer 15, high refractive index layers 16 and 17, and a guide layer 18. Laser light is outputted from a back surface 10b of the semiconductor substrate 10.

The semiconductor substrate 10, the cladding layers 11 and 13, the active layer 12, the contact layer 14, the phase modulation layer 15, and the high refractive index layers 16 and 17 mainly contain nitride semiconductors. The energy band gap of the cladding layer 11 and the energy band gap of the cladding layer 13 are wider than the energy band gap of the active layer 12. The thickness directions of the semiconductor substrate 10, the cladding layers 11 and 13, the active layer 12, the contact layer 14, the phase modulation layer 15, and the high refractive index layers 16 and 17 coincide with the Z-axis direction.

If necessary, a light guide layer may be provided at least one of between the active layer 12 and the cladding layer 13 and between the active layer 12 and the cladding layer 11. When the light guide layer is provided between the active layer 12 and the cladding layer 13, the phase modulation layer 15 is provided between the cladding layer 13 and the light guide layer. The light guide layer may include a carrier barrier layer for efficiently confining carriers into the active layer 12. It is to be noted that regardless of this example, the light guide layer may be provided as appropriate between the cladding layers 11 and 13 in order to adjust the position of the electric field mode.

Figure 3:
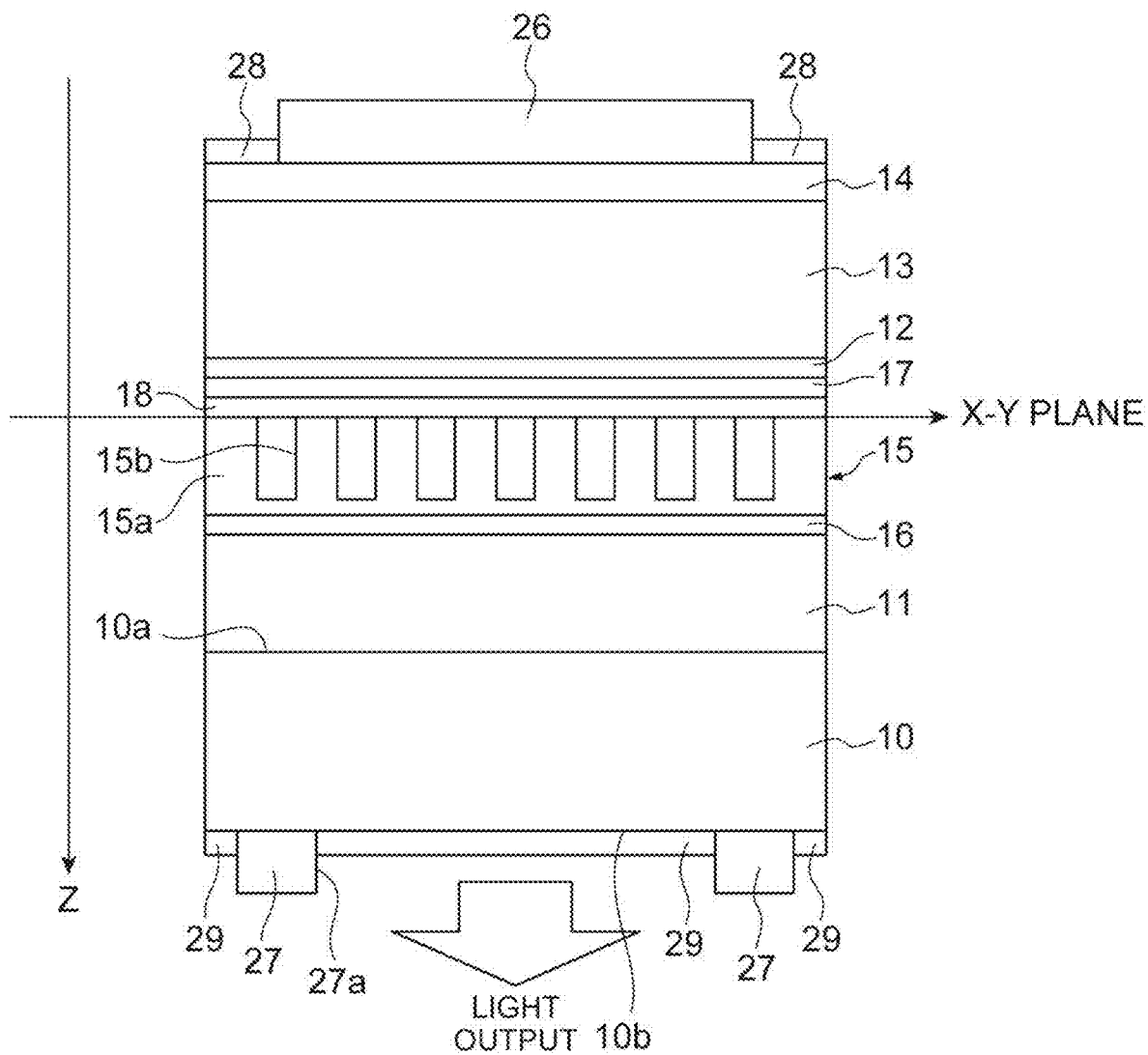
FIG. 3 is a diagram showing a laminated structure of the semiconductor light-emitting element when a phase modulation layer is provided between a lower cladding layer and an active layer.

In the examples shown in FIGS. 1 and 2, the phase modulation layer 15 is provided between the active layer 12 and the cladding layer 13, but as shown in FIG. 3, the phase modulation layer 15 may be provided between the cladding layer 11 and the active layer 12. Furthermore, when the light guide layer is provided between the active layer 12 and the cladding layer 11, the phase modulation layer 15 is provided between the cladding layer 11 and the light guide layer. The light guide layer may include a carrier barrier layer for efficiently confining carriers into the active layer 12. It is to be noted that regardless of this example, the light guide layer may be provided as appropriate between the cladding layers 11 and 13 in order to adjust the position of the electric field mode.

The phase modulation layer 15 includes a base layer 15a and a plurality of modified refractive index regions 15b. The base layer 15a is a semiconductor layer comprised of a first refractive index medium. Each of the plurality of modified refractive index regions 15b is comprised of a second refractive index medium having a refractive index different from that of the first refractive index medium, and exists in the base layer 15a. The guide layer 18 is a semiconductor layer covering the base layer 15a and the plurality of modified refractive index regions 15b. The refractive index of the guide layer 18 may be the same as that of the first refractive index medium, may be the same as that of the second refractive index medium, or may be different from that of both the first refractive index medium and the second refractive index medium. The plurality of modified refractive index regions 15b are two-dimensionally and periodically arrayed on a plane (on the X-Y plane) perpendicular to the thickness direction of the phase modulation layer 15. When the equivalent refractive index of the mode in the layer thickness direction is n, a wavelength $\lambda_0$ ($\lambda_0 = a \times n$, or $\lambda_0 = (2^{1/2}) a \times n$, where a is the lattice spacing) selected by the phase modulation layer 15 is included in the emission wavelength range of the active layer 12. The phase modulation layer 15 can select the wavelength 2% of the emission wavelengths of the active layer 12 and output it to the outside. In the laser light made incident into the phase modulation layer 15, a predetermined mode according to the arrangement of the modified refractive index region 15b is formed in the phase modulation layer 15. The laser light in which the predetermined mode is formed is emitted to the outside from the surface of the semiconductor light-emitting element 1A as a laser beam having a desired pattern. In the present embodiment, the wavelength $\lambda_0$ is in the range of, for example, 365 to 550 nm, and in one example, 405 nm.

The high refractive index layer 16 is provided between the active layer 12 and the phase modulation layer 15. The high refractive index layer 16 is provided in order to increase the optical confinement coefficient of the phase modulation layer 15 and has a refractive index higher than that of each of the cladding layers 11 and 13 and the phase modulation layer 15. The high refractive index layer 16 may be composed of a single semiconductor layer or may be composed of a plurality of semiconductor layers having compositions different from each other.

The high refractive index layer 17 is provided in a position between the cladding layer 11 and the cladding layer 13, and the position sandwiches the phase modulation layer 15 with the active layer 12. That is, in the example of FIG. 2, the high refractive index layer 17 is provided between the phase modulation layer 15 and the cladding layer 13. Also in the example of FIG. 3, the high refractive index layer 17 is provided between the phase modulation layer 15 and the cladding layer 13. The high refractive index layer 17 is provided together with the high refractive index layer 16 to increase the optical confinement coefficient of the phase modulation layer 15, and has a refractive index higher than that of each of the cladding layers 11 and 13 and the phase modulation layer 15. The high refractive index layer 17 may also be composed of a single semiconductor layer, similarly to the high refractive index layer 16, or may also be composed of a plurality of semiconductor layers having compositions different from each other.

The semiconductor light-emitting element 1A further includes an electrode 26 provided on the contact layer 14 and an electrode 27 provided on the back surface 10b of the semiconductor substrate 10. The electrode 26 is in ohmic contact with the contact layer 14, and the electrode 27 is in ohmic contact with the semiconductor substrate 10. The electrode 26 is provided in the center region of the contact layer 14. A portion of the contact layer 14 other than the electrode 26 is covered with a protective film 28. It is to be noted that the contact layer 14 not in contact with the electrode 26 may be removed. The electrode 27 has a planar shape such as a frame (annular) surrounding the output region of the laser light, and has an opening 27a. It is to be noted that the planar shape of the electrode 27 can be various shapes such as a rectangular frame shape and an annular shape. A portion (including inside the opening 27a) of the back surface 10b of the semiconductor substrate 10 other than the electrode 27 is covered with an antireflection film 29. The antireflection film 29 in a region other than the opening 27a may be removed.

When a driving current is supplied between the electrode 26 and the electrode 27, recombination of electrons and holes occurs in the active layer 12, and light is outputted from the active layer 12. The electrons and holes contributing to this light emission and the generated light are efficiently distributed between the cladding layer 11 and the cladding layer 13. The light outputted from the active layer 12 is distributed also inside the phase modulation layer 15 while being distributed between the cladding layer 11 and the cladding layer 13, and forms a predetermined mode corresponding to the lattice structure inside the phase modulation layer 15. The laser light emitted from the phase modulation layer 15 is directly outputted to the outside of the semiconductor light-emitting element 1A from the back surface 10b through the opening 27a. Alternatively, the laser light emitted from the phase modulation layer 15 is reflected by the electrode 26 and then outputted to the outside of the semiconductor light-emitting element 1A from the back surface 10b through the opening 27a. At this time, the zero-order light included in the laser light is emitted along the normal direction of the main surface 10a. On the other hand, the signal light included in the laser light is emitted along both the normal direction of the main surface 10a and the tilt direction intersecting with the normal direction. It is signal light that forms a desired two-dimensional optical image.

In a certain example, the semiconductor substrate 10 is a GaN substrate. The cladding layer 11, the active layer 12, the phase modulation layer 15, the cladding layer 13, and the contact layer 14 are each comprised of a nitride semiconductor. Specifically, the cladding layer 11 is a GaN layer or an AlGaN layer. The active layer 12 has a multiple quantum well structure (barrier layer: InGaN/quantum well layer: InGaN). The base layer 15a of the phase modulation layer 15 and the guide layer 18 are a GaN layer or an AlGaN layer. The modified refractive index region 15b is a hole. The cladding layer 13 is a GaN layer or an AlGaN layer. The contact layer 14 is a GaN layer. When the guide layer 18 is an AlGaN layer, change in the shape of the hole (modified refractive index region 15b) accompanying the regrowth of the guide layer 18 can be reduced.

Thus, when the cladding layers 11 and 13 and the base layer 15a are a GaN layer or an AlGaN layer, the entire high refractive index layers 16 and 17 or at least one of the two or more layers constituting the high refractive index layers 16 and 17 is a nitride semiconductor layer containing In (e.g., an InGaN layer) or an InAlGaN layer further containing Al. The band gap of the high refractive index layers 16 and 17 is wider than the band gap of the quantum well layer of the active layer 12. For example, when the quantum well layer is a nitride semiconductor layer containing In (e.g., an InGaN layer), the In composition of the high refractive index layers 16 and 17 is smaller than the In composition of the quantum well layer. When the cladding layers 11 and 13 and the base layer 15a are a GaN layer or an AlGaN layer, the In composition of the layer of the high refractive index layers 16 and 17 is, for example, 1% or more.

When the nitride semiconductor contains In, the energy band gap and the refractive index can be easily changed by changing the composition ratio of In. That is, in $In_xGa_{1-x}N$ or $In_xAl_yGa_{1-x-y}N$, the larger a composition ratio x of In becomes, the narrower the energy band gap becomes, and the larger the refractive index becomes. When the nitride semiconductor contains Al, the energy band gap and the refractive index can be easily changed by changing the composition ratio of Al. That is, in $Al_yGa_{1-y}N$ or $In_xAl_yGa_{1-x-y}N$, the larger a composition ratio y of Al becomes, the wider the energy band gap becomes, and the smaller the refractive index becomes. When the cladding layers 11 and 13 are an AlGaN layer, its Al composition ratio is, for example, 0 to 0.15, and in one example, 0.06. When the barrier layer of the active layer 12 is an InGaN layer, its In composition ratio is, for example, 0 to 0.2, and in one example, 0.01. When the quantum well layer of the active layer 12 is an InGaN layer, its In composition ratio is, for example, 0 to 0.2, and in one example, 0.10.

The conductivity type of the cladding layer 11 is the same as that of the semiconductor substrate 10. The conductive types of the cladding layer 13 and the contact layer 14 are opposite to that of the semiconductor substrate 10. In one example, the semiconductor substrate 10 and the cladding layer 11 have n-type, and the cladding layer 13 and the contact layer 14 have p-type. When the phase modulation layer 15 is provided between the active layer 12 and the cladding layer 11, the conductivity type of the phase modulation layer 15 is the same as that of the semiconductor substrate 10. When the phase modulation layer 15 is provided between the active layer 12 and the cladding layer 13, the conductivity type of the phase modulation layer 15 is opposite to that of the semiconductor substrate 10. It is to be noted that the impurity concentration is, for example, $1 \times 10^{16}$ to $1 \times 10^{21}/cm^3$. The active layer 12 is intrinsic (i-type) to which no impurity is intentionally doped, and the impurity concentration thereof is $1 \times 10^{16}/cm^3$ or less. The active layer 12 is not limited to be intrinsic (i-type) and may be doped. It is to be noted that the impurity concentration of the phase modulation layer 15 may be intrinsic (i-type) when it is necessary to suppress the effect of loss due to light absorption via the impurity level. When the high refractive index layers 16 and 17 are located on the cladding layer 11 side with respect to the active layer 12, the conductivity types of the high refractive index layers 16 and 17 are the same as that of the semiconductor substrate 10. When the high refractive index layers 16 and 17 are located on the cladding layer 13 side with respect to the active layer 12, the conductivity types of the high refractive index layers 16 and 17 are opposite to that of the semiconductor substrate 10. Alternatively, the high refractive index layers 16 and 17 may be undoped (i-type).

The thickness of the semiconductor substrate 10 is, for example, 150 µm. The thickness of the cladding layer 11 is, for example, 1200 nm. The thickness of the active layer 12 is, for example, 49 nm (when four barrier layers each having a thickness of 10 nm and three quantum well layers each having a thickness of 3 nm are alternately laminated). The thickness of the phase modulation layer 15 is, for example, 70 nm. The thickness of the cladding layer 13 is, for example, 500 nm. The thickness of the contact layer 14 is, for example, 100 nm. The thickness of the high refractive index layer 16 is, for example, 5 to 200 nm, and in one example, 40 nm (in case of In composition of 6%). The thickness of the high refractive index layer 17 is, for example, 5 to 200 nm, and in one example, 20 nm (in case of In composition of 6%).

It is to be noted that in the structure described above, the modified refractive index region 15b is a hole, but, in the modified refractive index region 15b, a semiconductor having a refractive index different from that of the base layer 15a may be embedded into the hole. In that case, for example, a hole in the base layer 15a may be formed by etching, and a semiconductor may be embedded in the hole by using the metal organic chemical vapor deposition method, the molecular beam epitaxy method, the sputtering method, or the epitaxial method. For example, when the base layer 15a is comprised of GaN, the modified refractive index region 15b may be comprised of AlGaN. After the modified refractive index region 15b is formed by embedding the semiconductor into the hole of the base layer 15a, the identical semiconductor to that of the modified refractive index region 15b may be further deposited thereon as the guide layer 18. It is to be noted that when the modified refractive index region 15b is a hole, an inert gas such as argon and nitrogen, or a gas such as hydrogen and air may be sealed in the hole.

The antireflection film 29 is comprised of, for example, a dielectric single layer film such as silicon nitride (e.g., SiN) or silicon oxide (e.g., $SiO_2$), or a dielectric multilayer film. As the dielectric multilayer film, for example, a film in which two or more types of dielectric layers selected from a group of dielectric layers such as titanium oxide ($TiO_2$), silicon dioxide ($SiO_2$), silicon monoxide (SiO), niobium oxide ($Nb_2O_5$), tantalum pentoxide ($Ta_2O_5$), magnesium fluoride ($MgF_2$), titanium oxide ($TiO_2$), aluminum oxide ($Al_2O_3$), cerium oxide ($CeO_2$), indium oxide ($In_2O_3$), and zirconium oxide ($ZrO_2$) are laminated can be used. For example, in the case of a single-layer dielectric film, a film having a thickness of $\lambda/4$ of an optical film thickness for light having a wavelength $\lambda$ is laminated. The protective film 28 is an insulation film such as silicon nitride (e.g., SiN) or silicon oxide (e.g., $SiO_2$). The electrode 26 has a laminated structure of Ti and Al, for example. The electrode 27 has a laminated structure of Ni and Au, for example. It is to be noted that the materials of the electrodes 26 and 27 are only required to realize ohmic coupling and not limited to these ranges.

Figure 4:
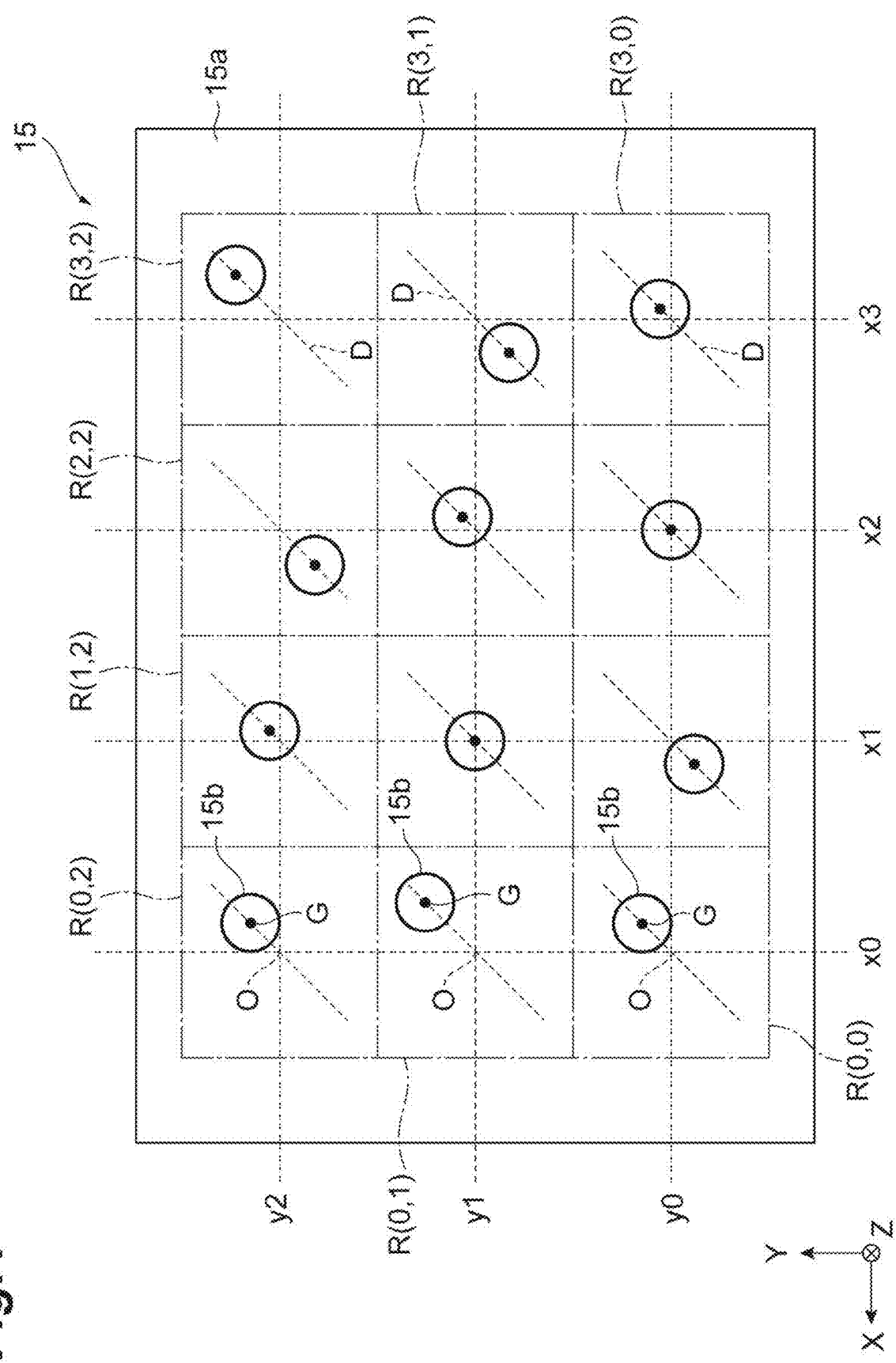
FIG. 4 is a plan view of the phase modulation layer.

The internal configuration of the phase modulation layer 15A will now be described in more detail. FIG. 4 is a plan view of the phase modulation layer 15A. As shown in FIG. 4, a virtual square lattice is set on a design plane (reference plane) of the phase modulation layer 15A coincident with the X-Y plane. It is assumed that one side of the square lattice is parallel with the X-axis and the other side is parallel with the Y-axis. At this time, a square-shaped unit constituent region R centered on a lattice point O of the square lattice can be two-dimensionally set over a plurality of columns along the X-axis and a plurality of rows along the Y-axis. The plurality of modified refractive index regions 15b are provided in each unit constituent region R on at least a one-by-one basis. The planar shape of each modified refractive index region 15b is circular, for example. In each unit constituent region R, the lattice point O may be located outside the modified refractive index region 15b, or may be included inside the modified refractive index region 15b.

Specifically, in FIG. 4, broken lines indicated by x0 to x3 indicate center positions in the unit constituent region R in the X-axis direction, and broken lines indicated by y0 to y2 indicate center positions in the unit constituent region R in the Y-axis direction. Therefore, the intersections of the broken lines x0 to x3 and the broken lines y0 to y2 indicate the respective centers O (0, 0) to O (3, 2) of the unit constituent regions R (0, 0) to R (3, 2), that is, the lattice points. The lattice constant of this virtual square lattice is a. It is to be noted that the lattice constant a is adjusted according to the emission wavelength.

The ratio of an area S of the modified refractive index region 15b in one unit constituent region R is referred to as a filling factor (FF). When the lattice spacing of the square lattice is a, the filling factor FF of the modified refractive index region 15b is given as $S/a^2$. S is the sum of the areas of N modified refractive index regions 15b in one unit constituent region R, and for example, in the case where the shapes of the N modified refractive index regions 15b are a perfect circular shape having diameters equal to one another, S is given as $S = N \times \pi (d/2)^2$ by using a diameter d of the perfect circle. When the shapes of the N modified refractive index regions 15b are squares equal in size to one another, S is given as $S = N \times LA^2$ by using a length LA of one side of the square.

Figure 5:
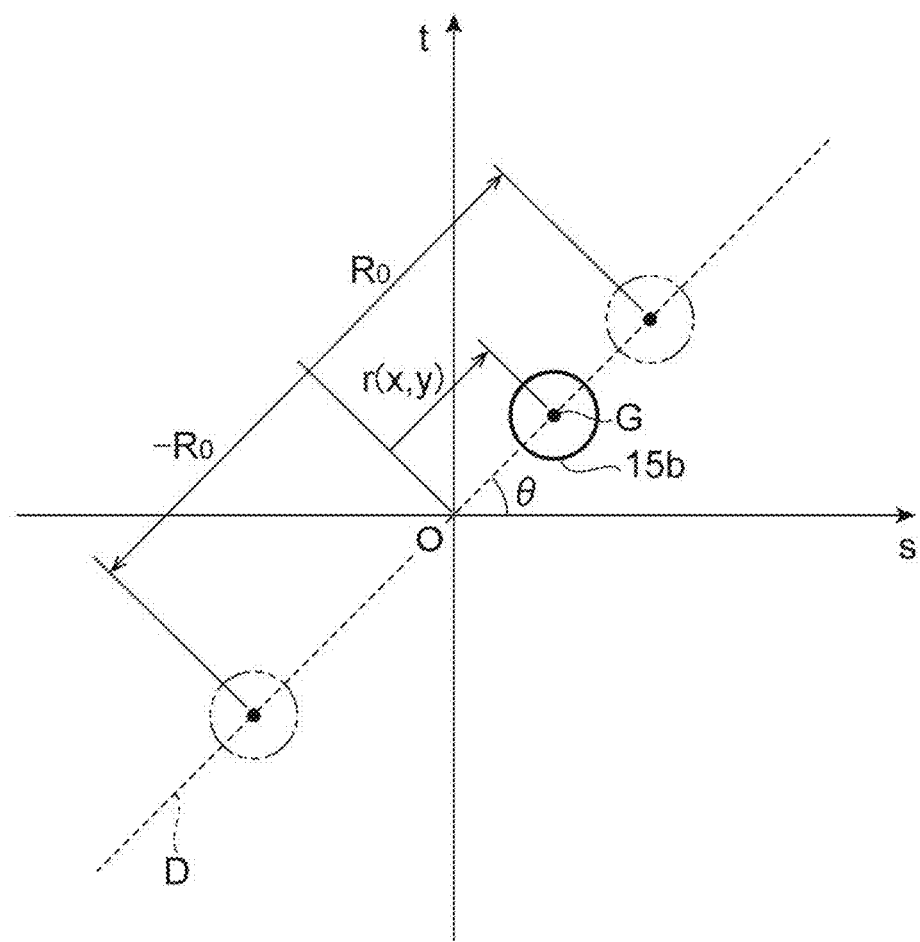
FIG. 5 is a diagram showing a positional relationship of a modified refractive index region in the phase modulation layer.

FIG. 5 is a diagram showing the positional relationship of the modified refractive index region 15b in the phase modulation layer 15. As shown in FIG. 5, the center of gravity G of each modified refractive index region 15b is arranged on the straight line D. The straight line D is a straight line passing through the corresponding lattice point O of each unit constituent region R and tilted with respect to each side of the square lattice. In other words, the straight line D is a straight line tilted with respect to both the s-axis and the t-axis having the lattice point O as the origin. It is to be noted that the s-axis is an axis parallel to the X-axis, and the t-axis is an axis parallel to the Y-axis. The s-axis and t-axis define the position in the unit constituent region R. The tilt angle of the straight line D with respect to one side of the square lattice (substantially, the s-axis positive direction) is θ. The tilt angle θ is constant in the phase modulation layer 15. The tilt angle θ satisfies 0°<θ<90°, and θ=45° in one example. Alternatively, the tilt angle θ satisfies 180°<θ<270°, and θ=225° in one example. When the tilt angle θ satisfies 0°<θ<90° or 180°<θ<270°, the straight line D extends from the first quadrant to the third quadrant of the coordinate plane defined by the s-axis and the t-axis. Alternatively, the tilt angle θ satisfies 90°<θ<180°, and θ=135° in one example. Alternatively, the tilt angle θ satisfies 270°<θ<360°, and θ=315° in one example. When the tilt angle θ satisfies 90°<θ<180° or 270°<θ<360°, the line D extends from the second quadrant to the fourth quadrant of the coordinate plane defined by the s-axis and the t-axis. Thus, the tilt angle θ is an angle excluding 0°, 90°, 180°, and 270°. Here, let the distance (line segment length) between the lattice point O and the center of gravity G be r (x, y). x denotes the position of the x-th lattice point on the X-axis and y denotes the position of the y-th lattice point on the Y-axis. When the distance r (x, y) is a positive value, the center of gravity G is located in the first quadrant (or the second quadrant). When the distance r (x, y) is a negative value, the center of gravity G is located in the third quadrant (or the fourth quadrant). When the distance r (x, y) is 0, the lattice point O and the center of gravity G coincide with each other.

The distance r (x, y) shown in FIG. 4 between the center of gravity G of each modified refractive index region and the corresponding lattice point O of each unit constituent region R, is set individually to each modified refractive index region 15b according to the desired optical image. The distribution of the distance r (x, y) has a specific value for each position determined by the values of x and y, but is not necessarily represented by a specific function. The distribution of the distance r (x, y) is determined from a complex amplitude distribution obtained by inverse Fourier transform of the desired optical image, from which the phase distribution is extracted. That is, as shown in FIG. 5, the distance r (x, y) is set to 0 when the phase P (x, y) in an arbitrary unit constituent region R (x, y) is $P_0$, the distance r (x, y) is set to the maximum value $R_0$ when the phase P (x, y) is $\pi + P_0$, and the distance r (x, y) is set to the minimum value $-R_0$ when the phase P (x, y) is $-\pi + P_0$. Then, for an intermediate phase P (x, y), the distance r (x, y) is set so that r (x, y)={P (x, y)−P$_0$}×R$_0$/π is true. Here, the initial phase P$_0$ can be set arbitrarily. Assuming that the lattice spacing of the square lattice is a, the maximum value R$_0$ of r (x, y) falls within the range of, for example, $$0 \leq R_0 \leq \frac{a}{\sqrt{2}} \tag{1}$$

It is to be noted that when the complex amplitude distribution is obtained from the desired optical image, the reproducibility of the beam pattern is improved by applying a repetition algorithm such as the Gerchberg-Saxton (GS) method commonly used at the time of calculation of hologram generation.

Figure 6:
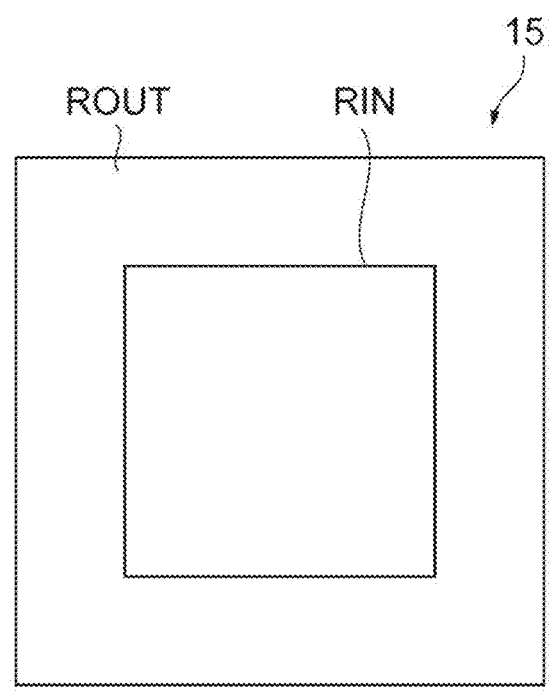
FIG. 6 is a plan view showing an example in which a refractive index substantially periodic structure is applied only in a specific region of the phase modulation layer.

FIG. 6 is a plan view showing an example in which a refractive index substantially periodic structure of FIG. 4 is applied only in a specific region of the phase modulation layer. In the example shown in FIG. 6, a substantially periodic structure (e.g.: structure of FIG. 4) for emitting a target beam pattern is formed inside an inner region RIN of the square. On the other hand, in an outer region ROUT surrounding the inner region RIN, a perfect circular modified refractive index region whose center of gravity coincides with the lattice point position of the square lattice is arranged. In the inner region RIN and the outer region ROUT, the lattice spacings of the virtually set square lattices are identical (=a). In the case of this structure, the light is distributed also in the outer region ROUT, it is hence possible to suppress the occurrence of high-frequency noise (so-called window function noise) caused by a sudden change in the light intensity at the periphery of the inner region RIN. In addition, light leakage in the in-plane direction can be suppressed, and a reduction in threshold current can be expected.

Figure 7:
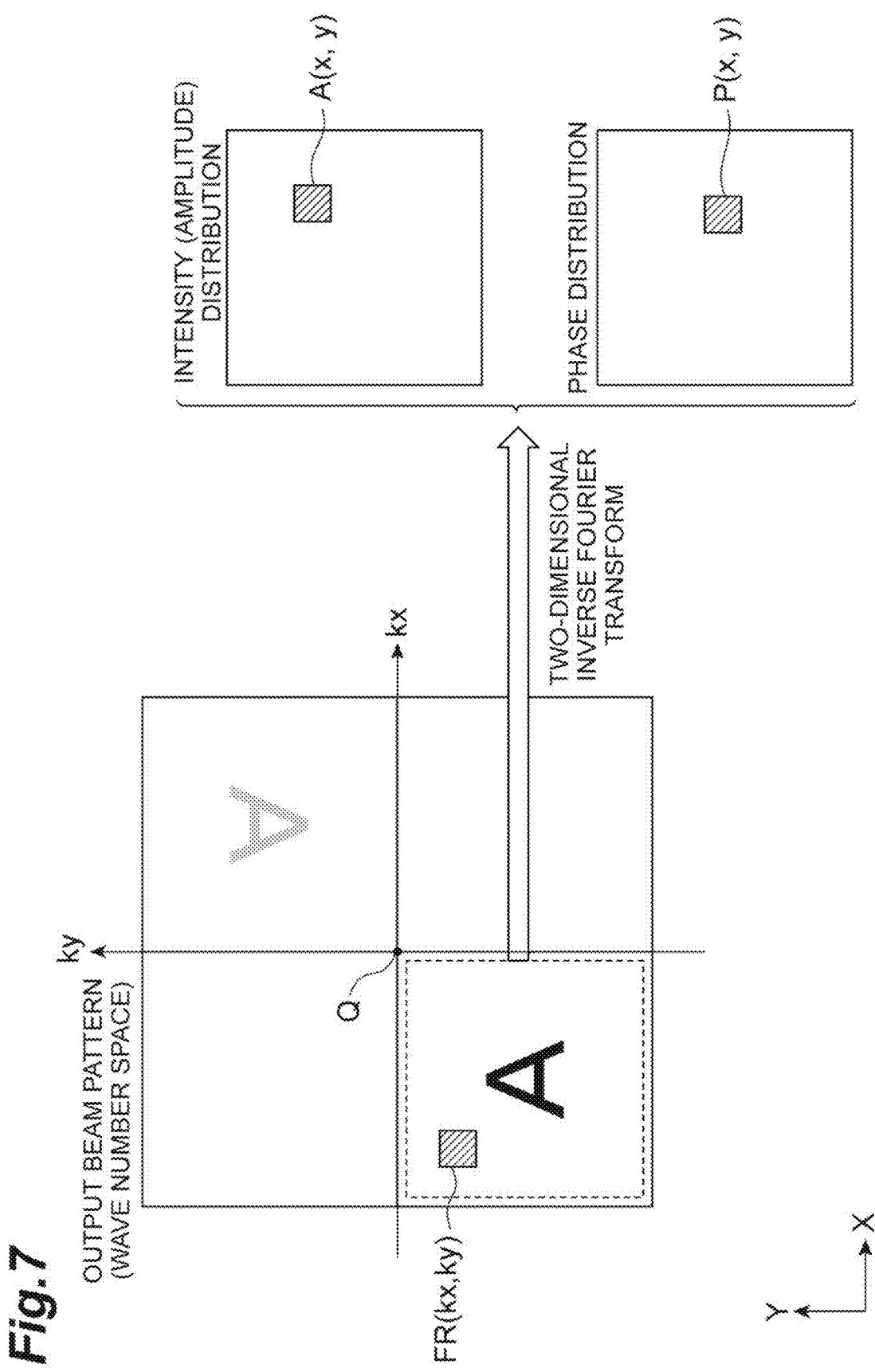
FIG. 7 is a diagram for explaining the relationship between an optical image obtained by forming an output beam pattern of the semiconductor light-emitting element and a distance distribution in the phase modulation layer.

FIG. 7 is a diagram for explaining the relationship between an optical image obtained as an output beam pattern of the semiconductor light-emitting element 1A and a phase distribution P (x, y) in the phase modulation layer 15. It is to be noted that a center Q of the output beam pattern (wave number space defined by a kx-axis and a ky-axis) is located on an axis perpendicular to the main surface 10a of the semiconductor substrate 10, and FIG. 7 shows four quadrants with the center Q as the origin. As an example, FIG. 7 shows a case in which optical images are obtained in the first quadrant and the third quadrant, but images can be obtained in the second quadrant and the fourth quadrant or all the quadrants. In the present embodiment, as shown in FIG. 7, an optical image that is point symmetric with respect to the origin is obtained. FIG. 7 shows, as an example, a case where the character "A" is obtained as the first positive order diffracted light in the third quadrant and a pattern with the character "A" rotated by 180° is obtained as the first negative order diffracted light in the first quadrant. It is to be noted that in the case of a rotationally symmetric optical image having the center Q as the origin (e.g., cross, circle, double circle, and so on), they are observed as one optical image where they overlap.

The optical image obtained by forming the output beam pattern of the semiconductor light-emitting element 1A includes at least one of a spot, a straight line, a cross, a line drawing, a lattice pattern, a photograph, a stripe pattern, computer graphics (CG), and a character. Here, in order to obtain a desired optical image, the distribution of the distance r (x, y) of the modified refractive index region 15b of the phase modulation layer 15 is determined by the following procedure.

Figure 8:
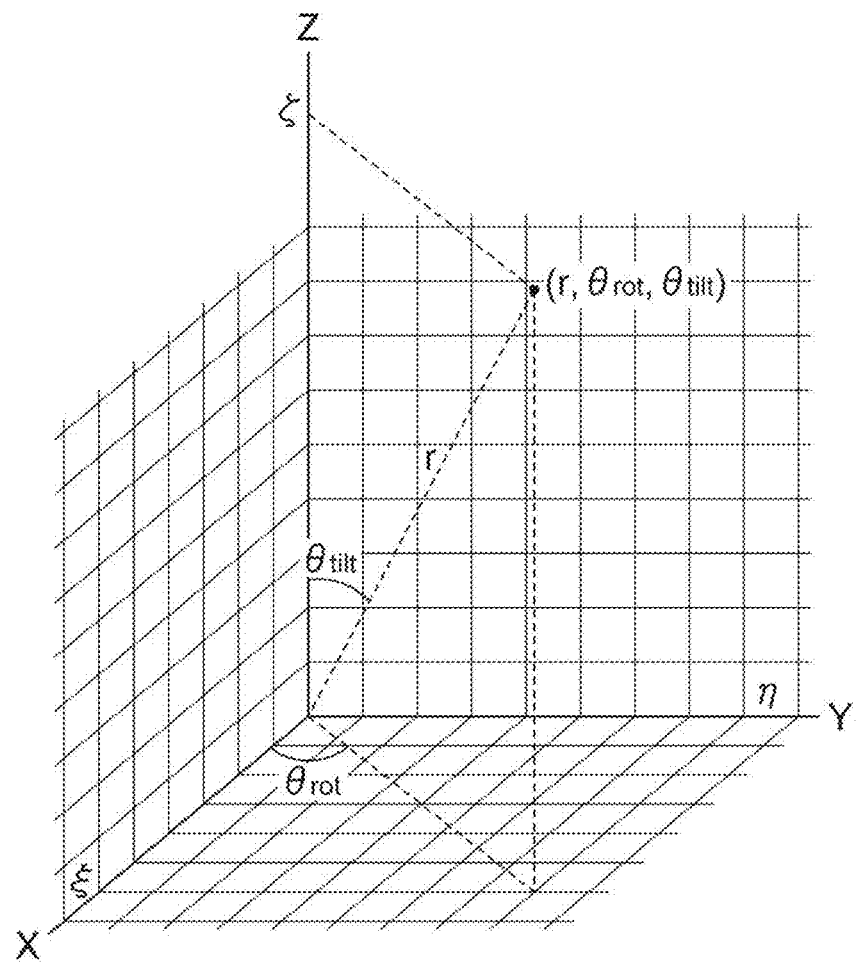
FIG. 8 is a diagram for explaining coordinate transformation from spherical coordinates to coordinates in an XYZ orthogonal coordinate system.

First, as a first precondition, in the XYZ orthogonal coordinate system, a virtual square lattice composed of M1 (integer of 1 or more)×N1 (integer of 1 or more) unit constituent regions R each having a square shape is set on the X-Y plane. Next, as a second precondition, it is assumed that coordinates (ξ, η, ζ) in the XYZ orthogonal coordinate system satisfy the relationship shown by the following Formulas (2) to (4) with respect to spherical coordinates (r, θ$_{rot}$, θ$_{tilt}$) defined by a moving radius length r, a tilt angle θ$_{tilt}$ from the Z-axis, and a rotation angle θ$_{rot}$ from the X-axis specified on the X-Y plane, as shown in FIG. 8. It is to be noted that FIG. 8 is a diagram for explaining coordinate transformation from the spherical coordinates (r, θ$_{rot}$, θ$_{tilt}$) to the coordinates (ξ, η, ζ) in the XYZ orthogonal coordinate system, in which the coordinates (ξ, η, ζ) express a design optical image on a predetermined plane set in the XYZ orthogonal coordinate system that is a real space. When the beam pattern corresponding to the optical image outputted from the semiconductor light-emitting element is a set of bright spots oriented to the direction defined by the angles θ$_{tilt}$ and θ$_{rot}$, the angles θ$_{tilt}$ and θ$_{rot}$ are assumed to be converted into the coordinate value k$_x$ on the Kx-axis, which is a normalized wave number defined by the following Formula (5) and corresponds to the X-axis, and the coordinate value k$_y$ on the Ky-axis, which is a normalized wave number defined by the following Formula (6), corresponds to the Y-axis, and is orthogonal to the Kx-axis. The normalized wave number means a wave number normalized with the wave number corresponding to the lattice spacing of a virtual square lattice being 1.0. At this time, in the wave number space defined by the Kx-axis and the Ky-axis, a specific wave number range including the beam pattern corresponding to an optical image is constituted of M2 (integer of 1 or more)×N2 (integer of 1 or more) image regions FR each having a square shape. It is to be noted that the integer M2 does not necessarily coincide with the integer M1. Similarly, the integer N2 also does not necessarily coincide with the integer N1. Formulas (5) and (6) are disclosed in the above-mentioned Non-Patent Document 1, for example.

$$\xi = r\sin\theta_{tilt}\cos\theta_{rot} \tag{2}$$

$$\eta = r\sin\theta_{tilt}\sin\theta_{rot} \tag{3}$$

$$\zeta = r\cos\theta_{tilt} \tag{4}$$

$$k_x = \frac{a}{\lambda}\sin\theta_{tilt}\cos\theta_{rot} \tag{5}$$

$$k_y = \frac{a}{\lambda}\sin\theta_{tilt}\sin\theta_{rot} \tag{6}$$

a: Lattice constant of virtual square lattice
λ: Oscillation wavelength

As a third precondition, a complex amplitude F (x, y) obtained by subjecting each of the image regions FR (k$_x$, k$_y$) specified by a coordinate component k$_x$ (integer of 0 or more and M2-1 or less) in the Kx-axis direction and a coordinate component k$_y$ (integer of 0 or more and N2-1 or less) in the Ky-axis direction in the wave number space to the two-dimensional inverse discrete Fourier transform into the unit constituent region R (x, y) on the X-Y plane specified by the coordinate component x in the X-axis direction and the coordinate component y in the Y-axis direction is given by the following Formula (7), with j being an imaginary unit. When the amplitude term is A (x, y) and the phase term is P (x, y), the complex amplitude F (x, y) is defined by the following Formula (8). Furthermore, as a fourth precondition, the unit constituent region R (x, y) is defined by the s-axis and the t-axis, which are parallel to the X-axis and the Y-axis, respectively, and orthogonal to each other at the lattice point O (x, y) serving as the center of the unit constituent region R (x, y).

$$F(x, y) = \sum_{k_x=0}^{M2-1} \sum_{k_y=0}^{N2-1} FR(k_x, k_y) \exp\left[j2\pi\left(\frac{k_x}{M2}x + \frac{k_y}{N2}y\right)\right] \quad (7)$$

$$F(x, y) = A(x, y) \times \exp[jP(x, y)] \quad (8)$$

Under the above first to fourth preconditions, the phase modulation layer 15 is configured to satisfy the following conditions. That is, the corresponding modified refractive index region 15b is arranged in the unit constituent regions R (x, y) so that the distance r (x, y) from the lattice point O (x, y) to the center of gravity G of the corresponding modified refractive index region 15b satisfies the following relationship.

$$r(x,y) = C \times (P(x,y) - P_0)$$

C: Proportional constant, e.g., $R_0/\pi$ $P_0$: Arbitrary constant, e.g., 0. That is, the distance r (x, y) is set to 0 when the phase P (x, y) in certain coordinates (x, y) is $P_0$, is set to the maximum value $R_0$ when the phase P (x, y) is $\pi + P_0$, and is set to the minimum value $-R_0$ when the phase P (x, y) is $-\pi T + P_0$. When it is desired to obtain a desired optical image, it is preferable that the optical image is subjected to inverse discrete Fourier transform and the distribution of the distance r (x, y) corresponding to the phase P (x, y) of its complex amplitude is given to the plurality of modified refractive index regions 15b. The phase P (x, y) and the distance r (x, y) may be proportional to each other.

It is to be noted that a far-field image of the laser beam can have various shapes such as a single or a plurality of spot shapes, an annular shape, a linear shape, a character shape, a double annular shape, or a Laguerre-Gaussian beam shape. Since the beam direction can also be controlled, a laser processing machine that electrically performs, for example, high-speed scanning can be realized by arraying the semiconductor light-emitting elements 1A one-dimensionally or two-dimensionally. It is to be noted that the beam pattern is represented by angle information in the far field, and hence, in the case of a bit map image or the like in which the target beam pattern is represented by two-dimensional position information, it is preferable to convert it to angle information once and then convert it to the wave number space, after that perform Fourier transform.

As a method of obtaining the intensity distribution and the phase distribution from the complex amplitude distribution obtained by the inverse Fourier transform, for example, an intensity (amplitude) distribution A (x, y) can be calculated by using the abs function of "MATLAB", numerical analysis software of Math Works, Inc., and the phase distribution P (x, y) can be calculated by using the angle function of MATLAB.

Here, points of attention will be given regarding a case where a general discrete Fourier transform (or fast Fourier transform) is used for calculation when the phase distribution P (x, y) is obtained from the inverse Fourier transform result of the optical image and the distance r (x, y) of each modified refractive index region 15b is determined. An output beam pattern calculated from the complex amplitude distribution obtained by the inverse Fourier transform of FIG. 9A, which is a desired optical image becomes as shown in FIG. 9B. That is, in FIG. 9B, in the first quadrant of the beam pattern, a pattern in which the pattern obtained by rotating the pattern in the first quadrant in FIG. 9A by 180 degrees and the pattern in the third quadrant in FIG. 9A are superimposed appears. In the second quadrant of the beam pattern, a pattern in which the pattern obtained by rotating the pattern in the second quadrant in FIG. 9A by 180 degrees and the pattern in the fourth quadrant in FIG. 9A are superimposed appears. In the third quadrant of the beam pattern, a pattern in which the pattern obtained by rotating the pattern in the third quadrant in FIG. 9A by 180 degrees and the pattern in the first quadrant in FIG. 9A are superimposed appears. In the fourth quadrant of the beam pattern, a pattern in which the pattern obtained by rotating the pattern in the fourth quadrant in FIG. 9A by 180 degrees and the pattern in the second quadrant in FIG. 9A are superimposed appears. At this time, the pattern rotated by 180 degrees is a pattern by the −1 order light component.

Therefore, when an optical image having a value only in the first quadrant is used as an optical image (original optical image) before the Fourier transform, the first quadrant of the original optical image appears in the third quadrant of the resulting beam pattern, and a pattern in which the first quadrant of the original optical image is rotated by 180 degrees appears in the first quadrant of the resulting beam pattern.

It is to be noted that, if the structure described above is configured to include the active layer 12 and the phase modulation layer 15, the material system, the film thickness, and the structure of the layer can be variously changed. Here, the scaling law holds for so-called square lattice photonic crystal laser when the perturbation from the virtual square lattice is 0. That is, when the wavelength becomes a constant a times, a similar standing wave state can be obtained by multiplying the entire square lattice structure by a times. Similarly, also in the present embodiment, the structure of the phase modulation layer 15 can be determined by the scaling law according to the wavelength. Therefore, by using the active layer 12 that emits light such as blue, green, and red and applying the scaling law according to the wavelength, it is also possible to realize the semiconductor light-emitting element 1A that outputs visible light.

When the semiconductor light-emitting element 1A is produced, each compound semiconductor layer is formed using the metal organic chemical vapor deposition (MOCVD) method or the molecular beam epitaxy (MBE) method. In production of the semiconductor light-emitting element 1A using AlGaN, the growth temperature of AlGaN is 950 to 1200° C. In an experiment, the growth temperature is 1000 to 1050° C. TMA (trimethylaluminum) is adopted as an Al raw material during growth, TMG (trimethylgallium) and TEG (triethylgallium) are adopted as a gallium raw material, $NH_3$ (ammonia) is adopted as an N raw material, $SiH_4$ (monosilane) and $CH_3SiN_3$ (monomethylsilane) are adopted as raw materials for n-type impurities, and $Cp_2Mg$ (bis (cyclopentadienyl) magnesium) is adopted as a raw material for p-type impurities. In the growth of GaN, TMG, TEG, and ammonia are used, but TMA is not used. InGaN is produced using TMG, TEG, TMI (trimethylindium), and ammonia. The insulation film is formed by sputtering the target using the constituent material as a raw material or by the plasma CVD (PCVD) method.

That is, in the semiconductor light-emitting element 1A described above, first, an AlGaN layer (n-type cladding layer 11), an InGaN/InGaN multiple quantum well structure (active layer 12), an InGaN layer (high refractive index layer 16), and a GaN layer (base layer 15a of the phase modulation layer 15) are sequentially epitaxially grown on a GaN substrate (n-type semiconductor substrate 10) by using the metal organic chemical vapor deposition (MOCVD) method.

Next, another resist is applied to the base layer 15a, and a two-dimensional fine pattern is drawn on the resist by an electron beam drawing apparatus with the alignment mark as a reference. The two-dimensional fine pattern is formed on the resist by developing the resist. Thereafter, using the resist as a mask, the two-dimensional fine pattern is transferred onto the base layer 15a by dry etching. By this transfer, after the hole is formed, the resist is removed. It is to be noted that after formation of the SiN layer or the $SiO_2$ layer onto the base layer 15a by the PCVD method (before resist formation), formation of a resist mask, and transfer of the fine pattern to the SiN layer or the $SiO_2$ layer by reactive ion etching (RIE) are sequentially performed, the resist may be removed before performing dry etching. In this case, resistance to dry etching can be increased. The depth of the hole is 70 nm, for example, and the interval between the holes is 160 nm, for example. These holes are used as the modified refractive index region 15b, or a compound semiconductor (AlGaN) to become the modified refractive index region 15b is regrown in these holes to the depth of the hole or more. In the case where the hole is the modified refractive index region 15b, a gas such as air, nitrogen, and argon may be sealed in the hole. Next, the AlGaN layer (cladding layer 13) and the GaN layer (contact layer 14) are sequentially formed by the MOCVD. Thereafter, the electrodes 26 and 27 are formed by the vapor deposition method or the sputtering method. If necessary, the protective film 28 and the antireflection film 29 are formed by the sputtering, the PCVD method, or the like.

It is to be noted that when the phase modulation layer 15 is provided between the active layer 12 and the cladding layer 11, the high refractive index layer 16 and the phase modulation layer 15 are only required to be formed on the cladding layer 11 before the active layer 12 is formed. The lattice spacing a of the virtual square lattice is about the wavelength divided by the equivalent refractive index, and the equivalent refractive index becomes about 2.5 at a wavelength of 405 nm, for example. Therefore, the lattice spacing a is set to about 160 nm when a Γ point is used for the band edge, and the lattice spacing a is set to about 115 nm when an M point is used for the band edge. When the M point is used for the band edge, the output beam cannot be obtained in the thickness direction as it is, and hence the output beam can be extracted to the outside by adding a phase shift $d\Psi(x, y)=(\pm\pi x/a, \pm\pi y/a)$ to a phase distribution $\Psi(x, y)$. The zero-order light can be removed by using the M point.

It is to be noted that in the case of the square lattice having the lattice spacing a, let unit vectors of the orthogonal coordinates be x and y, basic translation vectors are $a_1=ax$ and $a_2=ay$ and basic reciprocal lattice vectors are $b_1=(2\pi/a)x$ and $b_2=(2\pi/a)y$ with respect to the translation vectors $a_1$ and $a_2$. When the wave number vector of a wave existing in the lattice is $k=nb_1+mb_2$ (where n and m are any integers), a wave number k exists at the Γ point, and particularly when the magnitude of the wave number vector is equal to the magnitude of the fundamental reciprocal lattice vector, a resonance mode (standing wave in the X-Y plane) in which the lattice spacing a is equal to the wavelength λ is obtained. In the present embodiment, oscillation in such a resonance mode (standing wave state) is obtained. At this time, considering a TE mode in which an electric field exists in a plane parallel to the square lattice, four modes exist, in terms of the symmetry of the square lattice, in the standing wave state in which the lattice spacing and the wavelength are thus equal. In the present embodiment, a desired beam pattern can be similarly obtained in a case of oscillating in any of the four modes of the standing wave state.

It is to be noted that the standing wave in the phase modulation layer 15 described above is scattered by the hole shape, and the wavefront obtained in the direction perpendicular to the plane is phase-modulated, and thus the desired beam pattern is obtained. This beam pattern is not only a pair of unimodal beams (spots), but also able to be a character shape, two or more identical shape spot groups, or a vector beam having a spatially non-uniform phase and intensity distribution, as described above.

It is to be noted that in the case of the wavelength 405 nm band, the refractive index of the base layer 15a is preferably 2.4 to 2.6, and the refractive index of the modified refractive index region 15b is preferably 1.0 to 2.5. The diameter of each modified refractive index region 15b in the hole of the base layer 15a is, for example, 70 nm in the case of the 405 nm band, and is, for example, 80 nm in the case of the 450 nm band. The diffraction intensity to the Z-axis direction is changed by changing the size of each modified refractive index region 15b. This diffraction efficiency is proportional to an optical coupling coefficient kl expressed by a first-order coefficient when the shape of the modified refractive index region 15b is Fourier-transformed. The optical coupling coefficient is described in the above-mentioned Non-Patent Document 2, for example. The interval between the modified refractive index regions 15b is, for example, 160 nm in the case of the 405 nm band, and is, for example, 183 nm in the case of the 450 nm band.

The effects obtained by the light-emitting element 1A of the present embodiment including the above configuration will be described. Conventionally, as a semiconductor light-emitting element, a light-emitting element has been known in which the center of gravity G of each modified refractive index region 15b has a rotation angle according to an optical image around each corresponding lattice point O of a virtual square lattice (see Patent Document 1, for example). However, if it is possible to realize a new light-emitting element in which the positional relationship between the center of gravity G of each modified refractive index region 15b and each lattice point O is different from that of the conventional light-emitting element, the range of design of the phase modulation layer 15 is widened, which is extremely useful.

In the semiconductor light-emitting element 1A of the present embodiment, the phase modulation layer 15 optically coupled to the active layer 12 has the base layer 15a and the plurality of modified refractive index regions 15b having a refractive index different from that of the base layer 15a. The center of gravity G of each modified refractive index region 15b is arranged on the straight line D passing through the corresponding lattice point O of the virtual square lattice and tilted with respect to the X-axis and the Y-axis. Then, the distance r (x, y) between the center of gravity G of each modified refractive index region 15b and the corresponding lattice point O is individually set according to the optical image. In such a case, the phase of the beam changes according to the distance between the lattice point O and the center of gravity G. That is, only by changing the position of the center of gravity G (distance from the corresponding lattice point O), the phase of the beam emitted from each modified refractive index region 15b can be controlled, and the beam pattern formed as a whole can be formed into a desired shape. That is, the semiconductor light-emitting element 1A is an S-iPM laser, and according to such a structure, similarly to the conventional structure in which the center of gravity G of each modified refractive index region 15b has a rotation angle corresponding to the optical image around each lattice point O, it is possible to output light that forms an optical image of any shape along a tilt direction intersecting with the normal direction of the main surface 10a of the semiconductor substrate 10. As described above, according to the present embodiment, it is possible to provide the semiconductor light-emitting element 1A in which the positional relationship between the center of gravity G of each modified refractive index region 15b and each lattice point O is totally different from that in the conventional one.

Here, FIG. 10A shows an example of a beam pattern (optical image) outputted from the semiconductor light-emitting element 1A. The center of FIG. 10A corresponds to an axis intersecting with the light-emitting surface of the semiconductor light-emitting element 1A and perpendicular to the light-emitting surface. FIG. 10B shows a graph showing a light intensity distribution in a cross section including the axis. FIG. 10B is a graph in which the counts in the vertical direction of image data of 1344 dots×1024 dots are integrated and plotted in a far-field image acquired using an FFP optical system (A3267-12 produced by Hamamatsu Photonics), a camera (ORCA-05G produced by Hamamatsu Photonics), and a beam profiler (Lepas-12 produced by Hamamatsu Photonics). It is to be noted that the maximum count number of FIG. 10A is normalized with 255, and a central zero-order light B0 is saturated in order to clearly indicate the intensity ratio of the beam in the symmetric direction with respect to the direction perpendicular to the light-emitting surface (normal direction of the light-emitting surface). It is easily understood from FIG. 10B that there is an intensity difference between the beams in the symmetric directions. FIG. 11A is a diagram showing a phase distribution corresponding to the beam pattern shown in FIG. 10A. FIG. 11B is a partially enlarged view of FIG. 11A. In FIGS. 11A and 11B, the phase at each position in the phase modulation layer 15 is indicated by shading, where the darker a portion is, the more the phase angle approaches 0°, and the brighter a portion is, the more the phase angle approaches 360°. However, since the center value of the phase angle can be set arbitrarily, the phase angle may not necessarily be set within the range of 0° to 360°. As shown in FIGS. 10A and 10B, the semiconductor light-emitting element 1A outputs a beam including a first optical image portion B1 outputted in a first direction tilted with respect to the axis perpendicular to the light-emitting surface, and a beam including a second optical image portion B2 outputted in a second direction symmetrical with the first direction with respect to the axis and rotationally symmetrical with the first optical image portion B1 with respect to the axis. Typically, the first optical image portion B1 appears in the first quadrant in the X-Y plane and the second optical image portion B2 appears in the third quadrant in the X-Y plane. The optical image portion B1 becomes in a state where the +1 order light in two directions (corresponding to traveling waves AL and AD in FIG. 12) of the four fundamental waves forming a standing wave and the −1 order light in another two directions (corresponding to traveling waves AU and AR in FIG. 12) of the four fundamental waves are mixed, and inversely, the optical image portion B2 becomes in a state where the +1 order light in two directions (corresponding to the traveling waves AU and AR in FIG. 12) different from B1 of the four fundamental waves forming the standing wave and the −1 order light in another two directions (corresponding to the traveling waves AL and AD in FIG. 12) of the four fundamental waves are mixed. Since a difference is generally caused among the magnitudes of the four fundamental waves, the light intensity ratio of the optical image portions B1 and B2 becomes asymmetric. Some applications do not require beams of symmetric components. In such a case, it is desirable in principle to give a difference between the light quantity of the −1 order light and the light quantity of the +1 order light in the four fundamental waves.

Figure 12:
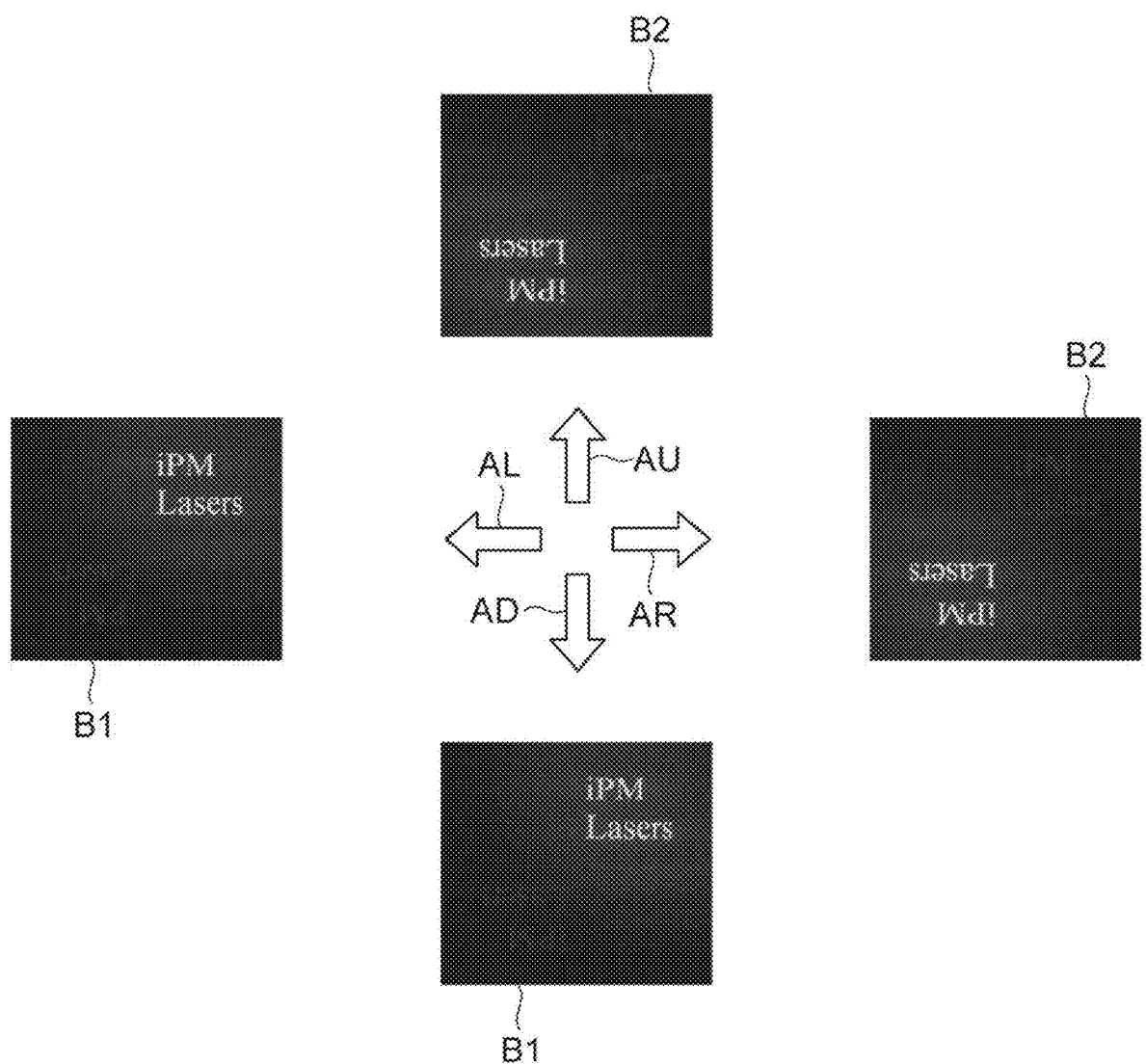
FIG. 12 is a diagram conceptually showing an example of a beam pattern of a traveling wave in each direction. In this example, the tilt angle of a straight line D with respect to the X-axis and the Y-axis is 45°.

FIG. 12 is a diagram conceptually showing an example of a beam pattern of a traveling wave in each direction. In this example, the tilt angle of a straight line D with respect to the X-axis and the Y-axis is 45°. In the phase modulation layer of a square lattice S-iPM laser, the fundamental traveling waves AU, AD, AR, and AL along the X-Y plane are generated. The traveling waves AU and AD are light traveling along a side extending in the Y-axis direction of each side of the square lattice. The traveling wave AU travels in the Y-axis positive direction, and the traveling wave AD travels in the Y-axis negative direction. The traveling waves AR and AL are light traveling along a side extending in the X-axis direction of each side of the square lattice. The traveling wave AR travels in the X-axis positive direction and the traveling wave AL travels in the X-axis negative direction. In this case, from the traveling waves traveling in opposite orientations to each other, beam patterns in opposite orientations are obtained respectively. For example, a beam pattern including only the second optical image portion B2 is obtained from the traveling wave AU, and a beam pattern including only the first optical image portion B1 is obtained from the traveling wave AD. Similarly, a beam pattern including only the second optical image portion B2 is obtained from the traveling wave AR, and a beam pattern including only the first optical image portion B1 is obtained from the traveling wave AL. In other words, one of the traveling waves traveling in opposite orientations becomes the +1 order light and the other of them becomes the −1 order light. The beam pattern outputted from the semiconductor light-emitting element 1A is an overlap of these beam patterns.

According to an examination by the inventor, a conventional semiconductor light-emitting element in which a modified refractive index region is rotated around a lattice point always includes both traveling waves traveling in opposite orientations to each other, due to the nature of the arrangement of the modified refractive index region. That is, in the conventional method, in any of the four traveling waves AU, AD, AR, and AL forming a standing wave, the +1 order light and the −1 order light appear in the same quantity, and furthermore, the zero-order light is generated depending on the radius (distance between the center of gravity of the modified refractive index region and the lattice point) of the rotation circle. Therefore, it is difficult in principle to give a difference between the +1 order light and each light quantity of the +1 order light, and it is difficult to selectively reduce one of them. Therefore, it is difficult to relatively reduce the light quantity of the −1 order light with respect to the light quantity of the +1 order light.

Here, the reason for the difficulty in selectively reducing any of the +1 order light and the −1 order light in the conventional method in which the modified refractive index region 15b is rotated around the lattice point O shown in FIG. 13A will be explained. It is to be noted that in FIG. 13A, the coordinates of the unit constituent region R (x, y) are defined by the s-axis (axis parallel to the X-axis) and the t-axis (axis parallel to the Y-axis) with the lattice point O (x, y) as the origin. It is considered the traveling wave AU in the positive orientation of the t-axis (Y-axis) shown in FIG. 13B as an example of the four traveling waves with respect to the design phase φ (x, y) at a certain position. At this time, due to the geometrical relationship, the deviation from the lattice point O (x, y) becomes r·sin φ (x, y) with respect to the traveling wave AU, and hence the phase difference becomes a relationship of (2π/a)r·sin φ (x, y). As a result, the phase distribution Φ (x, y) related to the traveling wave AU is given by Φ (x, y)=exp {j(2π/a)r·sin φ (x, y)} when the influence of the size of the modified refractive index region 15b is so small that it is negligible. The contribution of the phase distribution Φ (x, y) to the zero-order light and the ±1 order light is given by the components of n=0 and n=±1 when expanded by exp {jnΦ (x, y)} (n: integer). Use of the mathematical formula expressed by the following Formula (9) regarding the Bessel function of the first kind Jn (z) of the order n allows the phase distribution @ (x, y) to be expanded in a series, and each light quantity of the zero-order light and the +1 order light to be explained.

$$e^{jz\sin\phi} = \sum_{n=-\infty}^{\infty} J_n(z) \cdot e^{jn\phi} \qquad (9)$$

At this time, the zero-order light component of the phase distribution Φ (x, y) is expressed as $J_0$ (2πr/a), the +1 order light component is expressed as $J_1$ (2πr/a), and the −1 order light component is expressed as $J_{-1}$ (2πr/a). Since the Bessel function of the first positive/negative order has a relationship of $J_1$ (x)=−$J_{-1}$ (x), the magnitudes of the ±1 order light components become equal. Here, the traveling wave AU in the t-axis positive direction has been considered as one example of the four traveling waves, but the similar relationship is established for the other three waves (traveling waves AD, AR, and AL), and the magnitudes of the ±1 order light components become equal. From the above discussion, with the conventional method in which the modified refractive index region 15b is rotated around the lattice point O, it is difficult in principle to give a difference to the light quantity of the ±1 order light component.

On the other hand, according to the phase modulation layer 15 of the present embodiment, for a single traveling wave, a difference occurs between the +1 order light and each light quantity of the +1 order light, and when the tilt angle θ is, for example, 45°, 135°, 225°, or 315°, the more the shift amount $R_0$ approaches the upper limit value of Formula (9) described above, the more an ideal phase distribution can be obtained. As a result, the zero-order light is reduced, and one of the +1 order light and the −1 order light is selectively reduced in each of the traveling waves AU, AD, AR, and AL. Therefore, it is possible in principle to give a difference in the light quantities of the +1 order light and the first negative order light by selectively reducing one of the traveling waves traveling in opposite orientations to each other.

Here, the reason why it is possible to selectively reduce any of the +1 order light and the −1 order light with the method of the present embodiment in which the modified refractive index region 15b moves on the straight line D passing through the lattice point O (intersection of the s-axis and the t-axis) and tilted with respect to the square lattice shown in FIG. 14A will be explained. It is considered the traveling wave AU in the positive orientation of the t-axis (Y-axis) shown in FIG. 14B as an example of the four traveling waves with respect to the design phase φ (x, y) at a certain position. At this time, due to the geometrical relationship, the deviation from the lattice point O becomes r·sin θ·{φ(x, y)−φ$_0$}/π with respect to the traveling wave AU, and hence the phase difference becomes a relationship of (2π/a)r·sin θ·{φ(x, y)−φ$_0$}/T. Here, for simplicity, the tilt angle θ=45° and the phase angle φ$_0$=0°. At this time, the phase distribution Φ (x, y) related to the traveling wave AU is given by the following Formula (10) when the influence of the size of the modified refractive index region 15b is so small that it is negligible.

$$\Phi(x, y) = \exp\left\{j\left(\frac{\sqrt{2}\,r}{a}\right)\phi(x, y)\right\} \qquad (10)$$

The contribution of the phase distribution Φ (x, y) to the zero-order light and the ±1 order light is given by the components of n=0 and n=±1 when expanded by exp {nΦ (x, y)} (n: integer). When a function f(z) expressed by the following Formula (11) is expanded in Laurent series (where Formula (12) is satisfied), the following Formula (13) is established.

$$f(z) = z^c \qquad (11)$$

$$0 < |c| < 1$$

where, $$c = \frac{\sqrt{2}\,r}{a}$$

$$z = \exp\{j\phi(x, y)\} \qquad (12)$$

$$z^c = \sum_{n=-\infty}^{\infty} e^{j\pi(c-n)} \cdot \operatorname{sinc}[\pi(c-n)] \cdot z^n \qquad (13)$$

here, sinc (x)=(sin (x))/x. Use of the Formula (13) described above allows the phase distribution Φ (x, y) to be expanded in a series, and each light quantity of the zero-order light and the +1 order light to be explained. At this time, noting that the absolute value of the exponential term exp {jπ (c−n)} of the above Formula (13) is 1, the magnitude of the zero order optical component of the phase distribution Φ (x, y) is expressed by the following Formula (14).

$$\operatorname{sinc}\left(\frac{\sqrt{2}\,\pi r}{a}\right) \qquad (14)$$

The magnitude of the +1 order light component is expressed by the following Formula (15).

$$\operatorname{sinc}\cdot\pi\left(-1 + \frac{\sqrt{2}\,r}{a}\right) \qquad (15)$$

The magnitude of the −1 order light component is expressed by the following Formula (16).

$$\operatorname{sinc}\cdot\pi\left(1+\frac{\sqrt{2}\,r}{a}\right) \quad (16)$$

Then, in the above Formulas (14) to (16), the zero-order light component and −1 order light component appear in addition to the +1 order light component, except for the case defined by the following Formula (17). However, the magnitudes of the ±1 order light components ado not become equal to each other.

$$r=\frac{a}{\sqrt{2}} \quad (17)$$

In the above description, the traveling wave AU in the Y-axis positive direction has been considered as one example of the four traveling waves, but the similar relationship is established for the other three waves (traveling waves AD, AR, and AL), and a difference occurs in the magnitudes of ±1 order light components. From the above discussion, according to the method of the present embodiment in which the modified refractive index region 15b moves on the straight line D passing through the lattice point O and tilted from the square lattice, it is possible in principle to give a difference in the light quantities of the ±1 order light components. Therefore, it becomes possible in principle to selectively extract only the desired optical image (the first optical image portion B1 or the second optical image portion B2) by reducing the +1 order light or the −1 order light. Also in FIG. 10B described above, since a difference occurs in intensity between the +1 order light and the −1 order light in the four traveling waves, the intensity ratio of the beam in the symmetric direction becomes asymmetric with respect to the direction perpendicular to the light-emitting surface.

As in the present embodiment, the tilt angle θ of the straight line D with respect to the square lattice may be constant in the phase modulation layer 15. This makes it possible to easily design the arrangement of the center of gravity G of the modified refractive index region 15b. In this case, the tilt angle θ may be 45°, 135°, 225°, or 315°. Thus, four fundamental waves traveling along the square lattice (in FIG. 14A, light traveling in the s-axis (X-axis) positive direction, light traveling in the s-axis negative direction, light traveling in the t-axis (Y-axis) positive direction, and light traveling in the t-axis negative direction) can equally contribute to the optical image. Furthermore, when the tilt angle θ is 45°, 135°, 225°, or 315°, by selecting an appropriate band edge mode, the directions of the electromagnetic fields on the straight line D are aligned in one direction, and hence linearly polarized light can be obtained. Examples of such a mode include modes A and B shown in FIG. 3 of the above-mentioned Non-Patent Document 3. It is to be noted that when the tilt angle θ is 0°, 90°, 180°, or 270°, a pair of traveling waves traveling in the Y-axis direction or the X-axis direction among the four traveling waves AU, AD, AR, and AL do not contribute to the first-order light (signal light), and hence it is difficult to improve the efficiency of the signal light.

As in the present embodiment, the light-emitting portion may be the active layer 12 provided on the semiconductor substrate 10. This allows the light-emitting portion and the phase modulation layer 15 to be optically coupled with ease.

Figure 15:
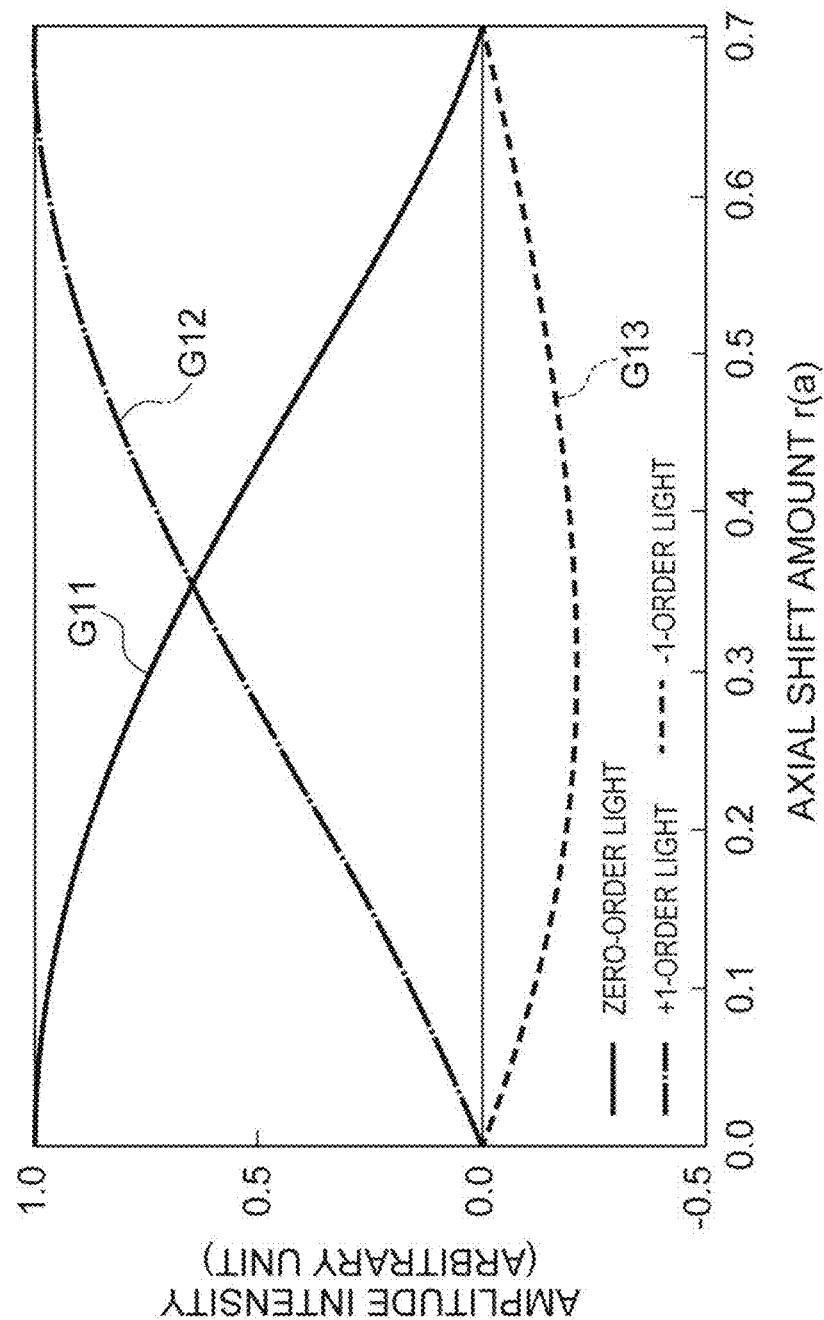
FIG. 15 is a graph showing the relationship between amplitudes of the zero-order light, the −1 order light, and the +1 order light and a value $R_0$.
Figure 16:
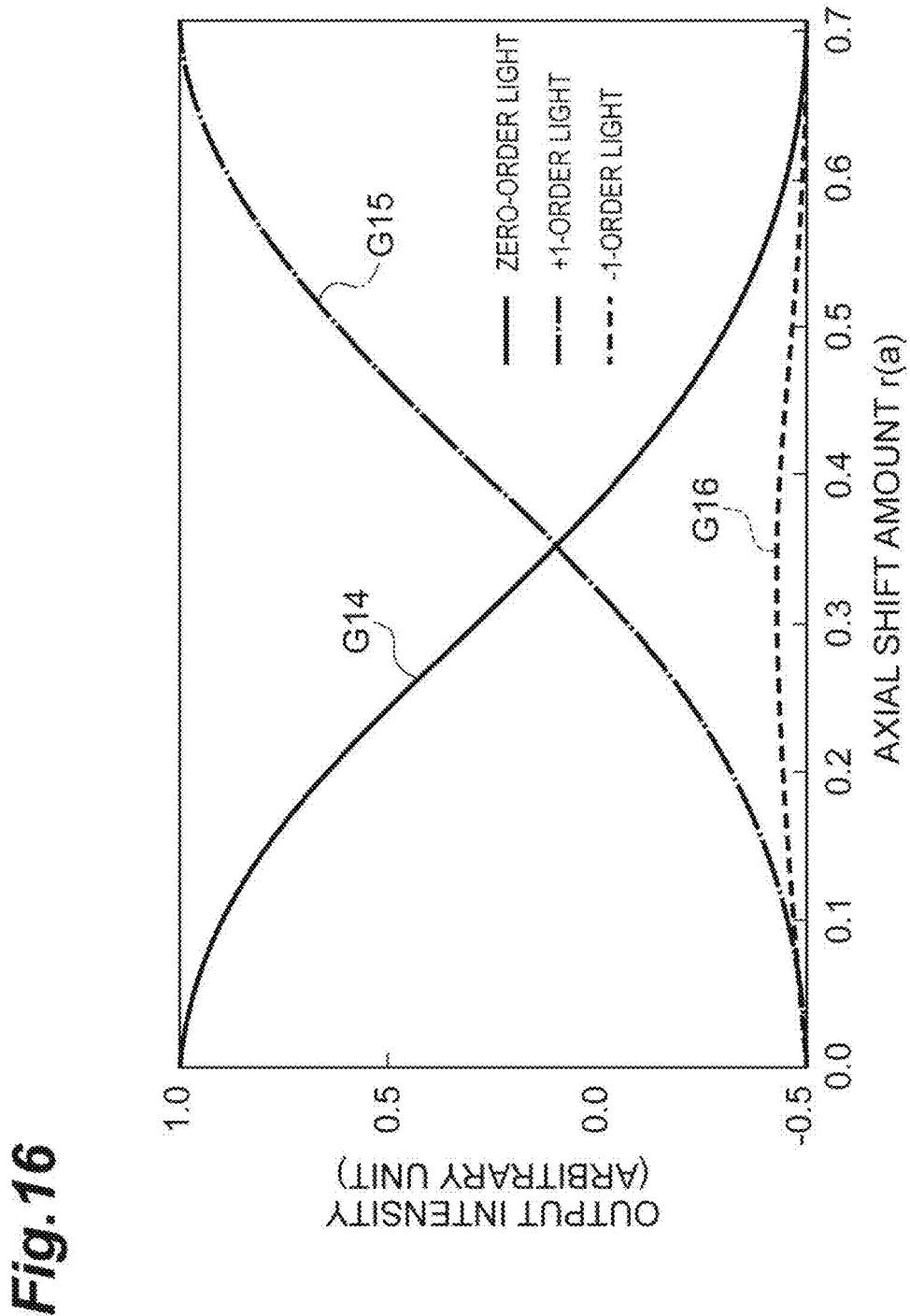
FIG. 16 is a graph showing the relationship between the light intensities of the zero-order light, the −1 order light, and the +1 order light and a value $R_0$.
Figure 17:
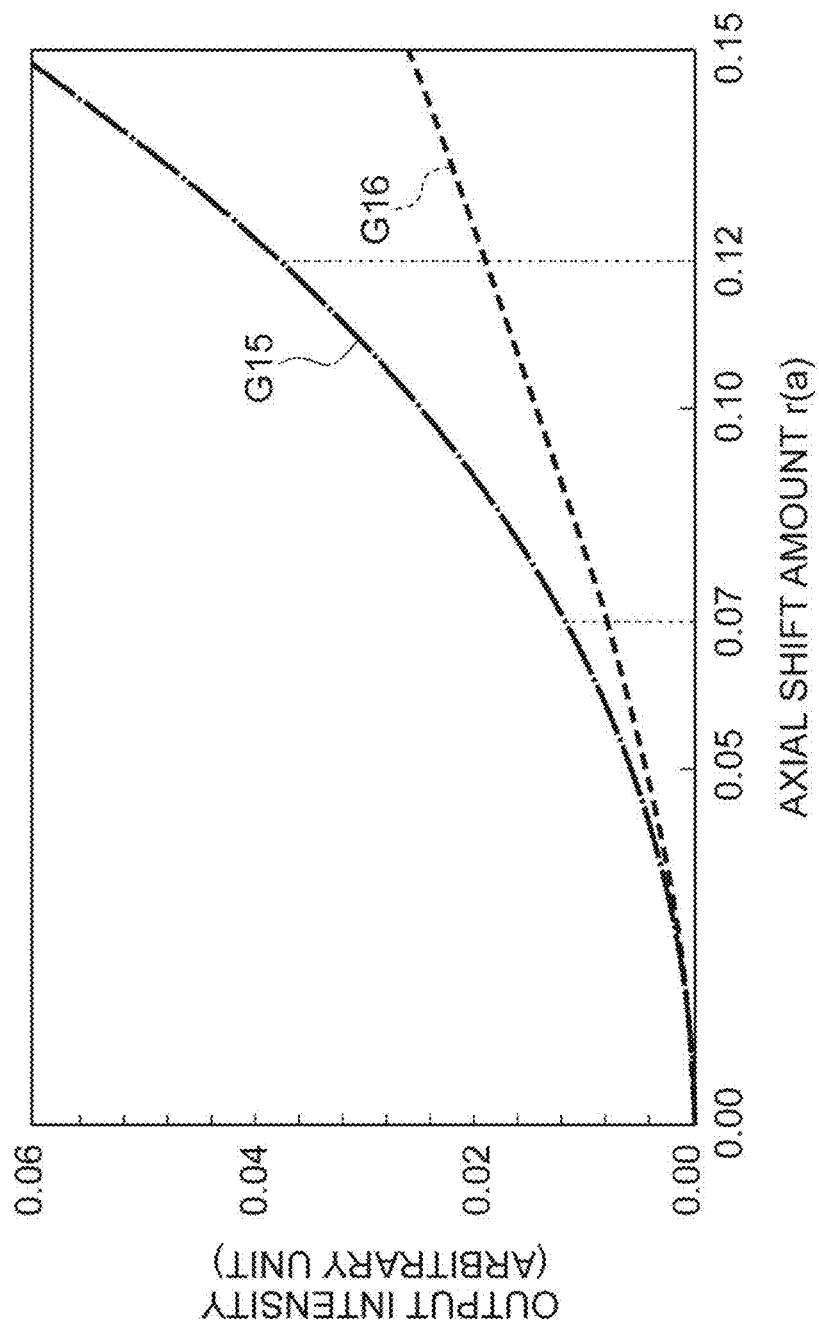
FIG. 17 is a graph showing a part of FIG. 16 in an enlarged manner.
Figure 18:
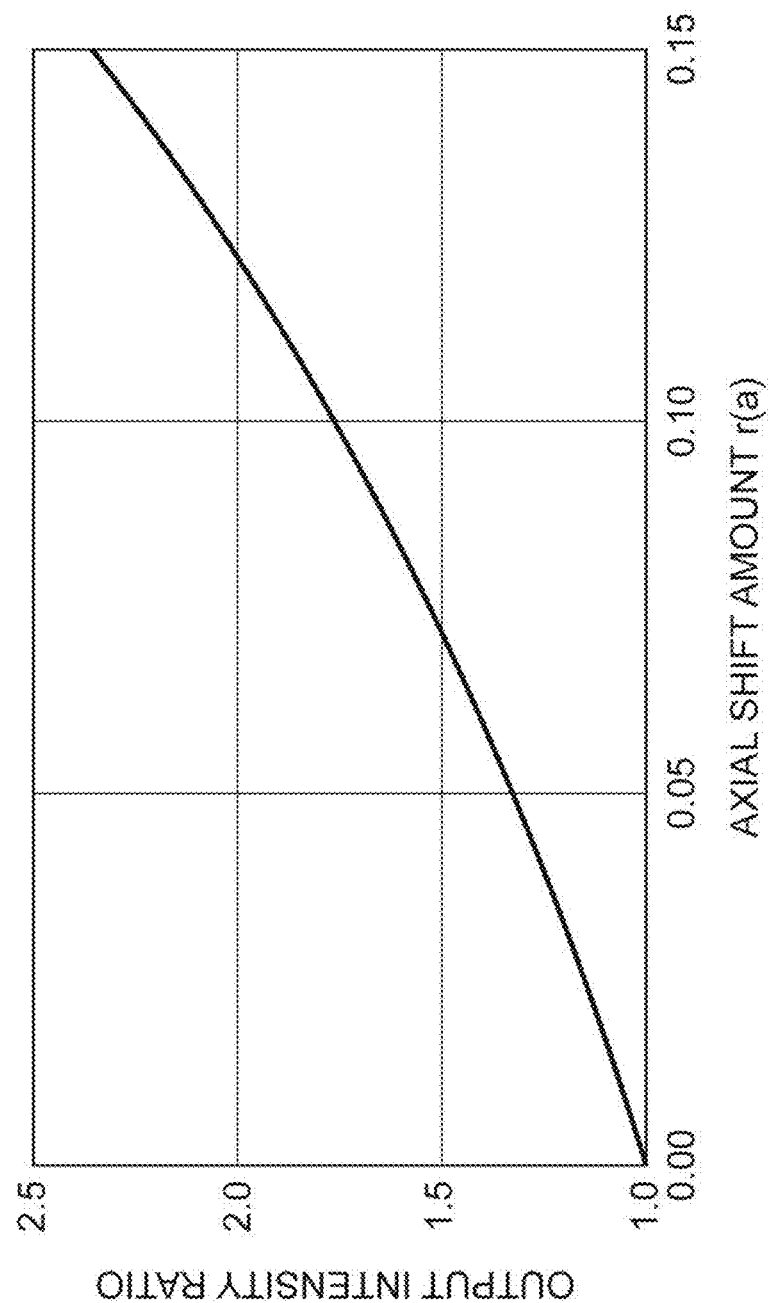
FIG. 18 is a graph showing the relationship between a ratio ($I_1/I_{-1}$) between a light intensity $I_{-1}$ of the −1 order light and a light intensity $I_1$ of the +1 order light and the value $R_0$.

Here, a preferred range of the maximum value $R_0$ and the minimum value $-R_0$ of the distance r (x, y) between the center of gravity G of each modified refractive index region and the corresponding lattice point O of each unit constituent region R will be examined. As described above, the amplitudes of the zero-order light, the −1 order light, and the +1 order light of a single fundamental plane wave are expressed by the above Formulas (14) to (16). FIG. 15 is a graph showing the above Formulas (14) to (16), and shows the relationship between the amplitudes of the zero-order light, the −1 order light, and the +1 order light and a value $R_0$. It is to be noted that in FIG. 15, the vertical axis represents the amplitude (arbitrary unit), and the horizontal axis represents the ratio of the value $R_0$ to the lattice spacing a. A graph G11 shows the amplitude of the zero-order light, a graph G12 shows the amplitude of the +1 order light, and a graph G13 shows the amplitude of the −1 order light. The intensity of the light is proportional to the square of the amplitude of the light. Therefore, the relationship between the light intensity of the zero-order light, the −1 order light, and the +1 order light and the value $R_0$ becomes as shown in FIG. 16. In FIG. 16, the vertical axis represents the light intensity (arbitrary unit), and the horizontal axis represents the ratio of the value $R_0$ to the lattice spacing a. A graph G14 shows the light intensity of the zero-order light, a graph G15 shows the light intensity of the +1 order light, and a graph G16 shows the light intensity of the −1 order light. FIG. 17 is a graph showing a part of FIG. 16 in an enlarged manner, and FIG. 18 is a graph showing the relationship between a ratio ($I_1/I_{-1}$) between a light intensity $I_{-1}$ of the −1 order light and a light intensity $I_1$ of the +1 order light and the value $R_0$.

Referring to FIGS. 16 and 17, in the range where $R_0$ is greater than 0.07a, the +1 order light is stronger than the −1 order light by 1.5 times or more. In the range where $R_0$ is greater than 0.12a, the f+1 order light is stronger than the −1 order light by 2 times or more. Furthermore, $R_0$=0.30a is the inflection point of the light intensity of the −1 order light. Therefore, when $R_0$ exceeds 0.30a, the greater $R_0$ becomes, the less the light intensity of the −1 order light becomes, and the more the light intensity of the +1 order light becomes. Hence, in the range of $R_0$>0.30a, the greater $R_0$ becomes, the more the ratio ($I_1/I_{-1}$) rises. Thus, $R_0$ may be greater than 0.07a, may be greater than 0.12a, or may be greater than 0.30a.

It is to be noted that the graphs shown in FIGS. 15 to 18 show general properties of the diffracted light of the traveling wave AU described above, and do not depend on a specific material system, hole structure, and the like. As a specific example other than the nitride-based, an example of a case where the semiconductor light-emitting element 1A is comprised of a GaAs-based compound semiconductor (emission wavelength 940 nm band) is shown. Assuming a case where the planar shape of the modified refractive index region 15b is circular, the tilt angle θ of the straight line D is 45°, and the filling factor FF is about 15%, and let the lattice spacing a be 280 nm, 0.07a becomes about 19.6 nm, and 0.12a becomes about 33.6 nm.

In the semiconductor light-emitting element including a phase modulation layer, it is required to increase the optical confinement coefficient in the phase modulation layer in order to minimize the threshold current as much as possible. In the case of a semiconductor light-emitting element in an infrared region (0.9 to 1.1 μm) mainly containing a GaAs-based semiconductor, for example, the optical confinement coefficient of the phase modulation layer is 20% or more, and a relatively good threshold current value is obtained.

However, in the case of a semiconductor light-emitting element in the ultraviolet region to the blue region mainly containing a nitride semiconductor such as GaN, if the layer structure is the same as that of an element mainly containing a GaAs-based semiconductor, the optical confinement coefficient of the phase modulation layer 15 remains about 2 to 3% due to the characteristics of the material (Because it is a strain-based material, the difference in refractive index is difficult to obtain, and because it has a short wavelength, the refractive index itself of the material is low).

For such a problem, the semiconductor light-emitting element 1A of the present embodiment includes the high refractive index layers 16 and 17 having a refractive index higher than that of the cladding layer 11, the cladding layer 13, and the phase modulation layer 15. The high refractive index layers 16 and 17 are arranged between the cladding layer 11 and the cladding layer 13 and in the vicinity of the phase modulation layer 15. Specifically, the high refractive index layers 16 and 17 are arranged at positions where the phase modulation layer 15 is sandwiched between the high refractive index layers and the active layer 12, and between the active layer 12 and the phase modulation layer 15, respectively. The high refractive index layers 16 and 17 have an optical confinement coefficient larger than that of the surrounding layers (the cladding layer 11, the cladding layer 13, and the phase modulation layer 15). Therefore, the optical confinement coefficient of the phase modulation layer 15 located in the vicinity of the high refractive index layers 16 and 17 also becomes large under the influence thereof. Therefore, according to the semiconductor light-emitting element 1A of the present embodiment, the optical confinement coefficient of the phase modulation layer 15 can be effectively increased. Therefore, in the GaN-based iPM laser element in the wavelength band from ultraviolet to blue, it is possible to increase the optical confinement coefficient to the phase modulation layer, and it is possible to obtain a practical light-emitting element capable of reducing the threshold current value and continuously oscillating.

As in the present embodiment, the cladding layer 11, the cladding layer 13, and the base layer 15a may be a GaN layer or an AlGaN layer, and the high refractive index layers 16 and 17 may be nitride semiconductor layers containing In. In this case, it is possible to preferably realize the high refractive index layers 16 and 17 having a refractive index higher than that of the cladding layer 11, the cladding layer 13, and the phase modulation layer 15. The high refractive index layers 16 and 17 may further contain Al. The larger the Al composition becomes, the lower the refractive index of the high refractive index layers 16 and 17 becomes, but the band gap becomes wider and the light transmittivity can be enhanced. Since the high refractive index layers 16 and 17 include the Al composition, change of the lattice constant from the GaN base layer due to the inclusion of the In composition is relaxed, and distortion of the output beam can be suppressed.

(First Variation)

Figure 19:
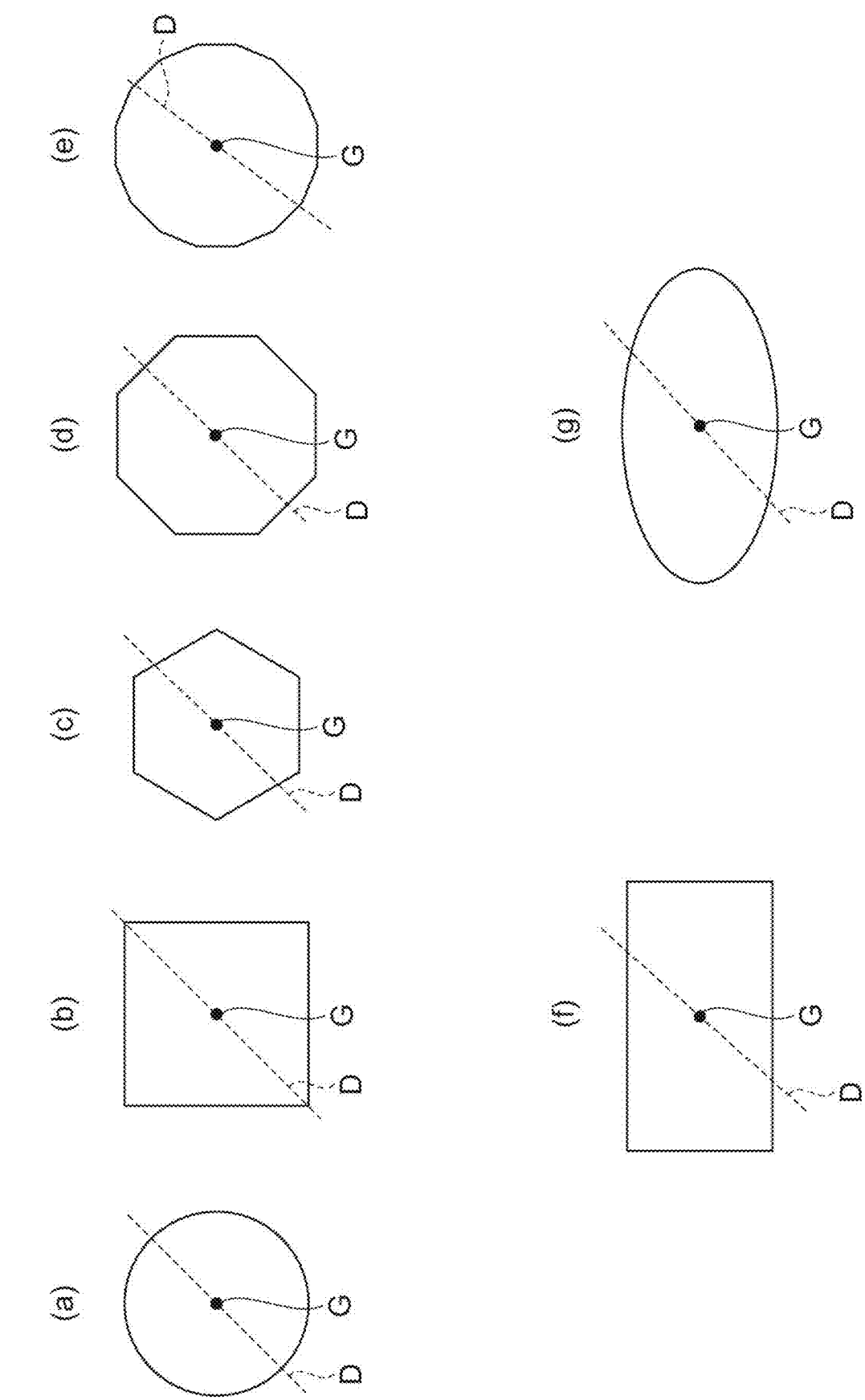
FIGS. 19A to 19G are plan views showing examples of the shape of the modified refractive index region in the X-Y plane.
Figure 20:
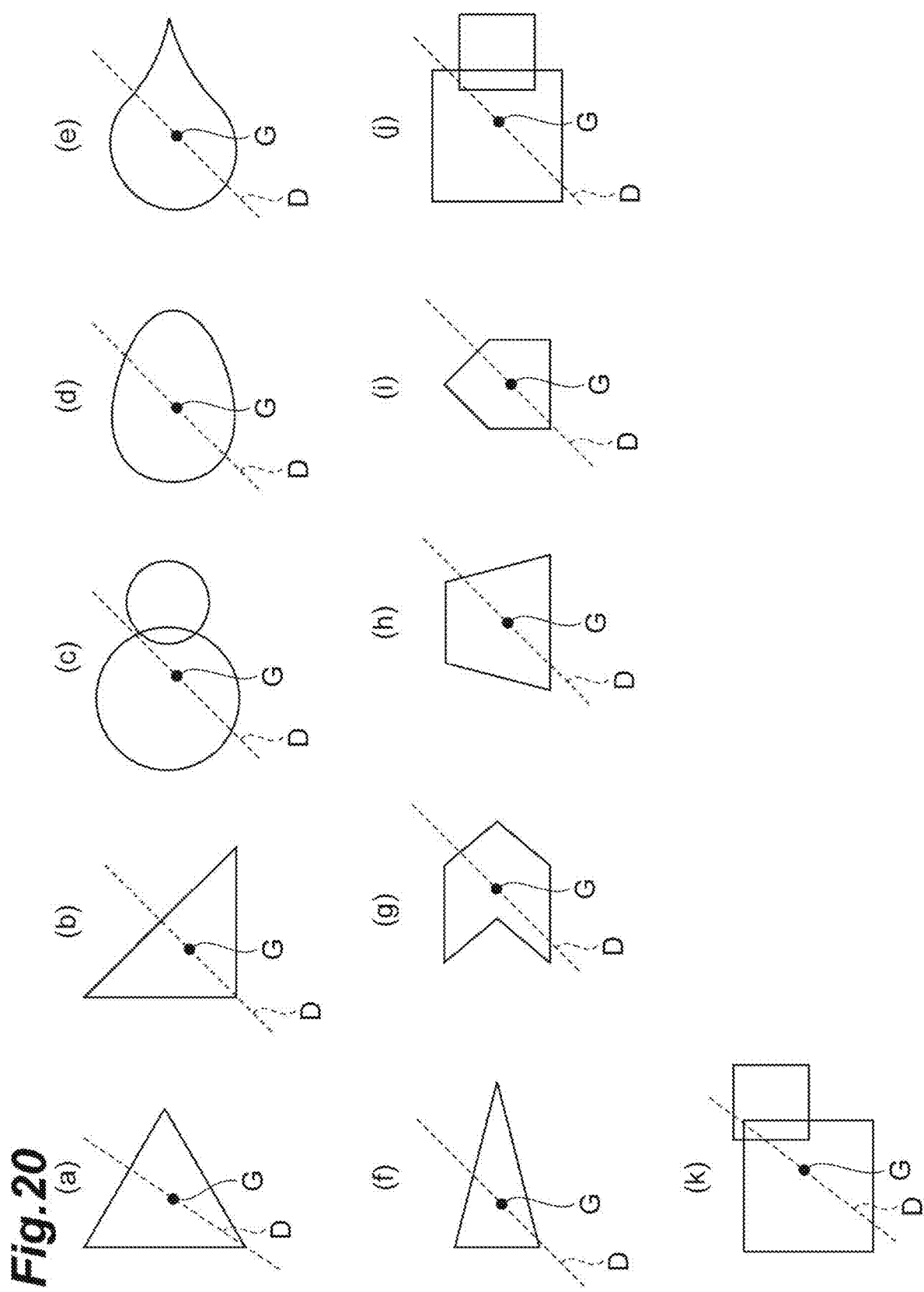
FIGS. 20A to K are plan views showing examples of the shape of the modified refractive index region in the X-Y plane.

FIGS. 19A to 19G and 20A to 20K are plan views showing examples of the shape of the modified refractive index region 15b in the X-Y plane. In the above embodiment, an example is shown in which the shape of the modified refractive index region 15b in the X-Y plane is circular. However, the modified refractive index region 15b may have a shape other than a circular shape. For example, the shape of the modified refractive index region 15b in the X-Y plane may have mirror image symmetry (line symmetry). Here, mirror image symmetry (line symmetry) means that, across a certain straight line along the X-Y plane, the planar shape of the modified refractive index region 15b located on one side of the straight line and the planar shape of the modified refractive index region 15b located on the other side of the straight line can be mirror image symmetrical (line symmetrical) with each other. Examples of shapes having mirror image symmetry (line symmetry) include a perfect circle shown in FIG. 19A, a square shown in FIG. 19B, a regular hexagon shown in FIG. 19C, a regular octagon shown in FIG. 19D, a regular hexadecagon shown in FIG. 19E, a rectangle shown in FIG. 19F, and an ellipse shown in FIG. 19G. Thus, the shape of the modified refractive index region 15b in the X-Y plane may have mirror image symmetry (line symmetry). In this case, each unit constituent region R of the virtual square lattice of the phase modulation layer 15 has a simple shape, and hence the direction and position of the center of gravity G of the corresponding modified refractive index region 15b from the lattice point O can be determined with high accuracy, thereby enabling patterning with high accuracy.

The shape of the modified refractive index region 15b in the X-Y plane may be a shape having no rotational symmetry of 180°. Examples of such shapes include an equilateral triangle shown in FIG. 20A, an isosceles right triangle shown in FIG. 20B, a shape shown in FIG. 20C in which two circles or ellipses partially overlap, a shape (oval) deformed so that the dimension in the minor axis direction in the vicinity of one end along the major axis of an ellipse becomes smaller than the dimension in the minor axis direction in the vicinity of the other end shown in FIG. 20D, a shape (teardrop) in which one end along the major axis of an ellipse is deformed into a pointed end projecting along the major axis direction shown in FIG. 20E, an isosceles triangle shown in FIG. 20F, a shape (arrow) in which one side of a rectangle is recessed in a triangular shape and the opposite side is pointed in a triangular shape shown in FIG. 20G, a trapezoid shown in FIG. 20H, a pentagon shown in FIG. 20I, a shape shown in FIG. 20J in which two rectangles partially overlap each other, and a shape shown in FIG. 20K in which two rectangles partially overlap each other and have no mirror image symmetry. Thus, since the shape of the modified refractive index region 15b in the X-Y plane does not have a rotational symmetry of 180°, a higher light output can be obtained.

FIGS. 21A to 21K and 22 are plan views showing other examples of the shape of the modified refractive index region in the X-Y plane. In the present variation, a plurality of modified refractive index regions 15c different from the plurality of modified refractive index regions 15b is further provided. Each modified refractive index region 15c is comprised of the second refractive index medium having a refractive index different from that of the first refractive index medium of the base layer 15a. Similarly to the modified refractive index region 15b, the modified refractive index region 15c may be a hole or may be configured by embedding the hole with a compound semiconductor. The modified refractive index regions 15c are provided corresponding one-to-one to the respective modified refractive index regions 15b. Then, the center of gravity G in which the centers of gravity of the modified refractive index regions 15b and 15c are combined is located on the straight line D crossing the lattice point O of the unit constituent region R constituting the virtual square lattice. It is to be noted that both of the modified refractive index regions 15b and 15c are included in the range of the unit constituent region R constituting the virtual square lattice. The unit constituent region R is a region surrounded by a straight line bisecting between lattice points of the virtual square lattice.

Figure 21:
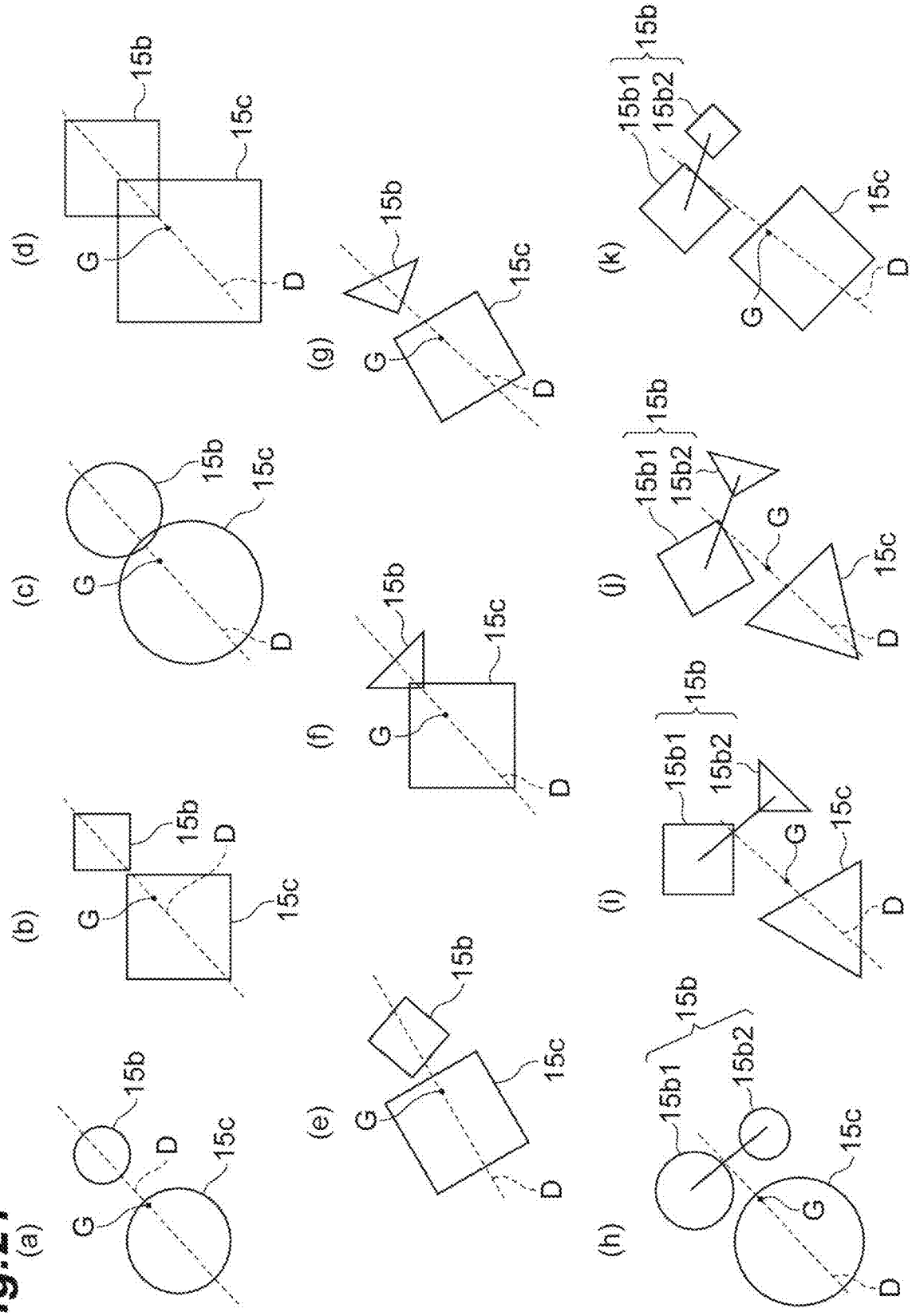
FIGS. 21A to 21K are plan views showing other examples of the shape of the modified refractive index region in the X-Y plane.

Although the planar shape of the modified refractive index region 15c is, for example, circular, it may have various shapes similarly to the modified refractive index region 15b. FIGS. 21A to 21K show examples of shapes and relative relationships of the modified refractive index regions 15b and 15c in the X-Y plane. FIGS. 21A and 21B show forms in which the modified refractive index regions 15b and 15c have figures of the same shape. FIGS. 21C and 21D show forms in which the modified refractive index regions 15b and 15c have figures of the same shape partially overlapping with each other. FIG. 21E shows a form in which the modified refractive index regions 15b and 15c have figures of the same shape and the modified refractive index regions 15b and 15c are rotated with each other. FIG. 21F shows a form in which the modified refractive index regions 15b and 15c have figures of shapes different from each other. FIG. 21G shows a form in which the modified refractive index regions 15b and 15c have figures of shapes different from each other and the modified refractive index regions 15b and 15c are rotated with each other.

As shown in FIGS. 21H to 21K, the modified refractive index region 15b may be configured to include two regions 15b1 and 15b2 separated from each other. Then, the distance between the center of gravity (corresponding to the center of gravity of a single modified refractive index region 15b) where the centers of gravity of the regions 15b1 and 15b2 are combined and the center of gravity of the modified refractive index region 15c may be arbitrarily set within the unit constituent region R. In this case, as shown in FIG. 21H, the regions 15b1 and 15b2 and the modified refractive index region 15c may have figures of the same shape to each other. Alternatively, as shown in FIG. 21I, the figures of two of the regions 15b1 and 15b2 and the modified refractive index region 15c may be different from the other. As shown in FIG. 21J, in addition to the angle of the straight line connecting the regions 15b1 and 15b2 with respect to the X-axis, the angle of the modified refractive index region 15c with respect to the X-axis may be arbitrarily set within the unit constituent region R. As shown in FIG. 21K, while the regions 15b1 and 15b2 and the modified refractive index region 15c maintain the same relative angle with each other, the angle of the straight line connecting the regions 15b1 and 15b2 with respect to the X-axis may be arbitrarily set within the unit constituent region R.

Figure 22:
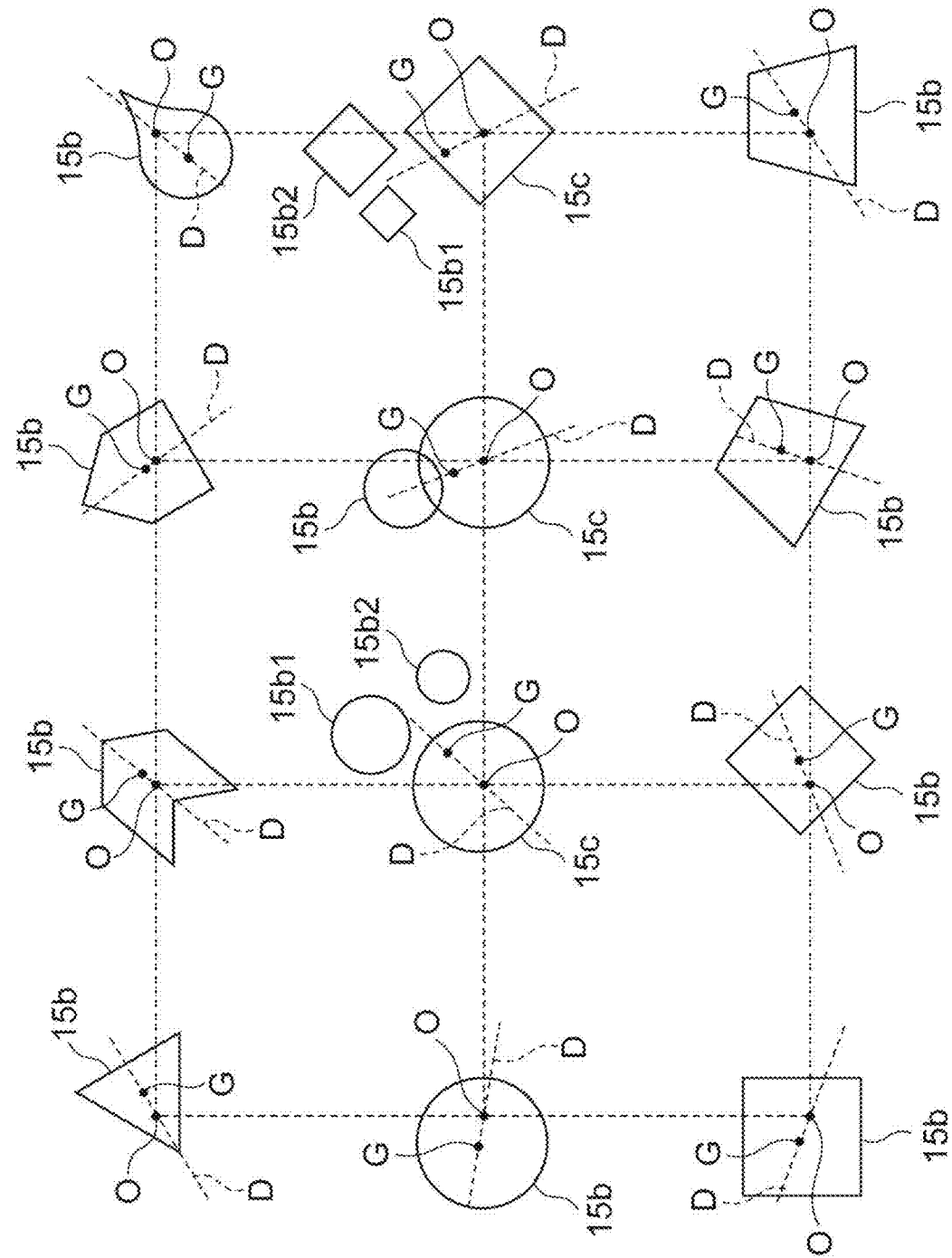
FIG. 22 is a plan view showing another example of the shape of the modified refractive index region in the X-Y plane.

The shapes of the modified refractive index regions in the X-Y plane may be identical to each other between the lattice points. That is, the modified refractive index regions may have the identical figure at all the lattice points, and may be able to be overlapped with each other between the lattice points by a translation operation or a translation operation and a rotation operation. In that case, the spectrum line width of the output beam can be narrowed. Alternatively, the shapes of the modified refractive index region in the X-Y plane may not necessarily be identical between the lattice points, and as shown in FIG. 22 for example, the shapes may be different from each other between adjacent lattice points. That is, of the lattice points constituting the virtual square lattice, a plurality of lattice points (effective lattice points) with which a plurality of modified refractive index regions are associated include a plurality of sets each composed of two lattice points satisfying a specific condition. The two lattice points constituting one set are adjacent to each other at the shortest distance. A line segment connecting one lattice point and the center of gravity of one modified refractive index region associated with the one lattice point is parallel to a line segment connecting the other lattice point and the center of gravity of the other modified refractive index region associated with the other lattice point. Furthermore, the distance between one lattice point and the center of gravity of one modified refractive index region is different from the distance between the other lattice point and the center of gravity of the other modified refractive index region.

It is to be noted that as shown in the examples of FIGS. 14A and 14B, the center of the straight line D passing through each lattice point may be set so as to coincide with the lattice point O in any case of FIGS. 19A to 19G, 20A to 20K, 21A to 21K, and 22.

For example, also in the configuration of the phase modulation layer as in the present variation, the effects of the above-described embodiment can be preferably achieved.

(Second Variation)

Figure 23:
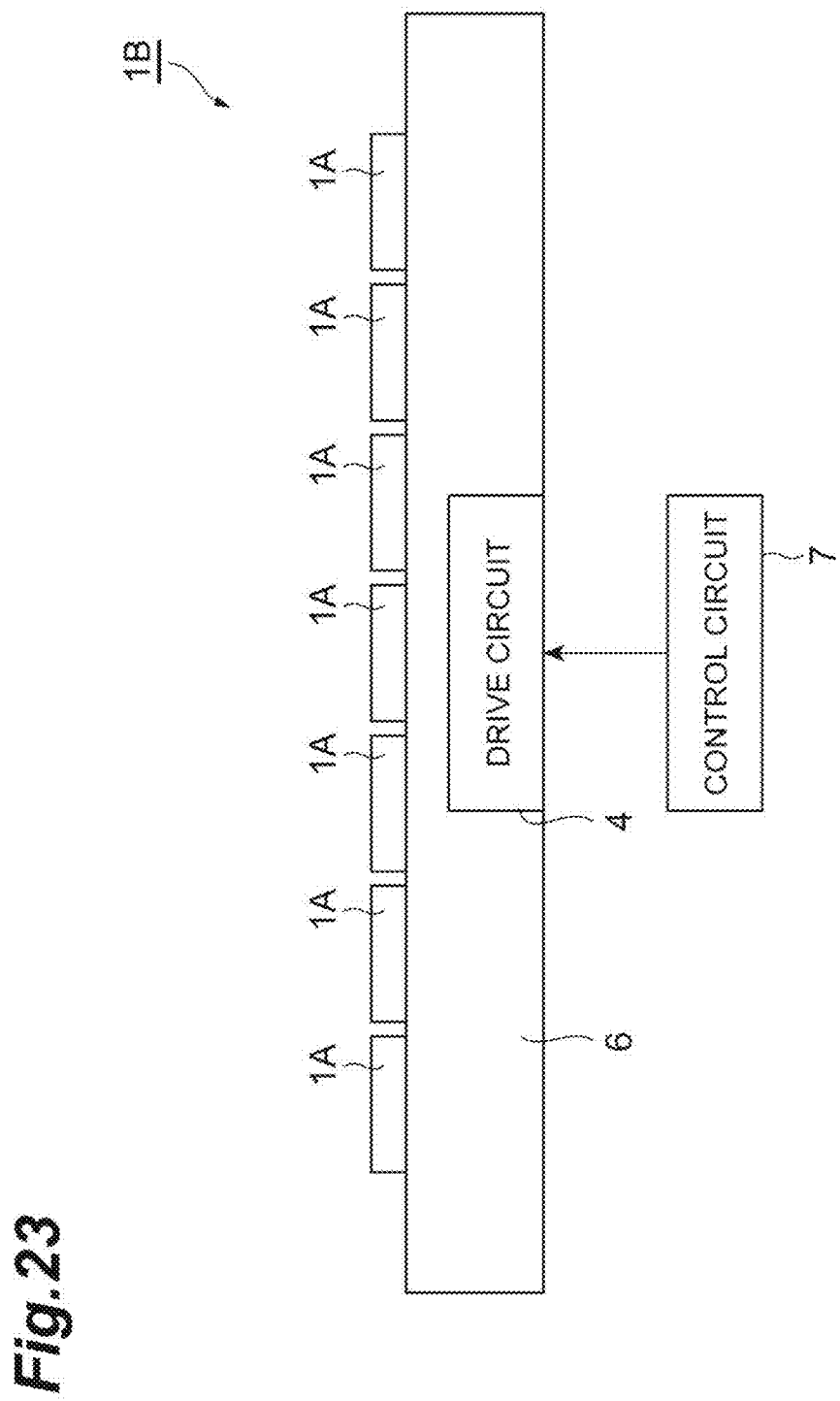
FIG. 23 is a diagram showing a configuration of a light-emitting apparatus according to a second variation.

FIG. 23 is a diagram showing the configuration of a light-emitting apparatus 1B according to the second variation. The light-emitting apparatus 1B includes a support substrate 6, the plurality of light-emitting elements 1A arrayed one-dimensionally two-dimensionally on the support substrate 6, and a drive circuit 4 that individually drives the plurality of light-emitting elements 1A. The configuration of each semiconductor light-emitting element 1A is the same as that of the above embodiment. The drive circuit 4 is provided on the back surface or inside of the support substrate 6, and individually drives each semiconductor light-emitting element 1A. The drive circuit 4 supplies a drive current to the individual semiconductor light-emitting elements 1A in accordance with an instruction from a control circuit 7. It is possible to preferably realize a head-up display or the like by, as in the second variation, providing the plurality of individually driven light-emitting elements 1A and extracting a desired optical image from each semiconductor light-emitting element 1A, thereby appropriately driving necessary elements for a module in which semiconductor light-emitting elements corresponding to a plurality of patterns are arranged in advance.

(Third Variation)

Figure 24:
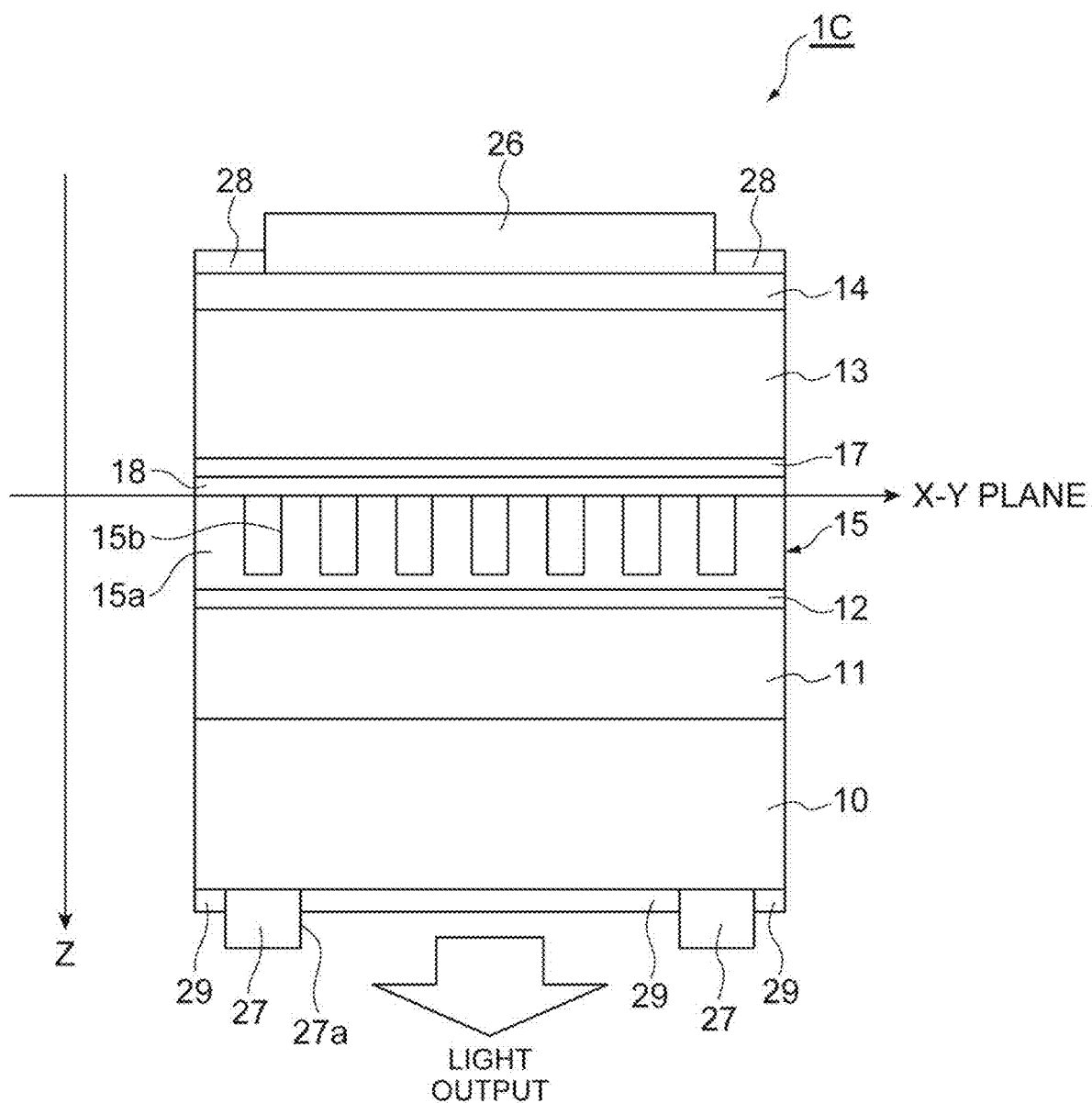
FIG. 24 is a diagram schematically showing a cross-sectional configuration of a semiconductor light-emitting element 1C according to a third variation.

FIG. 24 schematically shows a cross-sectional configuration of a semiconductor light-emitting element 1C according to the third variation of the present embodiment. The difference between the third variation and the above-described embodiment is the number of layers of the high refractive index layer. That is, the semiconductor light-emitting element 1C according to the third variation includes the high refractive index layer 17, but does not include the high refractive index layer 16. In other words, the high refractive index layer is provided only between the cladding layer 13 and the phase modulation layer 15, and the high refractive index layer is not interposed between the active layer 12 and the phase modulation layer 15. In this case, the active layer 12 also serves as a high refractive index layer. Since the active layer 12 (particularly quantum well layer) has a high In composition, its refractive index is sufficiently larger than the refractive index of the surrounding layers (the cladding layer 11 and the phase modulation layer 15). Therefore, the optical confinement coefficient of the active layer 12 is large, and, due to its influence, the optical confinement coefficient of the phase modulation layer 15 becomes also large. Hence, even if the high refractive index layer between the active layer 12 and the phase modulation layer 15 is omitted as in this third variation, the same effects as those in the above embodiment can be obtained.

Figure 25:
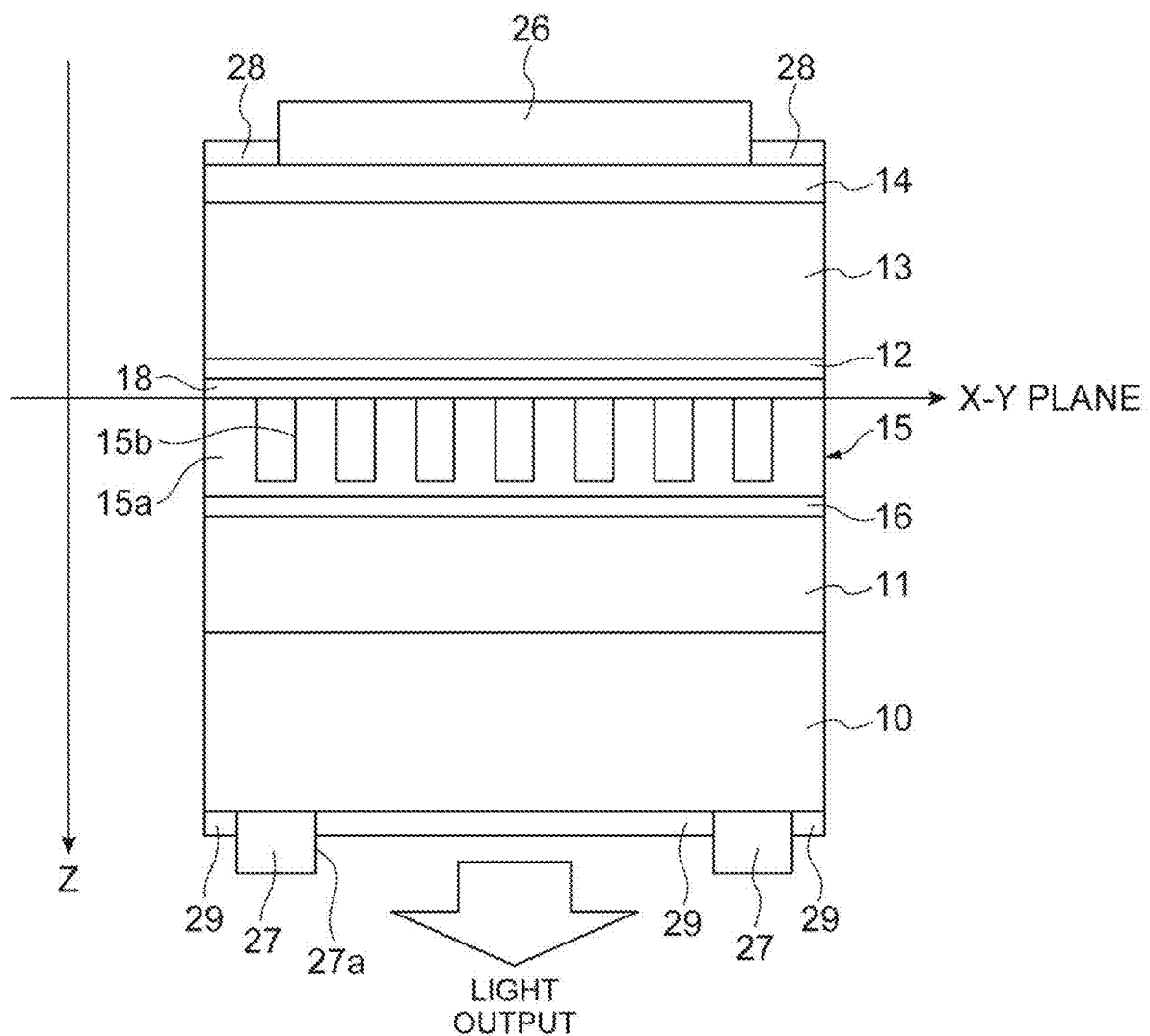
FIG. 25 is a diagram showing a variation of a case where an active layer 12 is located between a phase modulation layer 15 and a cladding layer 13.

FIG. 25 shows a variation of a case where the active layer 12 is located between the phase modulation layer 15 and the cladding layer 13 (see FIG. 3). In this case, the high refractive index layer 16 between the active layer 12 and the phase modulation layer 15 is omitted, and the high refractive index layer is provided only between the cladding layer 11 and the phase modulation layer 15. Such a configuration can also achieve the same effects as those of the above-described embodiment.

It is to be noted that the arrangement of the high refractive index layer is not limited to that of the above-described embodiment and the present variation. For example, the high refractive index layer may be provided only between the active layer 12 and the phase modulation layer 15.

(Fourth Variation)

Figure 26:
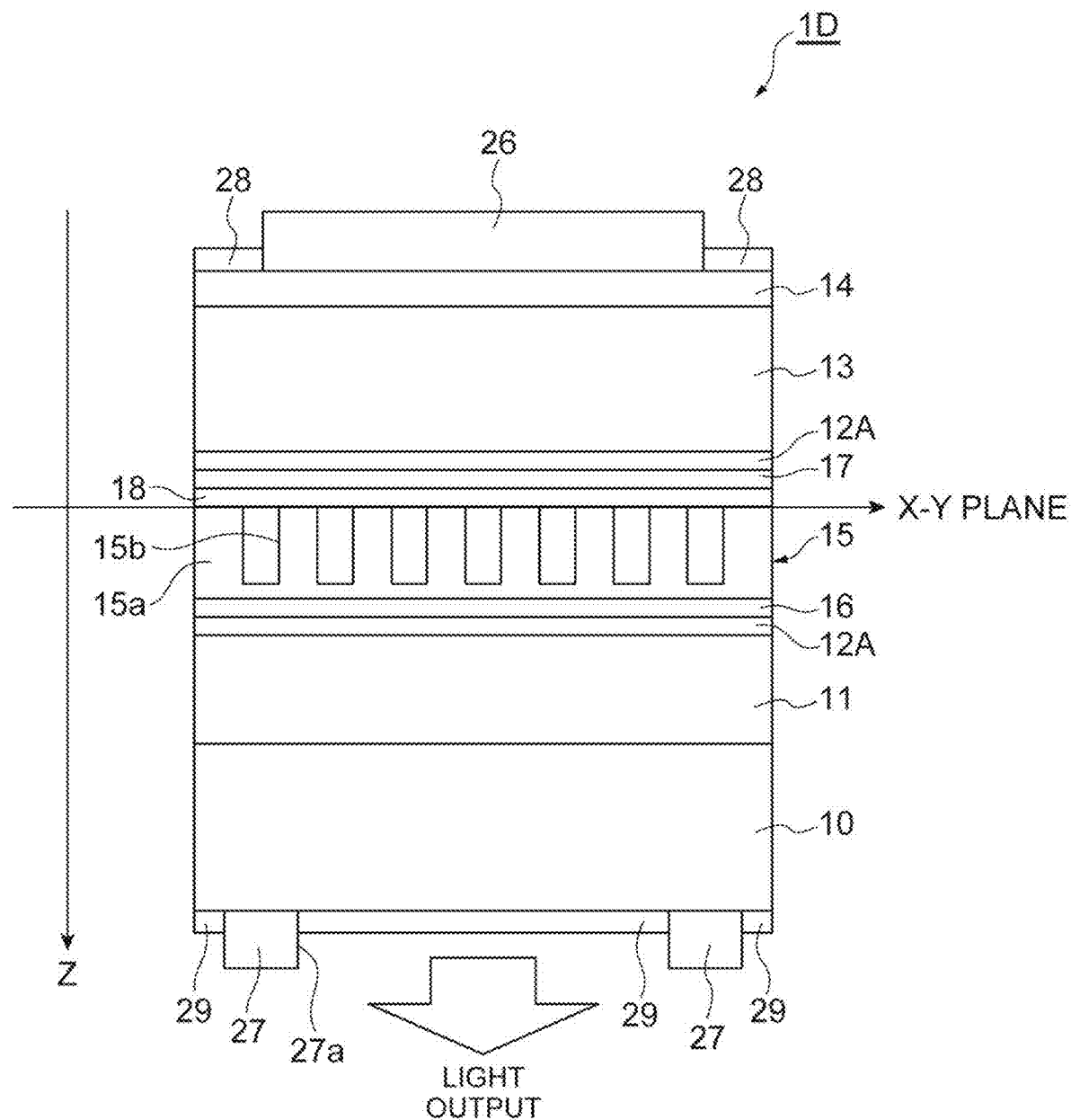
FIG. 26 is a diagram schematically showing a cross-sectional configuration of a semiconductor light-emitting element 1D according to a fourth variation.

FIG. 26 schematically shows a cross-sectional configuration of a semiconductor light-emitting element 1D according to the fourth variation of the present embodiment. The difference between the fourth variation and the above-described embodiment is the number of the active layers. That is, the semiconductor light-emitting element 1D according to the fourth variation further includes an active layer 12A in addition to the active layer 12 shown in FIG. 2. The active layer 12A is provided, for example, between the high refractive index layer 17 and the cladding layer 13. The internal structure of the active layer 12A is the same as that of the active layer 12. The active layer 12A having a sufficiently large optical confinement coefficient is provided in the vicinity of the high refractive index layer 17, and hence such a configuration can more remarkably achieve the effects of the above embodiment.

(Fifth Variation)

Figure 27:
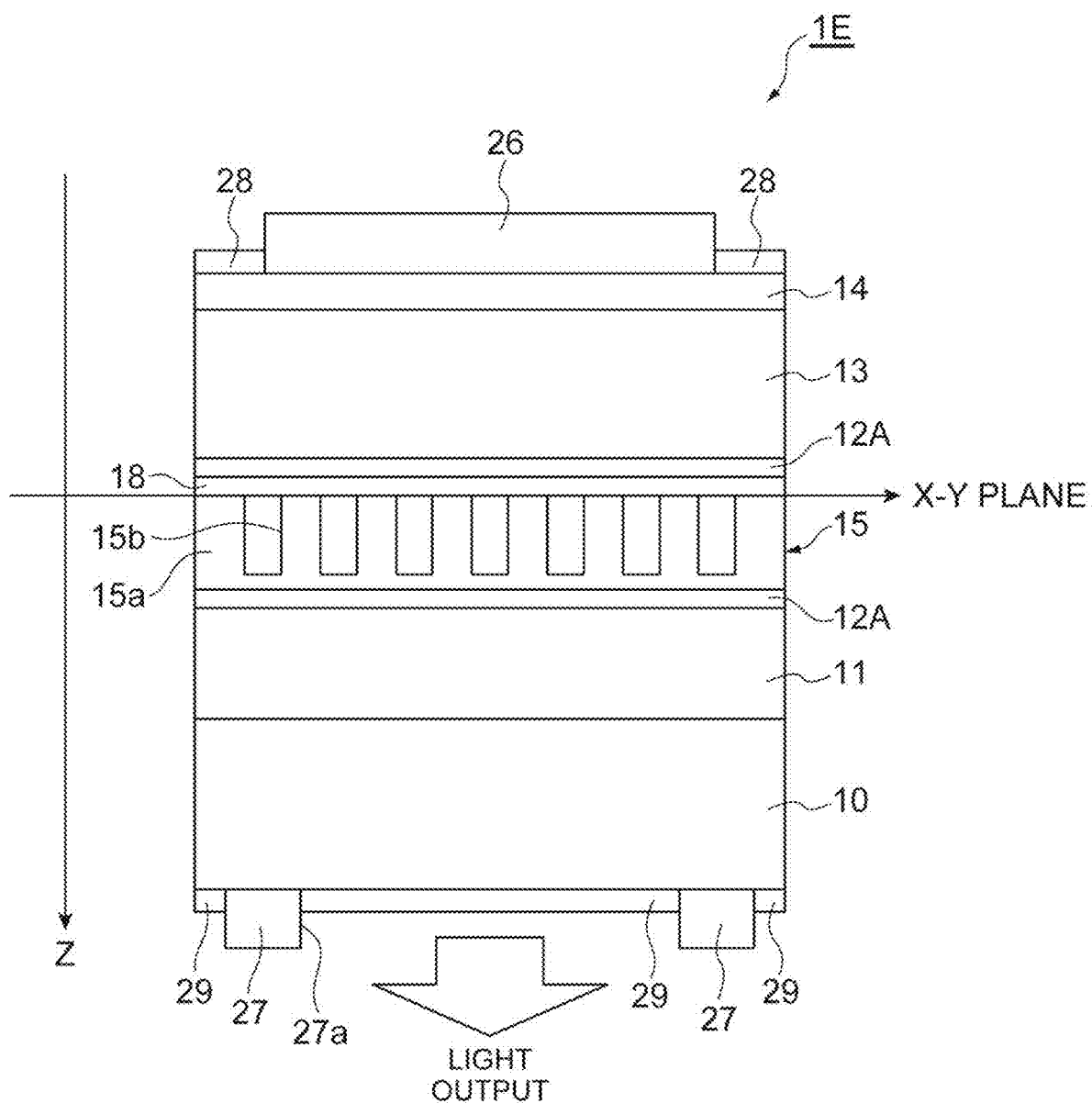
FIG. 27 is a diagram schematically showing a cross-sectional configuration of a semiconductor light-emitting element 1E according to a fifth variation.

FIG. 27 schematically shows a cross-sectional configuration of a semiconductor light-emitting element 1E according to the fifth variation of the present embodiment. In the fifth variation, the high refractive index layers 16 and 17 are further omitted from those in the fourth variation. That is, the semiconductor light-emitting element 1E includes none of the high refractive index layers 16 and 17. In the semiconductor light-emitting element 1E, any high refractive index layer other than the active layers 12 and 12A is not provided any of between the cladding layer 11 and the phase modulation layer 15 and between the cladding layer 13 and the phase modulation layer 15. In this case, the active layers 12 and 12A play a role of the high refractive index layers 16 and 17. That is, the phase modulation layer 15 is sandwiched by the active layers 12 and 12A having sufficiently large optical confinement coefficients, and hence the same effects as that of the above-described embodiment can be achieved.

First Specific Example

Here, a first specific example of the semiconductor light-emitting element according to the present embodiment and each variation will be described. The first specific example is a specific example of the semiconductor light-emitting element shown in FIG. 3, and the wavelength of the laser light is 405 nm. First, the cladding layer 11, the high refractive index layer 16, and the base layer 15a are sequentially grown on an n-type GaN substrate serving as the semiconductor substrate 10 by using the metal organic chemical vapor deposition (MOCVD) method. The cladding layer 11 is an n-type AlGaN layer (Al composition 6%) having a thickness of 1.2 μm. The high refractive index layer 16 is an undoped or n-type InGaN layer (In composition 6%) having a thickness of 40 nm. The base layer 15a is an undoped GaN layer having a thickness of 90 nm. Thereafter, circular holes having an interval of about 160 nm, a diameter of about 70 nm, and a depth of about 70 nm are formed on the surface of the base layer 15a by using a fine processing technology, thereby obtaining the phase modulation layer 15. Then, regrowth by MOCVD is performed. That is, an undoped GaN layer (may contain Al) having a thickness of 20 nm that is the guide layer 18 is formed above the circular hole, thereby blocking the circular hole and forming a hole (the modified refractive index region 15b). At this time, the hole shape before embedding may be adjusted in advance so that the hole after formation has the diameter and depth described above. The filling factor FF is set to 15%. Thereafter, the high refractive index layer 17 and a carrier barrier layer are formed. The high refractive index layer 17 is an InGaN layer (In composition 6%) having a thickness of 20 nm. The carrier barrier layer is an AlGaN layer (Al composition 18%) having a thickness of 10 nm. Furthermore, the active layer 12 is formed by alternately growing three quantum well layers and four carrier barrier layers. Each of the three quantum well layers is an InGaN layer (In composition 10%) having a thickness of 3 nm. Each of the four barrier layers is an InGaN layers (In composition 1%) having a thickness of 10 nm. Then, the carrier barrier layer, the cladding layer 13, and the contact layer are formed. The carrier barrier layer is an undoped or p-type AlGaN layer (Al composition 18%) having a thickness of 20 nm. The cladding layer 13 is a p-type AlGaN layer (Al composition 6%) having a thickness of 500 nm. The contact layer is a p-type GaN layer having a thickness of 100 nm. Thereafter, the electrodes 26 and 27, the protective film 28, and the anti-reflection film 29 are formed by using a normal semiconductor process.

FIG. 28 is a table showing a layer structure of the semiconductor light-emitting element according to the first specific example. FIG. 28 shows the conductivity type (p is p-type, n is n-type, and u is undoped), composition, and film thickness of each layer, as well as the refractive index and an optical confinement coefficient Γ. It is to be noted that the layer number 1 indicates the contact layer 14, the layer number 2 indicates the cladding layer 13, the layer number 3 indicates the carrier barrier layer, the layer number 4 indicates the guide layer, the layer numbers 5 to 11 indicate the active layers 12, the layer number 12 indicates the carrier barrier layer, the layer number 13 indicates the high refractive index layer 17, the layer number 14 indicates the guide layer 18, the layer number 15 indicates the phase modulation layer 15, the layer number 16 indicates the guide layer, the layer number 17 indicates the high refractive index layer 16, the layer number 18 indicates the guide layer, and the layer number 19 indicates the cladding layer 11. It is to be noted that a refractive index $n_{Air\text{-}hole}$ of the phase modulation layer 15 is calculated using the following Formula (18) expressing the average permittivity.

$$n_{Air\text{-}hole} = \sqrt{FF \cdot n_{Air}^2 + (1-FF) n_{GaN}^2} \quad (18)$$

In the 405 nm band, $n_{Air}$ is the refractive index of air (=1), $n_{GaN}$ is the refractive index of GaN(=2.5549), and FF is the filling factor (=0.15).

Figure 29:
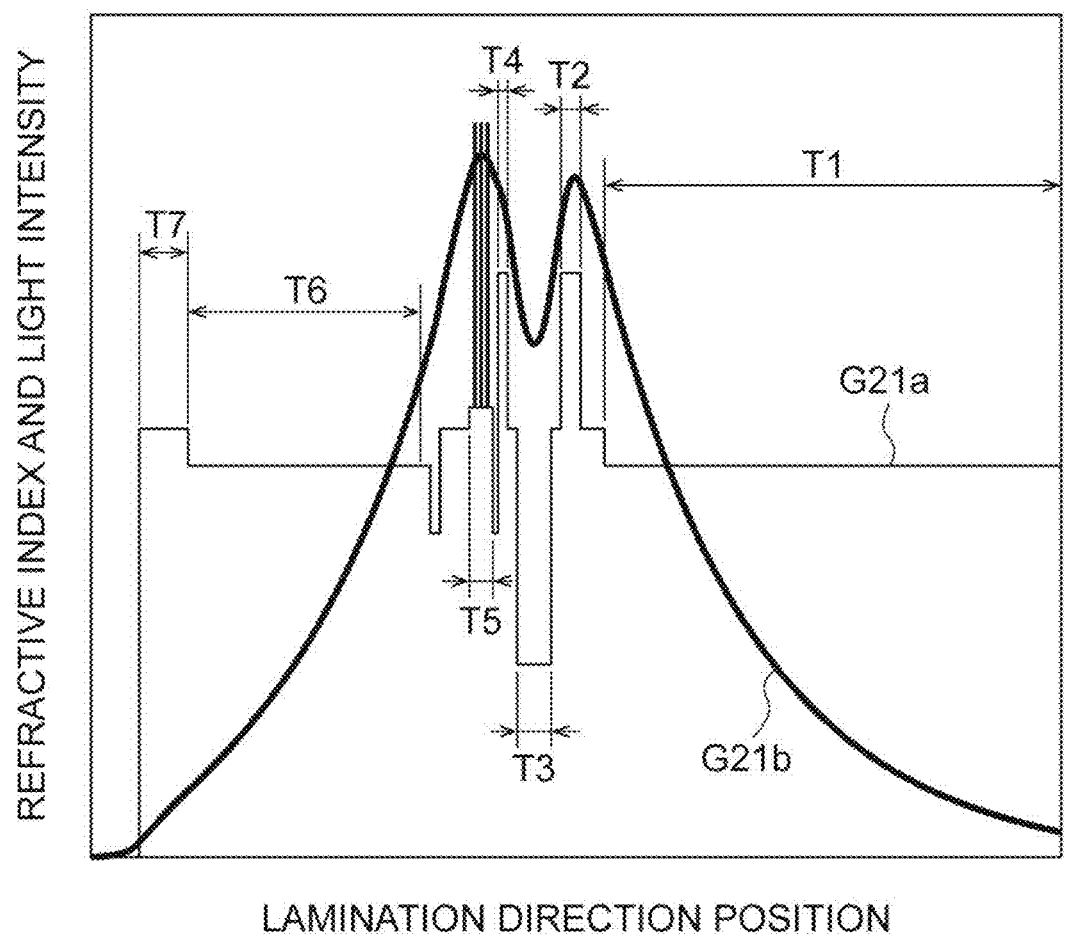
FIG. 29 is a graph showing a refractive index profile and mode distribution of the semiconductor light-emitting element including the layer structure shown in FIG. 28.

FIG. 29 is a graph showing a refractive index profile and mode distribution (magnitude of the electric field amplitude in the TE mode) of the semiconductor light-emitting element including the layer structure shown in FIG. 28. In FIG. 29, a graph G21a represents the refractive index profile, and a graph G21b represents the mode distribution. The horizontal axis represents a lamination direction position (range is 2.0 μm). In the figure, a range T1 is the cladding layer 11, a range T2 is the high refractive index layer 16, a range T3 is the phase modulation layer 15, a range T4 is the high refractive index layer 17, a range T5 is the active layer 12, a range T6 is the cladding layer 13, and a range T7 is the contact layer 14.

In this first specific example, the optical confinement coefficient T of the phase modulation layer 15 is 8.6%. Thus, by providing the semiconductor light-emitting element with the high refractive index layers 16 and 17, the optical confinement coefficient of the phase modulation layer 15 can be effectively increased. Therefore, it is possible to obtain a practical light-emitting element capable of reducing the threshold current value and continuously oscillating.

Second Specific Example

Figure 31:
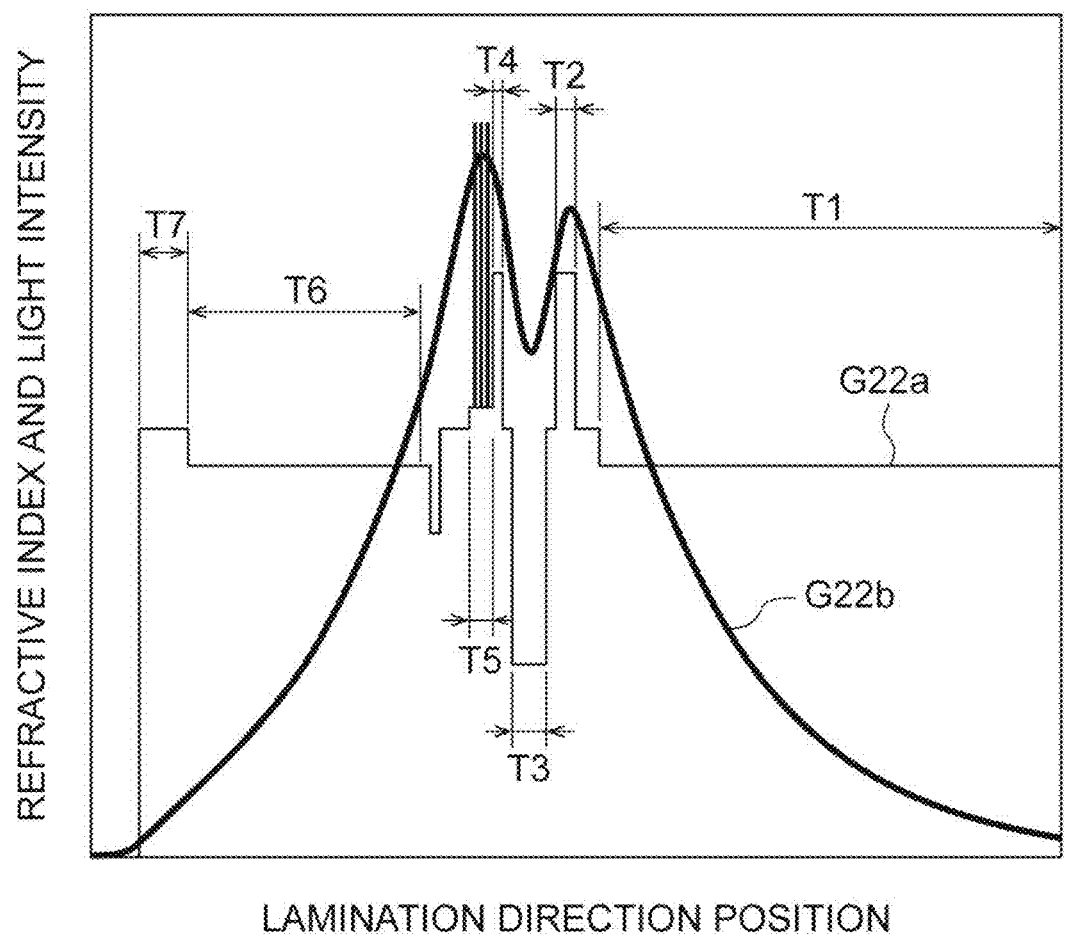
FIG. 31 is a graph showing a refractive index profile and mode distribution of the semiconductor light-emitting element including the layer structure shown in FIG. 30.

Next, a specific example of a semiconductor light-emitting element having a configuration in which one carrier barrier layer (layer number 12 in FIG. 28) is omitted from the first specific example will be described. When this semiconductor light-emitting element is produced, the step of forming one carrier barrier layer is preferably omitted from the production method according to the first specific example. FIG. 30 is a table showing a layer structure of the semiconductor light-emitting element according to the second specific example. FIG. 30 shows the conductivity type, composition, film thickness, refractive index, and optical confinement coefficient T of each layer. It is to be noted that the layer number 1 indicates the contact layer 14, the layer number 2 indicates the cladding layer 13, the layer number 3 indicates the carrier barrier layer, the layer number 4 indicates the guide layer, the layer numbers 5 to 11 indicate the active layers 12, the layer number 12 indicates the high refractive index layer 17, the layer number 13 indicates the guide layer 18, the layer number 14 indicates the phase modulation layer 15, the layer number 15 indicates the guide layer, the layer number 16 indicates the high refractive index layer 16, the layer number 17 indicates the guide layer, and the layer number 18 indicates the cladding layer 11. FIG. 31 is a graph showing a refractive index profile and mode distribution of the semiconductor light-emitting element including the layer structure shown in FIG. 30. In FIG. 31, a graph G22a represents the refractive index profile, and a graph G22b represents the mode distribution. The ranges T1 to T7 in the figure are the same as those in the first specific example.

In this second specific example, the optical confinement coefficient I of the phase modulation layer 15 is 9.3%. It is considered that the optical confinement coefficient T is higher than that of the first specific example because the distance between the active layer 12 and the high refractive index layer 17 is reduced by omitting the carrier barrier layer. Also in the second specific example, by providing the semiconductor light-emitting element with the high refractive index layers 16 and 17, the optical confinement coefficient of the phase modulation layer 15 can be effectively increased.

Third Specific Example

Figure 33:
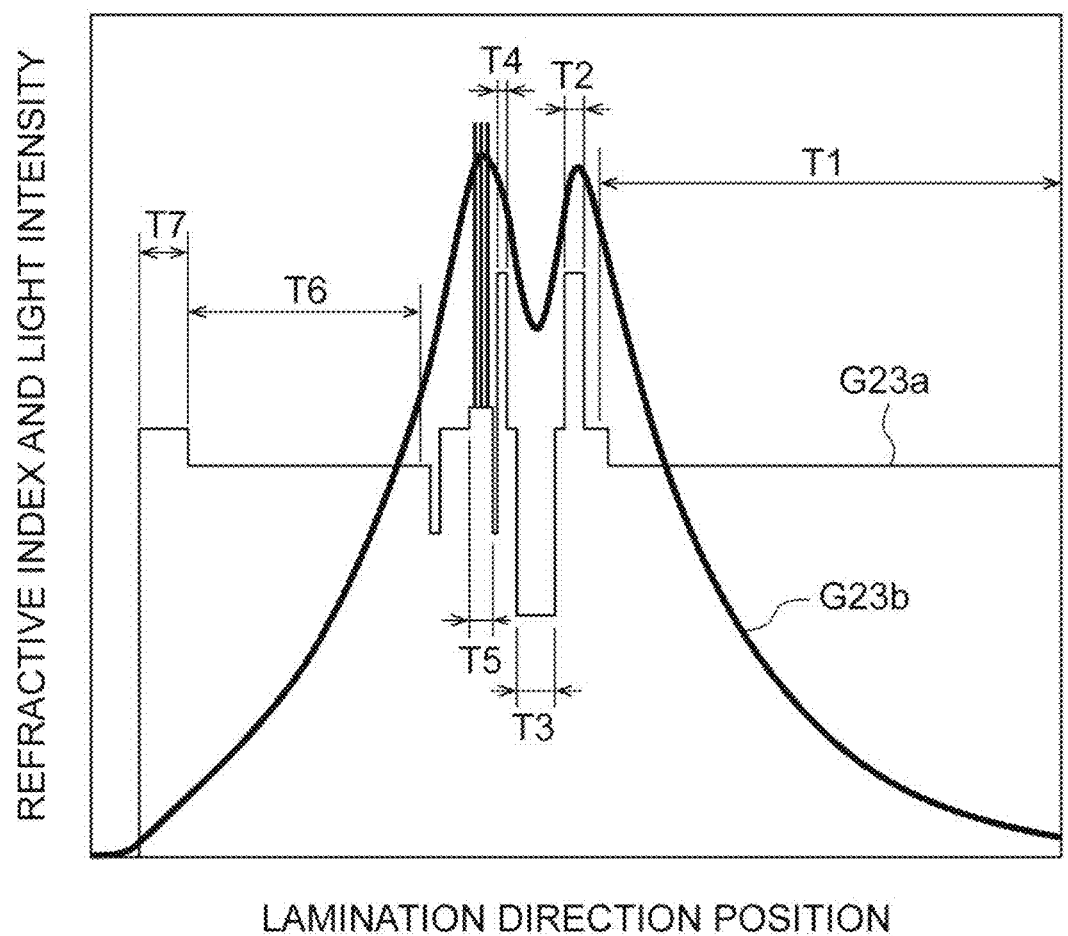
FIG. 33 is a graph showing a refractive index profile and mode distribution of the semiconductor light-emitting element including the layer structure shown in FIG. 32.

Subsequently, a specific example of a semiconductor light-emitting element having a configuration in which the filling factor FF of the phase modulation layer 15 is 12% in the first specific example will be described. FIG. 32 is a table showing a layer structure of the semiconductor light-emitting element according to the third specific example. FIG. 32 shows the conductivity type, composition, film thickness, refractive index, and optical confinement coefficient I of each layer. It is to be noted that each layer number is the same as that of the first specific example. FIG. 33 is a graph showing a refractive index profile and mode distribution of the semiconductor light-emitting element including the layer structure shown in FIG. 32. In the figure, a graph G23a represents the refractive index profile, and a graph G23b represents the mode distribution. The ranges T1 to T7 in the figure are the same as those in the first specific example.

In this third specific example, the optical confinement coefficient I of the phase modulation layer 15 is 10.7%. It is considered that the optical confinement coefficient T is higher than that of the first specific example because the refractive index of the phase modulation layer 15 is increased by the decrease of the filling factor FF. Also in the third specific example, by providing the semiconductor light-emitting element with the high refractive index layers 16 and 17, the optical confinement coefficient of the phase modulation layer 15 can be effectively increased.

Fourth Specific Example

Subsequently, a specific example of a semiconductor light-emitting element having a configuration shown in FIG. 26 will be shown. The wavelength of the laser light is 405 nm. When this semiconductor light-emitting element is produced, a step of growing a carrier barrier layer, an active layer, and a carrier barrier layer in order is preferably added between the step of growing the cladding layer 11 and the step of growing the high refractive index layer 16. It is to be noted that in this fourth specific example, the number of quantum well layers of the active layers 12 and 12A is two and the number of barrier layers is three. The composition and thickness of a pair of carrier barrier layers sandwiching the active layer 12A are the same as those of the pair of carrier barrier layers sandwiching the active layer 12.

Figure 35:
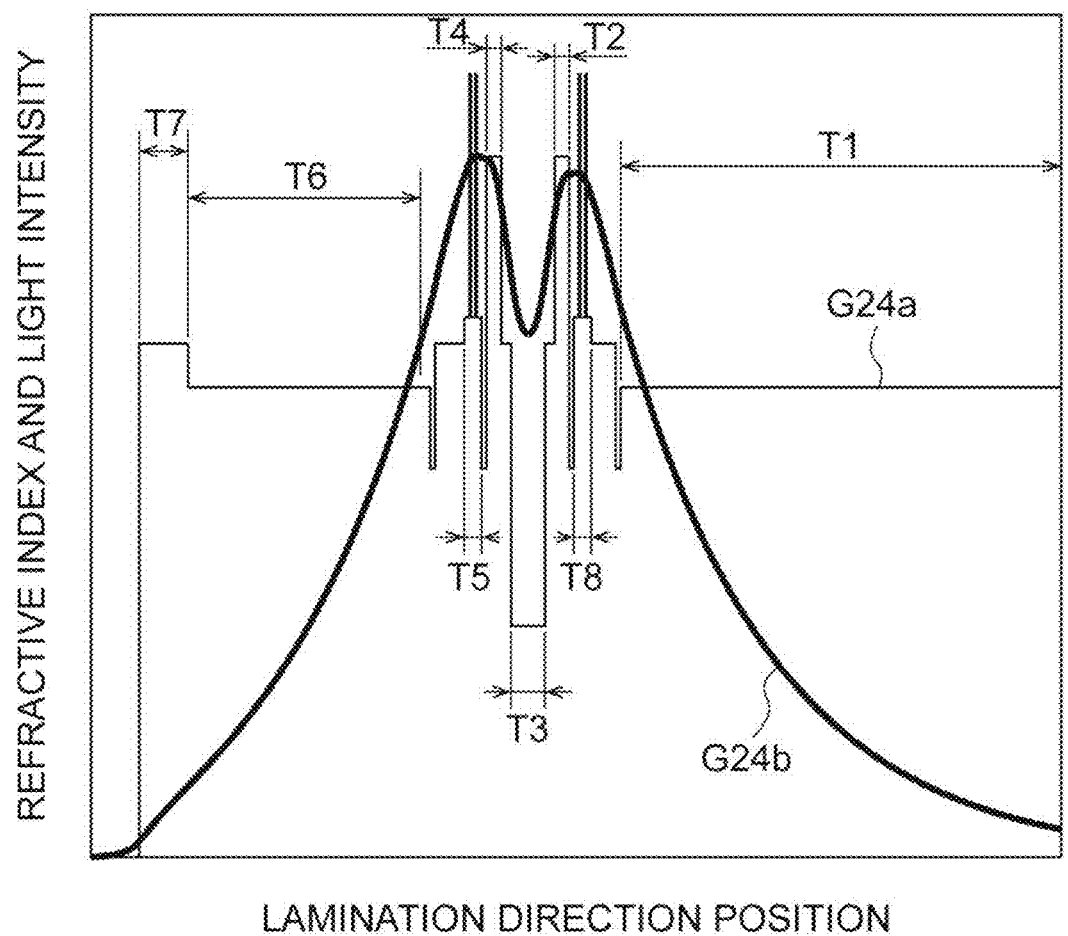
FIG. 35 is a graph showing a refractive index profile and mode distribution of the semiconductor light-emitting element including the layer structure shown in FIG. 34.

FIG. 34 is a table showing a layer structure of the semiconductor light-emitting element according to the fourth specific example. FIG. 34 shows the conductivity type, composition, film thickness, refractive index, and optical confinement coefficient I of each layer. It is to be noted that the layer number 1 indicates the contact layer 14, the layer number 2 indicates the cladding layer 13, the layer number 3 indicates the carrier barrier layer, the layer number 4 indicates the guide layer, the layer numbers 5 to 9 indicate the active layers 12A, the layer number 10 indicates the carrier barrier layer, the layer number 11 indicates the high refractive index layer 17, the layer number 12 indicates the guide layer 18, the layer number 13 indicates the phase modulation layer 15, the layer number 14 indicates the guide layer, the layer number 15 indicates the high refractive index layer 16, the layer number 16 indicates the guide layer, the layer numbers 17 to 21 indicate the active layers 12, the layer number 22 indicates the guide layer, the layer number 23 indicates the carrier barrier layer, and the layer number 24 indicates the cladding layer 11. FIG. 35 is a graph showing a refractive index profile and mode distribution of the semiconductor light-emitting element including the layer structure shown in FIG. 34. In FIG. 35, a graph G24a represents the refractive index profile, and a graph G24b represents the mode distribution. The ranges T1 to T7 in the figure are the same as those in the first specific example, and a range T8 is the active layer 12.

In this fourth specific example, the optical confinement coefficient T of the phase modulation layer 15 is 8.4%. Thus, even when the phase modulation layer 15 is arranged between the two active layers 12 and 12A, with the high refractive index layers 16 and 17, the optical confinement coefficient of the phase modulation layer 15 can be effectively increased.

Fifth Specific Example

Figure 37:
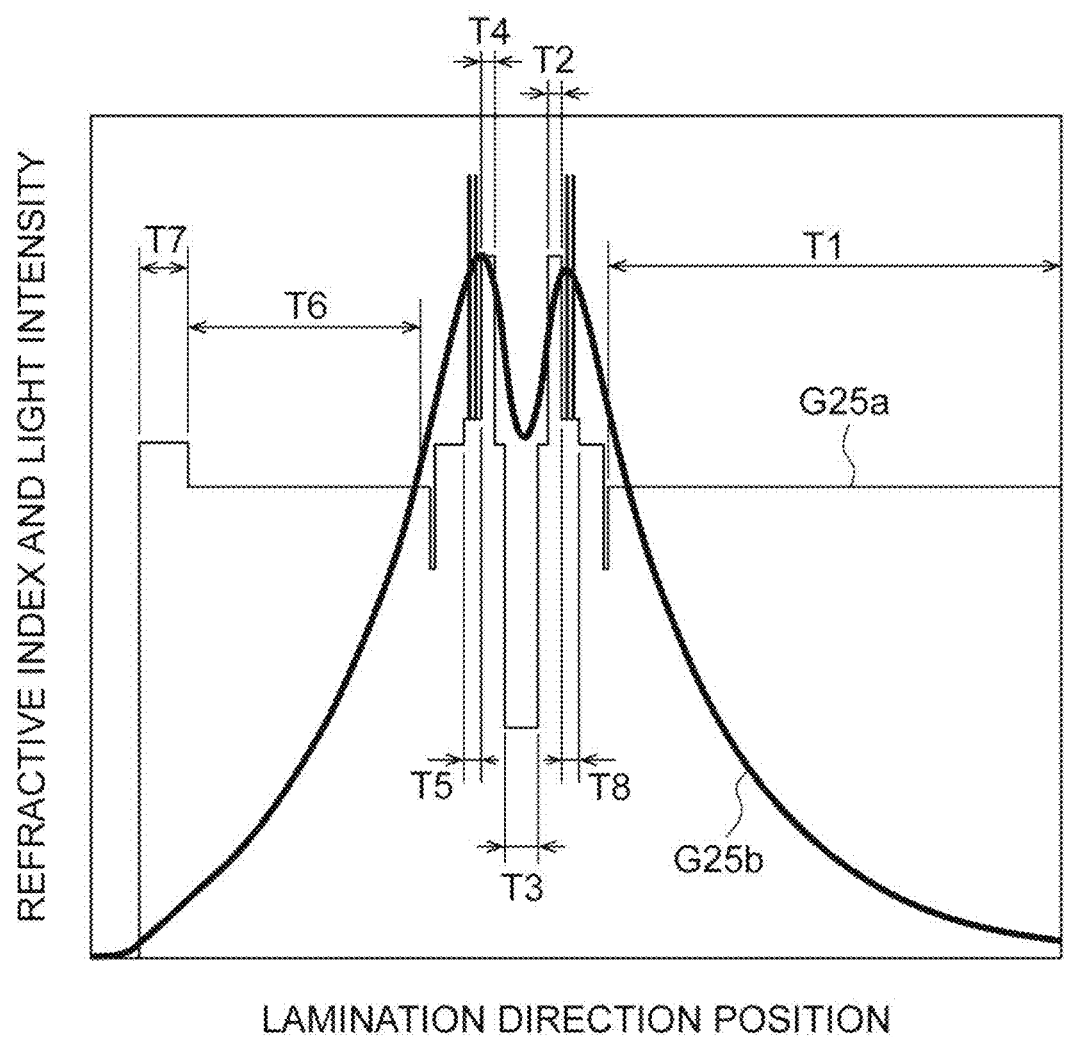
FIG. 37 is a graph showing a refractive index profile and mode distribution of the semiconductor light-emitting element including the layer structure shown in FIG. 36.

Subsequently, a specific example of a semiconductor light-emitting element having a configuration in which two carrier barrier layers (layer numbers 10 and 16 in FIG. 34) are omitted from the fourth specific example will be described. When this semiconductor light-emitting element is produced, the step of forming two carrier barrier layers is preferably omitted from the production method according to the fourth specific example. FIG. 36 is a table showing a layer structure of the semiconductor light-emitting element according to the fifth example. FIG. 36 shows the conductivity type, composition, film thickness, refractive index, and optical confinement coefficient I of each layer. It is to be noted that the layer number 1 indicates the contact layer 14, the layer number 2 indicates the cladding layer 13, the layer number 3 indicates the carrier barrier layer, the layer number 4 indicates the guide layer, the layer numbers 5 to 9 indicate the active layers 12A, the layer number 10 indicates the high refractive index layer 17, the layer number 11 indicates the guide layer 18, the layer number 12 indicates the phase modulation layer 15, the layer number 13 indicates the guide layer, the layer number 14 indicates the high refractive index layer 16, the layer number 15 to 19 indicate the active layers 12, the layer number 20 indicates the guide layer, the layer number 21 indicates the carrier barrier layer, and the layer number 22 indicates the cladding layer 11. FIG. 37 is a graph showing a refractive index profile and mode distribution of the semiconductor light-emitting element including the layer structure shown in FIG. 36. In FIG. 37, a graph G25a represents the refractive index profile, and a graph G25b represents the mode distribution. The ranges T1 to T8 in the figure are the same as those in the fourth specific example.

In this fifth specific example, the optical confinement coefficient T of the phase modulation layer 15 is 9.4%. It is considered that the optical confinement coefficient T' is higher than that of the fourth specific example because the distance between the active layer 12 and the high refractive index layer 16 and the distance between the active layer 12A and the high refractive index layer 17 are each reduced by omitting the carrier barrier layer. Also in the fifth specific example, by providing the semiconductor light-emitting element with the high refractive index layers 16 and 17, the optical confinement coefficient of the phase modulation layer 15 can be effectively increased.

Sixth Specific Example

Figure 39:
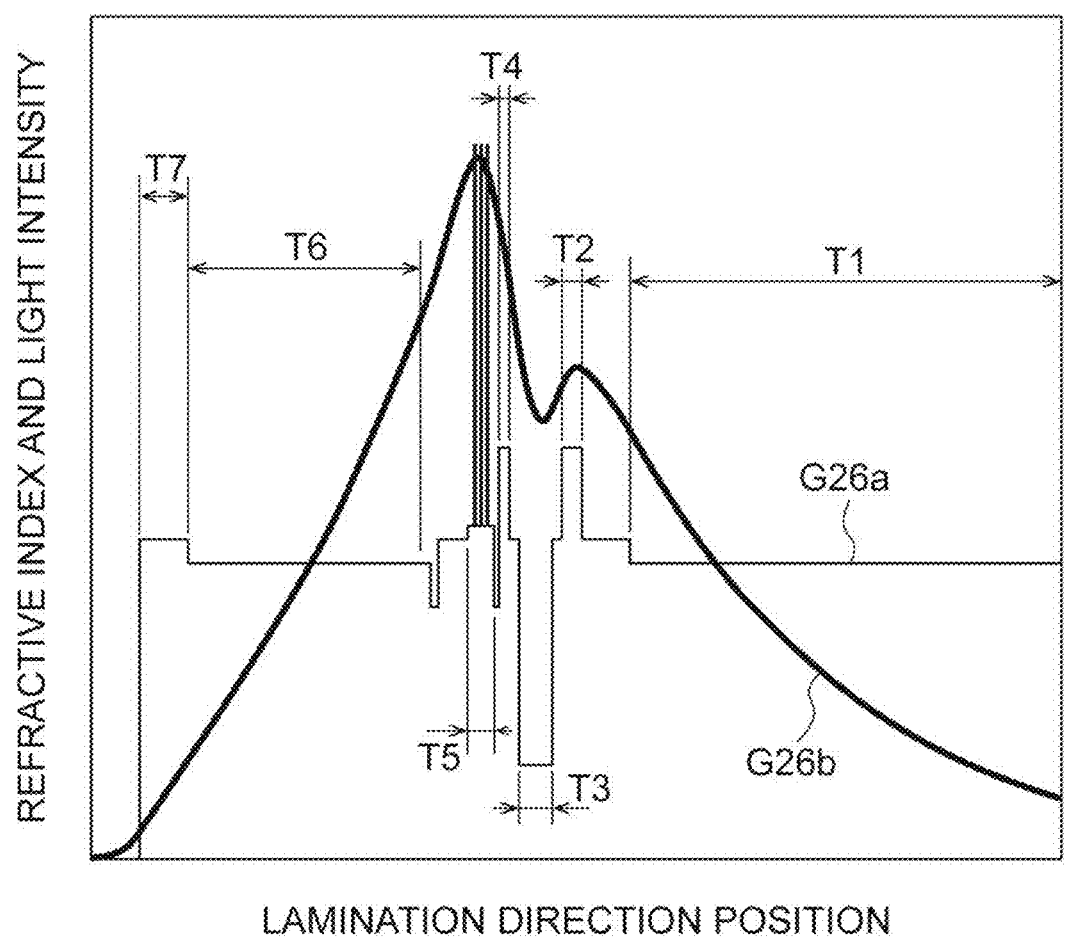
FIG. 39 is a graph showing a refractive index profile and mode distribution of the semiconductor light-emitting element including the layer structure shown in FIG. 38.

Next, a specific example in which the wavelength of the laser light is set to 450 nm in the first specific example will be described. In this sixth specific example, the In composition of the quantum well layer of the active layer 12 is 18%, and the film thickness of the quantum well layer is 5 nm. The period of the circular hole formed in the base layer 15a is 183 nm, and the diameter is 80 nm in accordance with the change of the wavelength. FIG. 38 is a table showing a layer structure of the semiconductor light-emitting element according to the sixth specific example. FIG. 38 shows the conductivity type, composition, film thickness, refractive index, and optical confinement coefficient I' of each layer. It is to be noted that each layer number is the same as that of the first specific example. FIG. 39 is a graph showing a refractive index profile and mode distribution of the semiconductor light-emitting element including the layer structure shown in FIG. 38. In FIG. 39, a graph G26a represents the refractive index profile, and a graph G26b represents the mode distribution. The ranges T1 to T7 in the figure are the same as those in the first specific example.

In this sixth specific example, the optical confinement coefficient I of the phase modulation layer 15 is 6.6%. Also in the sixth specific example where the wavelength of the laser light is different, by providing the semiconductor light-emitting element with the high refractive index layers 16 and 17, the optical confinement coefficient of the phase modulation layer 15 can be effectively increased.

The light-emitting element according to the present invention is not limited to the above-described embodiment, and various other variations can be made. For example, the above-described embodiment and each variation may be combined with one another depending on a required purpose and effect. In the above embodiment, the high refractive index layer may be provided only between the active layer and the phase modulation layer. Even in such a case, the optical confinement coefficient of the phase modulation layer can be increased. While the above-described embodiment and each variation have given the examples of the configuration in which light is emitted from the back surface 10b of the semiconductor substrate 10 (back surface emission type), the present invention is also applicable to a surface emitting laser element in which light is emitted from the front surface of the contact layer 14 (alternatively, the surface of the cladding layer 13 exposed by removing a part of the contact layer 14).

REFERENCE SIGNS LIST 1A, 1C, 1D, 1E . . . Semiconductor light-emitting element; 1B . . . Light-emitting apparatus; 4 . . . Drive circuit; 6 . . . Support substrate; 7 . . . Control circuit; 10 . . . Semiconductor substrate; 10a . . . Main surface; 10b . . . Back surface; 11, 13 . . . Cladding layer; 12, 12A . . . Active layer; 14 . . . Contact layer; 15 . . . Phase modulation layer; 15a . . . Base layer; 15b, 15c . . . Modified refractive index region; 16, 17 . . . High refractive index layer; 18 . . . Guide layer; 26, 27 . . . Electrode; 27a . . . Opening; 28 . . . Protective film; 29 . . . Antireflection film; AD, AR, AL, AU . . . Traveling wave; B1, B2 . . . Optical image portion; D . . . Straight line; FR . . . Image region; G . . . Center of gravity; O . . . Lattice point; Q . . . Center; R . . . Unit constituent region; RIN . . . Inner region; and ROUT . . . Outer region.

The invention claimed is:

1. A light-emitting element configured to output light that forms a two-dimensional optical image constituted by three or more bright spots along a normal direction of a main surface of a substrate, a tilt direction intersecting with the normal direction, or both the normal direction and the tilt direction, comprising:

the substrate;

a first cladding layer provided on the main surface of the substrate;

an active layer provided on the first cladding layer;

a second cladding layer provided on the active layer;

a phase modulation layer provided between the first cladding layer and the active layer or between the active layer and the second cladding layer, the phase modulation layer including a base layer and a plurality of modified refractive index regions having a refractive index different from a refractive index of the base layer; and a high refractive index layer provided between the first cladding layer and the second cladding layer and having a refractive index higher than a refractive index of any of the first cladding layer, the second cladding layer, and the phase modulation layer, the high refractive index layer provided in at least one of a space where the phase modulation layer is sandwiched between the high refractive index layer and the active layer, and a space where the high refractive index layer is sandwiched between the active layer and the phase modulation layer, wherein each of the first cladding layer, the active layer, the second cladding layer, the phase modulation layer, and the high refractive index layer mainly includes a nitride semiconductor, on a design surface of the phase modulation layer orthogonal to the normal direction, each of the plurality of modified refractive index regions is arranged so as to correspond one-to-one to any one of a plurality of lattice points two-dimensionally set parallel to and at equal intervals along an X-axis and a Y-axis orthogonal to each other, and the plurality of modified refractive index regions include at least three modified refractive index regions arranged so that line segments respectively connecting centers of gravity of the three modified refractive index regions and three lattice points individually associated with the three modified refractive index regions are parallel to each other while being inclined to the X-axis and the Y-axis, the line segments having lengths different from each other.

2. The light-emitting element according to claim 1, wherein each of the first cladding layer, the second cladding layer, and the base layer is a GaN layer or an AlGaN layer, and the high refractive index layer is a nitride semiconductor layer containing In.

3. The light-emitting element according to claim 2, wherein the high refractive index layer further contains Al.

4. The light-emitting element according to claim 1, wherein in the plurality of modified refractive index regions, a line segment connecting a center of gravity of a specific modified refractive index region and a specific lattice point associated with the specific modified refractive index region is parallel to line segments respectively connecting remaining modified refractive index regions and remaining lattice points individually associated with the remaining modified refractive index regions.

5. The light-emitting element according to claim 4, wherein a tilt angle of the line segment connecting the center of gravity of the specific modified refractive index region and the specific lattice point with respect to the X-axis or the Y-axis is 45°, 135°, 225°, or 315°.

6. The light-emitting element according to claim 1, wherein in the phase modulation layer, the plurality of modified refractive index regions are arranged at predetermined positions in the base layer according to an arrangement pattern for forming an optical image, the arrangement pattern is defined so that where in an XYZ orthogonal coordinate system defined by a Z-axis coincident with a normal direction of the main surface and an X-Y plane coincident with one surface of the phase modulation layer including the plurality of modified refractive index regions and including the X-axis and the Y-axis orthogonal to each other, a virtual square lattice composed of M1 (integer of 1 or more)×N1 (integer of 1 or more) unit constituent regions R each having a square shape is set on the X-Y plane, in a unit constituent region R (x, y) on the X-Y plane specified by a coordinate component x (integer of 1 or more and M1 or less) in an X-axis direction and a coordinate component y (integer of 1 or more and N1 or less) in an Y-axis direction, a center of gravity G of a modified refractive index region located in the unit constituent region R (x, y) is away by a predetermined distance from a lattice point O (x, y) serving as a center of the unit constituent region R (x, y) and a vector from the lattice point O (x, y) to the center of gravity G is oriented in a specific direction, and the phase modulation layer is configured so that coordinates ($\xi$, $\eta$, $\zeta$) in the XYZ orthogonal coordinate system satisfy a relationship shown by following Formulas (1) to (3) with respect to spherical coordinates (r, $\theta_{rot}$, $\theta_{tilt}$) defined by a moving radius length r, a tilt angle $\theta_{tilt}$ from the Z-axis, and a rotation angle $\theta_{rot}$ from the X-axis specified on the X-Y plane, $$\xi = r \sin \theta_{tilt} \cos \theta_{rot} \quad (1)$$

$$\eta = r \sin \theta_{tilt} \sin \theta_{rot} \quad (2)$$

$$\zeta = r \cos \theta_{tilt} \quad (3)$$

where the optical image is a set of bright spots oriented to a direction defined by angles $\theta_{tilt}$ and $\theta_{rot}$, the angles $\theta_{tilt}$ and $\theta_{rot}$ are converted into a coordinate value $k_x$ on a Kx-axis, which is a normalized wave number defined by a following Formula (4) and corresponds to the X-axis, and a coordinate value $k_y$ on a Ky-axis, which is a normalized wave number defined by a following Formula (5), corresponds to the Y-axis, and is orthogonal to the Kx-axis, $$k_x = \frac{a}{\lambda} \sin\theta_{tilt} \cos\theta_{rot} \quad (4)$$

$$k_y = \frac{a}{\lambda} \sin\theta_{tilt} \sin\theta_{rot} \quad (5)$$

a: Lattice constant of virtual square lattice
$\lambda$: Oscillation wavelength in a wave number space defined by the Kx-axis and the Ky-axis, a specific wave number range including the optical image is constituted of M2 (integer of 1 or more)×N2 (integer of 1 or more) image regions FR each having a square shape, a complex amplitude F (x, y) obtained by subjecting each image region FR ($k_x$, $k_y$) specified by a coordinate component $k_x$ (integer of 0 or more and M2-1 or less) in a Kx-axis direction and a coordinate component $k_y$ (integer of 0 or more and N2-1 or less) in a Ky-axis direction in a wave number space to two-dimensional inverse Fourier transform into the unit constituent region R (x, y) on the X-Y plane is given by following Formula (6), with j being an imaginary unit, $$F(x, y) = \sum_{k_x=0}^{M2-1} \sum_{k_y=0}^{N2-1} FR(k_x, k_y) \exp\left[j2\pi\left(\frac{k_x}{M2}x + \frac{k_y}{N2}y\right)\right] \quad (6)$$

where an amplitude term is A (x, y) and a phase term is P (x, y) in the unit constituent region R (x, y), the complex amplitude F (x, y) is defined by following Formula (7), and $$F(x,y) = A(x,y) \times \exp[jP(x, y)] \quad (7)$$

where the unit constituent region R (x, y) is defined by an s-axis and a t-axis that are parallel to the X-axis and the Y-axis, respectively, and orthogonal to each other at the lattice point O (x, y), a center of gravity G of the corresponding modified refractive index region is located on a straight line that passes through the lattice point O (x, y) and is tilted from the s-axis, and the corresponding modified refractive index region where a line segment length r (x, y) from the lattice point O (x, y) to a center of gravity G of the corresponding modified refractive index region satisfies a relationship, $$r(x,y) = C \times (P(x,y) - P_0)$$

C: Proportional constant
$P_0$: Any constant
is arranged in the unit constituent region R (x, y).

* * * * *